(12) United States Patent
Khasnis et al.

(10) Patent No.: US 7,825,837 B1
(45) Date of Patent: Nov. 2, 2010

(54) BACKGROUND CALIBRATION METHOD FOR ANALOG-TO-DIGITAL CONVERTERS

(75) Inventors: Priyanka Khasnis, Bangalore (IN); DVJ Ravi Kumar, Bangalore (IN); Theertham Srinivas, Bangalore (IN); Vallamkonda Madhuri, Bangalore (IN); Gururaj Ghorpade, Bangalore (IN); Mehmet Aslan, Sunnyvale, CA (US); Richard Dean Henderson, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 47 days.

(21) Appl. No.: 12/399,797

(22) Filed: Mar. 6, 2009

Related U.S. Application Data

(60) Provisional application No. 61/094,733, filed on Sep. 5, 2008.

(51) Int. Cl.
*H03M 1/10* (2006.01)
(52) U.S. Cl. .................. 341/120; 341/118; 341/155
(58) Field of Classification Search ............... 341/118, 341/120, 155
See application file for complete search history.

(56) References Cited

U.S. PATENT DOCUMENTS

| | | | |
|---|---|---|---|
| 4,839,650 A * | 6/1989 | Geen et al. | 341/118 |
| RE34,428 E * | 11/1993 | George et al. | 341/118 |
| 5,305,004 A | 4/1994 | Fattaruso | |
| 5,925,921 A | 7/1999 | Susak | |
| 6,198,423 B1 | 3/2001 | Yu | |
| 6,222,471 B1 | 4/2001 | Nagaraj | |
| 6,642,871 B2 * | 11/2003 | Takeyabu et al. | 341/120 |
| 6,697,003 B1 | 2/2004 | Chen | |
| 6,891,486 B1 | 5/2005 | Pentakota et al. | |
| 6,897,673 B2 | 5/2005 | Savage et al. | |
| 7,002,504 B2 | 2/2006 | McMahill | |
| 7,170,439 B1 | 1/2007 | Chen | |
| 7,378,999 B1 * | 5/2008 | McGrath et al. | 341/120 |
| 2004/0183560 A1 | 9/2004 | Savage et al. | |
| 2005/0116847 A1 | 6/2005 | Pentakota et al. | |

OTHER PUBLICATIONS

Trevor C. Caldwell et al., "An Incremental Data Converter with an Oversampling Ratio of 3," ©2006 IEEE, pp. 125-128.

* cited by examiner

*Primary Examiner*—Khai M Nguyen
(74) *Attorney, Agent, or Firm*—Patent Law Group LLP; Carmen C. Cook

(57) ABSTRACT

A method for calibrating an analog-to-digital converter includes sampling an analog input signal and generating input samples, reversing the polarity of at least one input sample, averaging the digital output codes associated with a first pair of input samples where the first pair of input samples has opposite polarities, and generating an offset correction value being the average of the digital output codes associated with the first pair of input samples. In another embodiment, a method for calibrating an ADC includes sampling the analog input signal and generating input samples, introducing an incremental value to modify the magnitude of at least one input sample, computing an actual gain value using the digital output codes associated with a first input sample and a second input sample having the modified magnitude, and generating a gain correction value being the ratio of an ideal gain of the ADC to the actual gain.

22 Claims, 21 Drawing Sheets

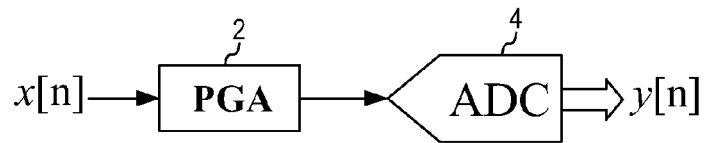
Fig. 1
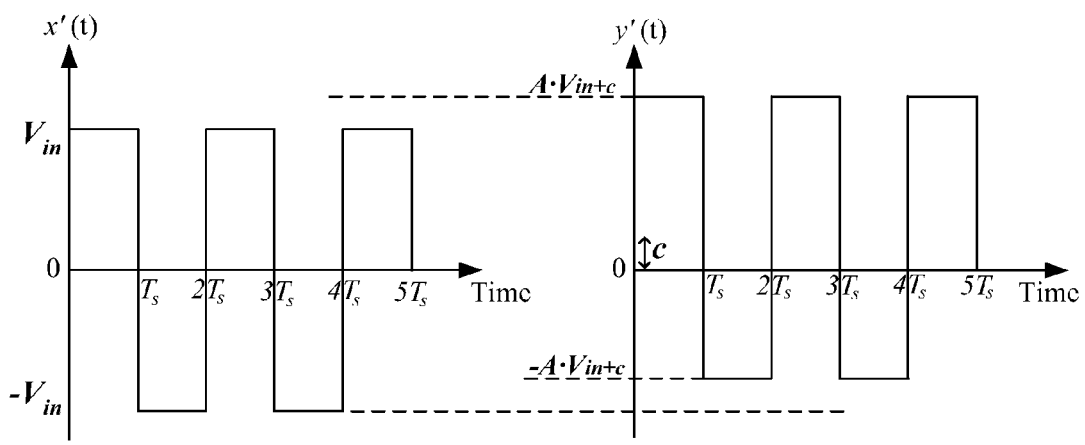
Fig. 2
Fig. 4

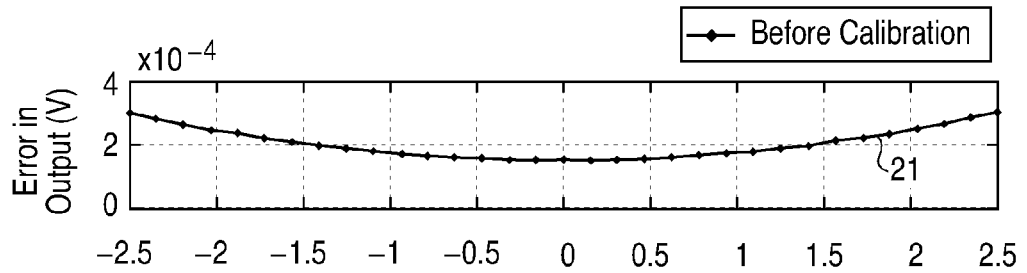
FIG. 5(a)
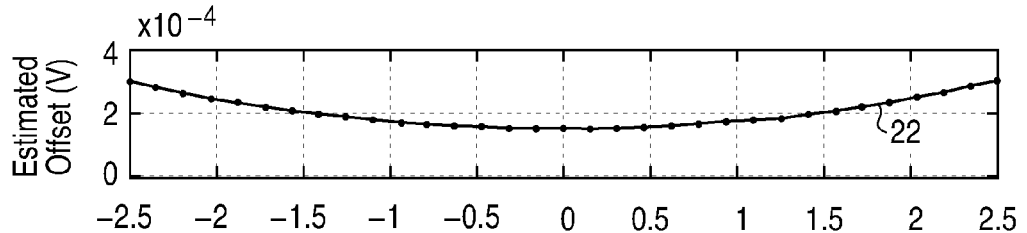
FIG. 5(b)
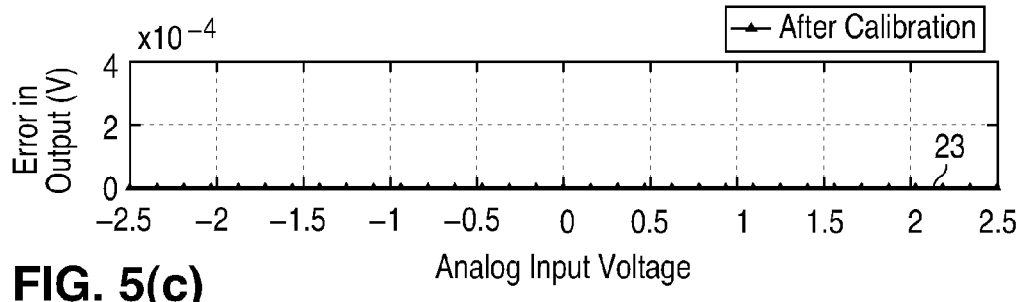
FIG. 5(c)
| | Originial Input and Output Sequence | | | | | | 6 |
|---|---|---|---|---|---|---|---|
| Input Samples | x[1] | x[2] | x[3] | x[4] | x[5] | x[6] | ......... |
| Digital Output Codes | y[1] | y[2] | y[3] | y[4] | y[5] | y[6] | ......... |
| | Modified Input and Output Sequence For Gain Estimation | | | | | | 24 |
|---|---|---|---|---|---|---|---|
| Input Samples | x[1] | x[2]±Δx | x[3] | x[4]±Δx | x[5] | x[6]±Δx | ......... |
| Digital Output Codes | y'[1] | y'[2] | y'[3] | y'[4] | y'[5] | y'[6] | ......... |
FIG. 6

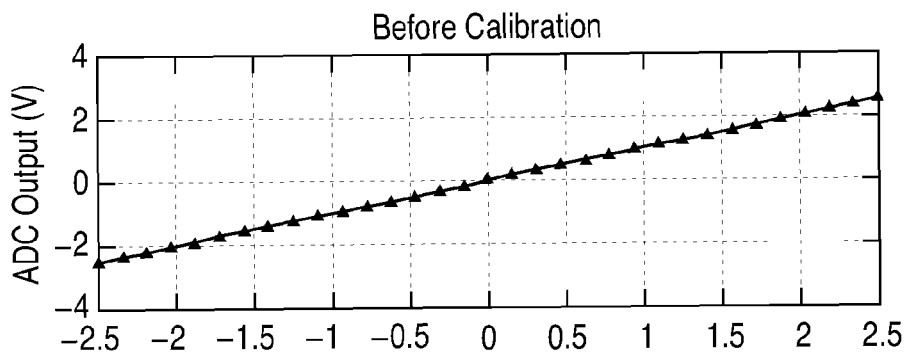
FIG. 11(a)
FIG. 11(b)
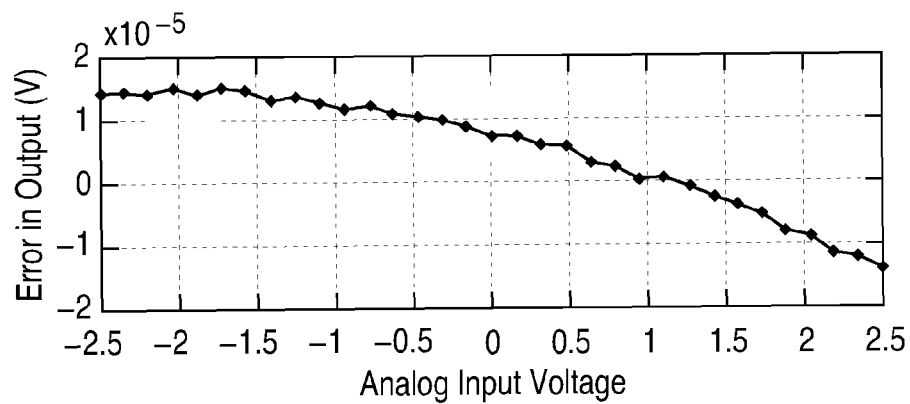
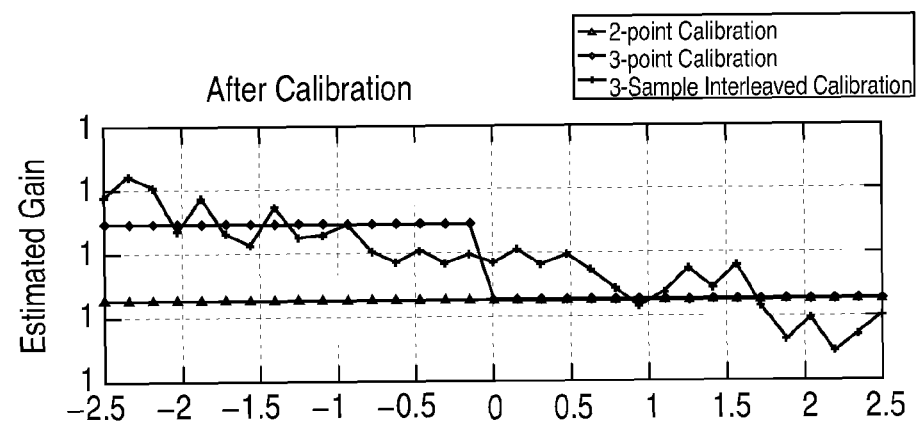
FIG. 12(a)
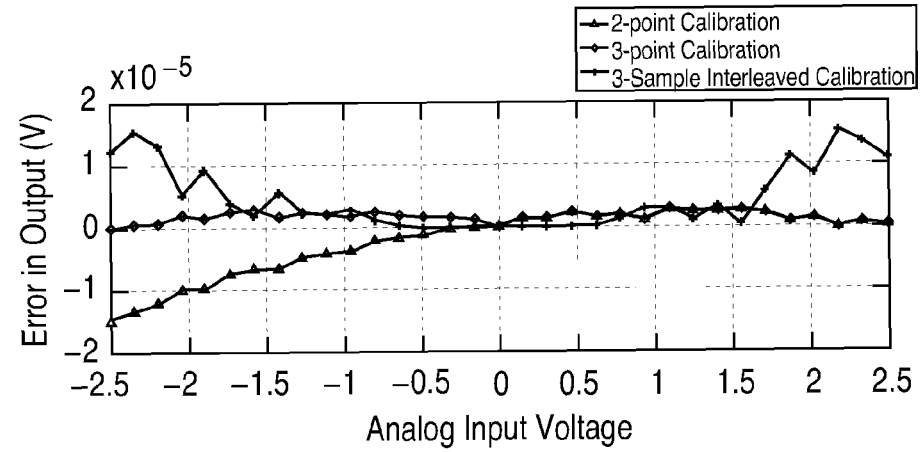
FIG. 12(b)

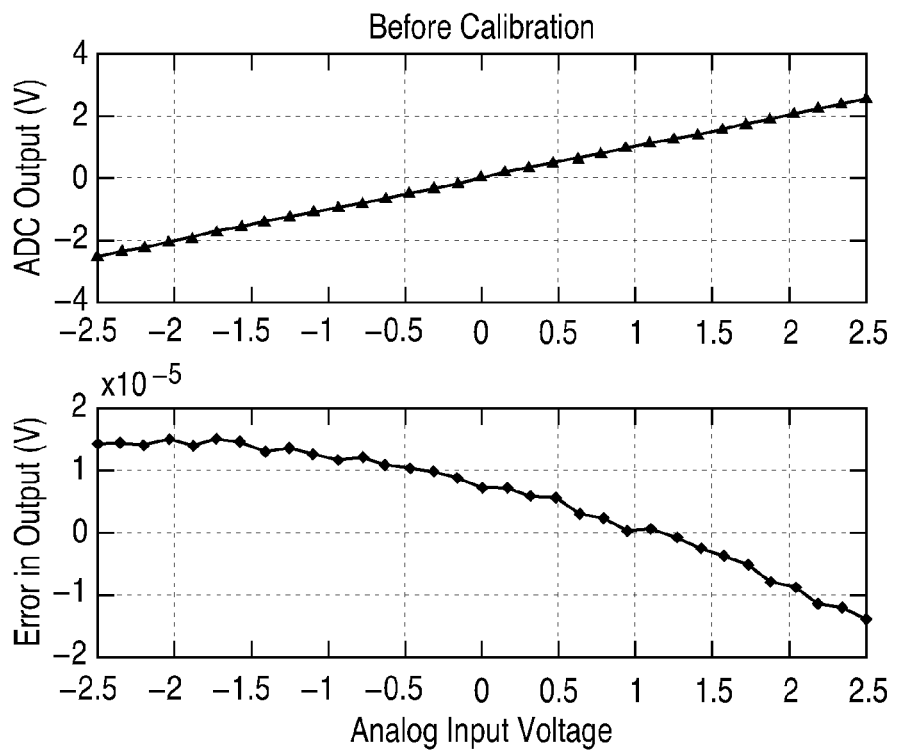
FIG. 17(a)
FIG. 17(b)
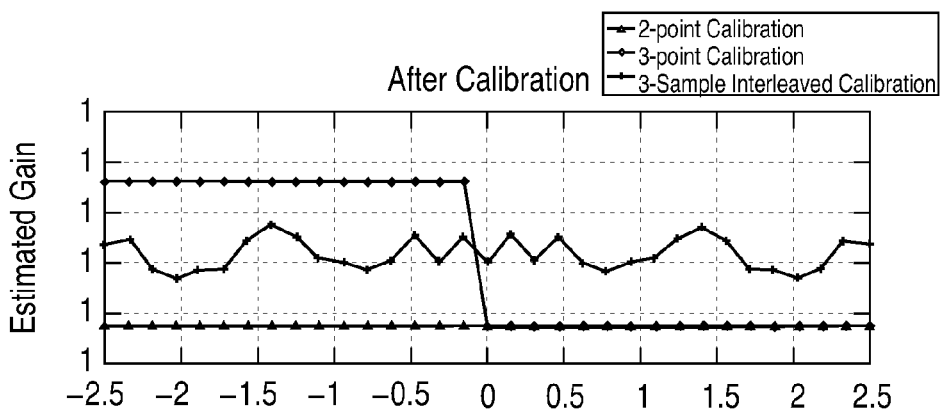
FIG. 18(a)
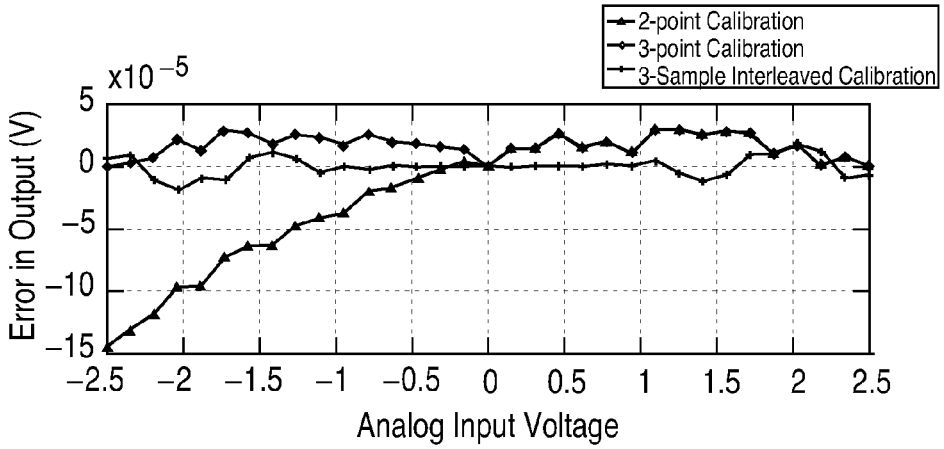
FIG. 18(b)

BACKGROUND CALIBRATION METHOD FOR ANALOG-TO-DIGITAL CONVERTERS

CROSS-REFERENCE TO RELATED APPLICATION

This application claims the benefit of U.S. Provisional Patent Application Ser. No. 61/094,733, filed on Sep. 5, 2008, of Priyanka Khasnis et al., which application is incorporated herein by reference in its entirety.

This application is related to concurrently filed and commonly assigned U.S. patent application Ser. No. 12/399,804, entitled "Capacitor Rotation Scheme For Removing Gain Error in Sigma-Delta Analog-to-Digital Converters," of the same inventors hereof, which patent application is incorporated herein by reference in its entirety.

FIELD OF THE INVENTION

The invention relates to analog-to-digital converters and, in particular, to a background calibration method for analog-to-digital converters (ADCs) where the calibration is performed without interrupting the ADC operation or affecting the data rate of the ADC.

DESCRIPTION OF THE RELATED ART

Analog-to-digital converters (ADCs) are used in converting or digitizing an analog input signal to generate a digital output signal indicative of the value of the analog input signal within a given conversion time. Various topologies for ADCs are known, such as pipeline ADCs, delta-sigma ADCs and incremental ADCs, and the different ADC topologies are used for different applications. For example, incremental ADCs are used in applications where very high absolute accuracy and linearity and very low offset and noise are required. An incremental ADC includes a sigma-delta (ΣΔ) modulator as the analog front end and digital post processing circuitry as the digital back end. The modulator samples the analog input signal, such as an input voltage generated by the input sensor (temperature sensor, weight sensor), and generates a digitized data stream representative of the magnitude of the analog input signal. The digital post processing circuitry of an incremental ADC may include digital filters (such as a finite impulse response FIR filter) and counters for processing the digitized data stream. The digital post processing circuitry generates a digital value being an estimate of the average magnitude of the analog input signal during a given time interval. In operation, an incremental ADC operates for a predetermined number of clock periods (approx. 512-10000) while sampling the analog input signal. At the end of the conversion cycle, a digital value indicative of the sampled input signal is generated and the ADC is reset. An incremental ADC is therefore considered to be a ΣΔ ADC operated in a transient mode.

Conventional incremental ADCs suffer from offset, gain and non-linearity errors. Furthermore, drifts in these error values over time or temperature variations render these errors even more noticeable and problematic. Offset, gain and non-linearity errors in these high resolution converters need to be minimized in order for the ADC to meet the requirement of high absolute (DC) accuracy. Thus, digital background calibration is employed to calibrate for these errors.

One conventional background calibration technique for incremental ADCs involves disconnecting the differential inputs from the input signals and shorting the differential inputs together to obtain an offset correction factor. For gain error, the conventional calibration technique operates by applying a positive full-scale reference voltage to the differential inputs to obtain a gain correction factor. The offset correction factor thus obtained is subtracted from the result of each conversion to remove the offset error. The offset corrected digital output codes are multiplied by the gain correction factor to calibrate out the gain error.

The conventional calibration techniques are not truly background calibration techniques as the ADC has to cease sampling the input signals to allow the offset and gain calibration to take place. The data rate of the ADC is thus affected by the calibration operation. In some cases, a data rate reduction up to a factor of 6 results due to the calibration process. Furthermore, the conventional calibration techniques can only calibrate for a gain factor of 1 because the full-scale reference voltage for other gain factors is not readily available. In addition, the conventional calibration techniques do not calibrate for higher order non-linearity errors.

BRIEF DESCRIPTION OF THE DRAWINGS

FIG. 1 is a schematic diagram of an analog-to-digital converter according to one embodiment of the present invention.

FIG. 2 illustrates exemplary input samples and digital output codes for the original input and output sequence and the modified input and output sequence for offset estimation according to one embodiment of the present invention.

FIG. 4 is a signal diagram illustrating the modified input sample sequence and the corresponding digital output codes for offset estimation in time domain according to one embodiment of the present invention.

FIGS. 5(a)-(c) are simulation results illustrating the benefits of the offset estimation method according to one embodiment of the present invention.

FIG. 6 illustrates exemplary input samples and digital output codes for the original input and output sequence and the modified input and output sequence for gain error estimation according to one embodiment of the present invention.

FIGS. 11(a) and 11(b) are simulation results illustrating the ADC output voltage vs. the analog input voltage and the error in the ADC output voltage before calibration is performed for the case when the ADC transfer characteristics exhibit only $2^{nd}$ order nonlinearity error in addition to the offset and gain error.

FIGS. 12(a) and 12(b) are simulation results illustrating the estimated gain and the error in the ADC output voltage vs. the analog input voltage after the conventional 2-point and 3-point calibration and after the background calibration method using the 3-sample interleaved calibration method according to one embodiment of the present invention.

FIGS. 17(a) and 17(b) are simulation results illustrating the ADC output voltage vs. the analog input voltage and the error in the ADC output voltage before calibration is performed for the case when the ADC transfer characteristics exhibit only $2^{nd}$ order nonlinearity error in addition to the offset and gain error.

FIGS. 18(a) and 18(b) are simulation results illustrating the estimated gain and the error in the ADC output voltage vs. the analog input voltage after the conventional 2-point and 3-point calibration and after the background calibration method using the 4-sample interleaved calibration method according to one embodiment of the present invention.

FIG. 30, including

DETAILED DESCRIPTION OF THE PREFERRED EMBODIMENTS

Figure 3A:
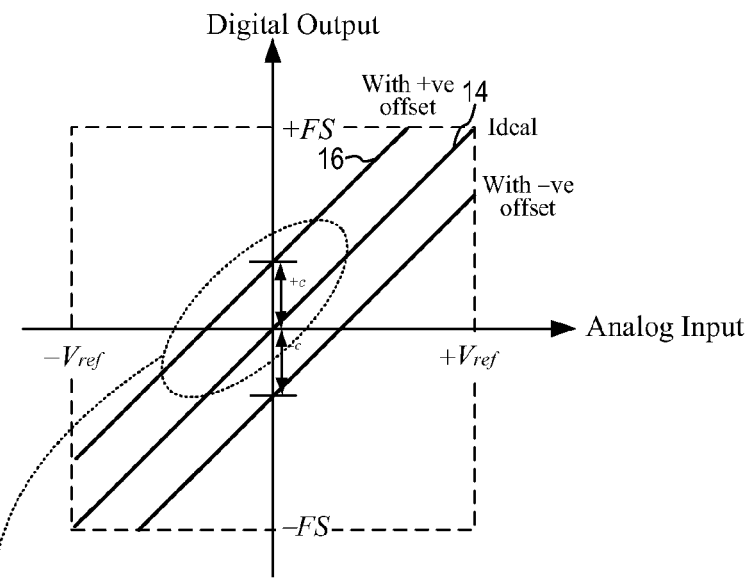
FIGS. 3(a) and 3(b) are graphical representations of the transfer characteristics of the ADC circuit to illustrate the operation of offset estimation according to one embodiment of the present invention.

According to the principles of the present invention, a background calibration method and circuit is implemented in an analog-to-digital converter (ADC) for estimating offset, gain and nonlinearity errors of the ADC with high accuracy and precision. The background calibration method of the present invention is a truly background calibration technique as calibration is preformed with the ADC continuing to sample the analog input signal. The calibration method does not interrupt the normal operation of the ADC and the data rate of the ADC is unaffected by the calibration being performed.

The background calibration method of the present invention is applicable in ADCs that are converting a slowly varying analog input signal such that the analog input signal can be deemed approximately DC. More specifically, when the analog input signal is slowly varying, or approximately DC, two consecutive input samples of the analog input signal can be considered to be the same or nearly the same. The background calibration method and circuit of the present invention can be applied to sigma-delta ($\Sigma\Delta$) ADCs having any topology but has particular application in incremental ADCs.

Incremental ADCs are high resolution ADCs used to convert a slowly varying analog signal, such as the ambient temperature and weight. For an 18-bit resolution of the ADC, the input signal should not be varying greater than a sinusoidal signal of ~50 µHz.

In the present embodiment, the background calibration method of the present invention is implemented in an incremental ADC. The incremental ADC includes a sigma-delta ($\Sigma\Delta$) modulator as the analog front end and a digital post processing circuit as the digital back end. The $\Sigma\Delta$ modulator samples the analog input signal, such as an input voltage generated by the input sensor, and generates a digitized data stream of digital output codes representative of the magnitude of the samples of the analog input signal. More specifically, a digital output code is generated for each sample of the analog input signal. The digital post processing circuit includes a digital filter, such as a finite impulse response (FIR) filter, and a counter for processing the digitized data stream of digital output codes. The digital post processing circuit generates a digital value being an estimate of the average magnitude of the analog input signal over a given time interval. In operation, the incremental ADC operates for a predetermined number of clock periods—the conversion cycle—to sample the analog input signal. At the end of the conversion cycle, the ADC is reset. A digital value indicative of the average magnitude of the sampled analog input signal over the conversion cycle is generated. In the present embodiment, the $\Sigma\Delta$ modulator is a $3^{rd}$ order modulator. In other embodiments, the $\Sigma\Delta$ modulator can have other configurations, such as $\Sigma\Delta$ modulators of any order.

Background Calibration Method Overview (1) Offset Estimation

The background calibration method of the present invention estimates offset error of the ADC by reversing the polarity of alternate samples of the analog input signal supplied to the ADC. When the polarity of an input sample is reversed, only the linear part of the digitized output signal changes its polarity accordingly but the DC offset of the ADC does not change its polarity. The offset error of the ADC is then estimated and an offset correction factor is obtained by averaging two consecutive polarity-reversed digital output codes. The offset correction factor (also referred to as the "offset correction value"), representing the estimated offset error, is then subtracted from the digital output codes for each input sample to remove the offset error.

The offset error estimation obtained by the offset estimation method of the present invention is also capable of estimating even order non-linearity of the ADC transfer characteristics along with the DC offset error estimation. That is, the ADC may have non-linear components over the full input range and the offset error estimation in accordance with the present invention estimates for the even order non-linearity along with the DC offset error so that the DC offset error of the ADC, including any even order non-linear components, is completely eliminated in the digital output signal. After offset calibration, the digital output signal will have no DC offset or even order non-linearity errors.

(2) Gain Error Estimation

The background calibration method of the present invention estimates gain error of the ADC by moving alternate input samples by a fixed incremental value ($\Delta_x$) along the ADC transfer curve and using two consecutive input samples—one unmodified and one modified by the $\Delta_x$ amount—to calculate the slope of the ADC transfer characteristic. The slope of the ADC transfer characteristic is indicative of the gain of the ADC. Since the analog input signal is assumed to be approximately DC, adjacent input samples are assumed to be the same except for the fixed incremental value ($\Delta_x$) introduced to one of the input samples. Accordingly, the actual gain of the ADC is estimated by dividing the difference of the two digital output codes ($\Delta_y$) of the two adjacent input samples by $\Delta_x$. A gain correction factor (or "gain correction value") indicative of the gain error is then calculated by dividing the ideal gain of the ADC by the actual gain obtained using the slope calculation. The gain error of the ADC is removed by multiplying the offset corrected digital output codes by the gain correction factor.

In the gain error estimation method, the fixed incremental value $\Delta_x$ is introduced to the input sample in a way so as to reduce the magnitude of the input signal. In this manner, the introduction of the fixed incremental value $\Delta_x$ to the input sample will not cause the corresponding digital output code to saturate, unless the input sample already exceeds the full-scale input range. In an ADC with differential inputs, the fixed incremental value $\Delta_x$ is added to/subtracted from the differential inputs in a manner so as to reduce the magnitude of the differential input signal. That is, the incremental value $\Delta_x/2$ is added to the negative input and the incremental value $\Delta_x/2$ is subtracted from the positive input to cause the modified input signal to reduce in magnitude and to ensure that the modified input signal never exceeds the input range of the modulator and the digital output codes of the ADC do not saturate. The value of $\Delta_x$ is selected to obtain the desired accuracy of gain error estimation. Typically, a small value for $\Delta_x$ is sufficient. In one embodiment, an $\Delta_x$ value of $\frac{1}{4}V_{ref}$, where $V_{ref}$ is the full-scale reference voltage of the ADC, is used. In an ADC with a single ended input, the fixed incremental value can be added or subtracted from the single ended input. In the case of an ADC with a single ended input with an input range from 0 to $V_{ref}$, if $V_{in} < V_{ref}/2$, the fixed incremental amount $\Delta_x$ is added to the input and if $V_{in} > V_{ref}/2$, the fixed incremental amount $\Delta_x$ is subtracted from the input so that the ADC output codes do not saturate.

In the conventional calibration routine, gain error estimation is carried out with an input sample at the full-scale reference range and therefore, the digital output signal is prone to output saturation, particularly when the gain error is a positive gain error. A positive gain error is when the actual gain is more than the ideal gain. When the ADC has a positive gain error, applying the full-scale reference range to the ADC will cause the digital output signal to exceed its full range and saturate. To account for this operation condition and to accommodate for positive gain errors, the digital filter in the digital post processing circuit of the ADC in the present embodiment is designed with an over-range to ensure that the pre-calibrated output signal does not saturate. Subsequent calibration using the gain correction factor from the gain error estimation would then bring the calibrated digital output codes back to be within the expected range of the ADC. The gain error estimation method of the background calibration method of the present invention is thus instrumental in estimating positive gain errors while avoiding output signal saturation.

In the offset estimation method described above, alternate input samples have their polarity reversed and adjacent input samples are used to calculate the offset correction factor. Similarly, in the gain error estimation method, alternate input samples have their magnitude modified by a fixed incremental amount and adjacent samples are used to calculate the gain correction factor. In the present description, the term "adjacent", "immediately adjacent", "consecutive" and "strictly consecutive" refers to input samples that are temporally immediately next to each other in the input sample sequence. Using adjacent or strictly consecutive input samples for offset and gain error estimation has the advantage of ensuring improved accuracy. This is because the analog input signal is only assumed to be approximately DC and in reality, the analog input signal may have variations over time. As long as the analog input signal varies slowly, the assumption that the input samples remain constant throughout the adjacent input samples holds and the offset and gain error estimation results, based on the input signal being approximately DC, are valid and accurate.

In other embodiments of the present invention, it is possible to implement the gain error estimation method and the offset estimation method using input samples that are not immediately adjacent to each other but in close vicinity to each other. For example, a first input sample and a third input sample with reversed polarity can be used to estimate offset error; and a second unmodified input sample and a fourth modified input sample can be used to estimate gain error. As long as the analog input signal varies slowly, using input samples that are not immediately adjacent but in close vicinity to each other can generate valid and accurate offset and gain error estimations. In some cases, such estimations can become less accurate when the analog input signal has more variation or has systematic variations, such as a slowly moving ramp. In those cases, performing offset and gain error estimations using adjacent input samples provides more accurate error correction values.

(3) Interleaved Offset and Gain Error Estimation

In the background calibration method of the present invention, the offset estimation method uses two input samples to estimate the offset and the gain error estimation method uses two input samples to estimate the gain of the ADC. In some applications, it is desirable to estimate both offset and gain error on a continual basis while the ADC is operating to convert the analog input signal. According to one aspect of the present invention, the background calibration method of the present invention implements interleaved offset and gain error estimation to allow the offset and gain errors to be estimated alternately on a continual basis while the ADC is operating to convert an analog input signal. The interleaved offset and gain error estimation method can be realized using 3, 4 or 5 consecutive input samples, as will be described in more detail below.

(a) 3-Sample Interleaved Calibration

According to one embodiment of the present invention, a 3-sample interleaved calibration method uses three consecutive input samples to obtain both the offset error estimation and the gain error estimation. As described above, when offset and gain error estimations are performed separately, two samples are used for offset estimation and another two samples are used for gain error estimation. However, in the 3-sample interleaved calibration method, only three samples are used to estimate both offset and gain errors. More specifically, one sample (the "original, unmodified sample") is shared by both the offset and the gain error estimations to eliminate the need for the fourth sample.

It is imperative to note that the background calibration method of the present invention assumes that the analog input signal is varying very slowly so that consecutive input samples are essentially the same or nearly the same. Therefore, in the following description, the symbol $x_0$ is used to denote a sampled input signal and the same sampled input signal $x_0$ is used for all the input samples being captured by the ADC. The use of sampled input signal $x_0$ for all the input samples is meant to represent that the analog input signal is slowly varying so that the actual sampled input signals over the sampling times are the same or nearly the same and that all of the actual sampled input signals can be approximated by the value $x_0$. The use of the value $x_0$ for all of the input samples is not intended to represent that the actual input samples have exactly the same sampled value.

In one embodiment of the 3-sample interleaved calibration method, the input samples provided to the ADC are given as:

3-Sample Calibration—

$x[1] = -x_0$, $x[2] = x_0$, and $x[3] = x_0 \pm \Delta_x$.

Basically, to use three samples for calibrating offset error and gain error, the first input sample x[1] has its polarity inversed, the second input sample x[2] is an unmodified input sample and the third sample has a fixed incremental amount $\Delta_x$ introduced to (added to or subtracted from) the input sample. The fixed incremental amount $\Delta_x$ is introduced to reduce the magnitude of the input sample.

The 3-sample interleaved calibration method uses one unmodified input sample, one input sample with polarity reversed for offset estimation, and one sample with magnitude modified for gain error estimation. The exact order of the three input samples used is not critical to the practice of the 3-sample interleaved calibration method. It is only important that a first pair of input samples have the same magnitude but with reversed polarities (i.e., $x_0$ and $-x_0$) and a second pair of input samples have the same polarities with different magnitudes (i.e., the incremental amount $\Delta_x$ is introduced to one of the two adjacent input samples to reduce the magnitude of the input sample). Thus, other arrangements of the three input samples can be used without deviating from the scope of the present invention. For instance, in another embodiment, the three input samples used are: $x[1]=x_0$, $x[2]=-x_0$, and $x[3]=-(x_0 \pm \Delta_x)$. In another embodiment, the three input samples used are: $x[1]=x_0$, $x[2]=-x_0$, and $x[3]=x_0 \pm \Delta_x$. The third sample x[3] has a fixed incremental amount $\Delta_x$ added to/subtracted from the input sample to reduce the magnitude of the input sample. In yet another embodiment, the three input samples used are: $x[1]=x_0 \pm \Delta_x$, $x[2]=x_0$, and $x[3]=-x_0$. The first input sample x[1] has a fixed incremental amount $\Delta_x$ added to/subtracted from the input sample to reduce the magnitude of the input sample.

As discussed above, there is an advantage of improved accuracy in using adjacent pair of input samples for offset error estimation and adjacent pair of input samples for gain error estimation. Therefore, the arrangements of "$-x_0$, $x_0$, and $x_0 \pm \Delta_x$," and "$x_0 \pm \Delta_x$, $x_0$, and $-x_0$" can provide more accurate result since the pair of input samples for offset estimation are immediately adjacent to each other and the pair of input samples for gain error estimation are immediately adjacent to each other. However, other arrangements of the three input samples can be used to provide satisfactory results as long as the input is varying slowing.

In one embodiment, the input samples are differential input signals. In the case where the second input sample x[2] is a positive input sample ($x_0$), the input sample adjacent to the second input sample having the modified magnitude will have the incremental amount $\Delta_x$ subtracted from the positive input and added to the negative input of the input sample $x_0$. In the case where the second input sample x[2] has the opposite polarity ($-x_0$), then the input sample adjacent to the second input sample having the modified magnitude will have the incremental amount $\Delta_x$ added to the positive input and subtracted from the negative input of the negative sample $-x_0$. As stated above, the incremental amount $\Delta_x$ is always introduced in a manner so as to reduce the magnitude of the input sample.

When 3-sample interleaved calibration method is used, the output signal error, due to offset error and gain error, is substantially reduced in the mid-range of the input range. However, non-linearity error is not corrected sufficiently such that there are still residual errors at input values near the ends of the full-scale input range.

(b) 4-Sample Interleaved Calibration

According to a second embodiment of the present invention, a 4-sample interleaved calibration method uses four consecutive input samples to obtain both the offset error estimation and the gain error estimation. In particular, the four input samples are selected so that the offset error is measured at two different input sample values. In this manner, the background calibration method provides a more accurate offset error estimation whereby dominant second order ADC non-linearity is also corrected. More specifically, the 4-sample interleaved calibration method estimates the offset error at two input sample levels: first at the original, unmodified input sample level and then at the input with the incremental amount $\Delta_x$ level.

In one embodiment of the 4-sample interleaved calibration method, the input samples provided to the ADC are given as:

4-Sample Calibration—

$x[1]=x_0$, $x[2]=-x_0$, $x[3]=-x_0\pm\Delta_x$, and $x[4]=-(-x_0\pm\Delta_x)$.

Basically, the first input sample x[1] is an unmodified input sample, the second input sample x[2] has its polarity reversed, the third input sample x[3] has the same polarity as the second input sample and has the fixed incremental amount $\Delta_x$ introduced to (added to or subtracted from) the input sample, and the fourth input sample x[4] is the same as the third input sample but with the polarity reversed. The fixed incremental amount $\Delta_x$ is introduced to reduce the magnitude of the input samples.

The 4-sample interleaved calibration method estimates offset error at two different input levels. First, the offset error is estimated at the first and second input samples where the magnitude is unmodified. Then, the offset error is estimated at the third and fourth input samples where the magnitude of the input samples has been modified by the incremental amount $\Delta_x$. The additional measurement taken for offset error estimation allows even order non-linearity errors to be eliminated completely in the digital output codes. However, residual error relating to odd order non-linearity errors may still exist.

The gain error is estimated by the second and third input samples where the two input samples have the same polarity and differ only by the incremental amount $\Delta_x$ introduced to the third input sample. In one embodiment, the input samples are differential input signals. In the case where the second sample x[2] is a negative sample in magnitude (i.e., the sign of $x_0$ is negative), as in the present embodiment, the differential input sample adjacent to the second input sample having the modified magnitude will have the incremental amount $\Delta_x/2$ added to the positive input and subtracted from the negative input of the negative input sample $-x_0$. In the case where the second sample x[2] is a positive sample in magnitude (i.e., sign of $x_0$ is positive), the differential input sample adjacent to the second input sample having the modified magnitude will have the incremental amount $\Delta_x/2$ subtracted from the positive input and added to the negative input of the positive input sample $x_0$.

The 4-sample interleaved calibration method uses a first pair of input samples with opposite polarities and unmodified magnitude and a second pair of separate input samples also with opposite polarities but with modified magnitude for offset estimation. A pair of input samples in the first and second pairs with the same polarity but unmodified and modified magnitude are used for gain error estimation. The exact order of the four input samples used is not critical to the practice of the 4-sample interleaved calibration method. It is only important that a pair of input samples have opposite polarities and another separate pair of input samples also have opposite polarities and that a pair of input samples have the same polarities with different magnitudes (i.e., the incremental amount $\Delta_x$ is introduced to one of the two adjacent input samples to reduce the magnitude of the input sample). Thus, in another embodiment, the four input samples used are: $x[1]=-x_0$, $x[2]=x_0$, $x[3]=x_0\pm\Delta_x$, and $x[4]=-(x_0\pm\Delta_x)$. Other arrangements of the four input samples are also possible as long as the aforementioned requirements are met.

As discussed above, there is an advantage of improved accuracy in using adjacent pair of input samples for offset error estimation and adjacent pair of input samples for gain error estimation. Therefore, the arrangements of "$x_0$, $-x_0$, $-x_0\pm\Delta_x$ and $-(-x_0\pm\Delta_x)$", and "$-x_0$, $x_0$, $x_0\pm\Delta_x$, and $-(x_0\pm\Delta_x)$" can provide more accurate result since the input samples in each of the two pairs of input samples for offset estimation are immediately adjacent to each other and the pair of input samples for gain error estimation are immediately adjacent to each other. However, other arrangements of the four input samples can be used to provide satisfactory results as long as the input is varying slowing.

(c) 5-Sample Interleaved Calibration

According to yet another embodiment of the present invention, a 5-sample interleaved calibration method uses five consecutive samples to obtain both the offset error estimation and the gain error estimation while eliminating most of the third order non-linearity errors. In particular, the five input samples are selected to measure the offset error at one input sample level and to measure the gain error at three different input sample levels. By selecting the appropriate input sample level to measure the offset error, accurate offset and gain error estimations can be made while eliminating most of the even and odd order non-linearity errors.

The 5-sample interleaved calibration scheme is derived from an 8-sample interleaved calibration scheme. When 8 input samples are used, all even as well as odd (up to the $3^{rd}$) order non-linearity errors are completely eliminated so that no output error is observed over the full input range. However, the 8-sample interleaved calibration scheme can be complicated to implement in practice. In accordance with the present invention, the 8-sample interleaved calibration scheme is optimized by using just 5 input samples. The 5 input samples are selected to preserve most of the benefits of eliminating even and odd (up to the 3rd) order non-linearity errors. The 5-sample interleaved calibration method therefore provides improvement in eliminating even and odd (up to the 3rd) order non-linearity errors without being unduly complicated to implement.

When the 8-sample interleaved calibration scheme (to be described in more detail below) is used, four offset error estimates are made at four different input sample levels which completely remove even order non-linearity from all digital output codes. In the case where the ADC transfer characteristic has no $2^{nd}$ order errors or very minimal $2^{nd}$ order error, which is typically the case for differential ADC implementations, then three out of the four offset estimate input samples can be eliminated. The 8-sample interleaved calibration scheme is thus optimized to 5-sample technique by estimating offset error at only one input sample level and estimating gain error at four input sample levels. When only 5 samples are used, residual even order non-linearity errors are not completely eliminated from the digital output codes, however, careful selection of the input sample level at which offset error is estimated ensures that the residual even order non-linearity error in the calibrated output is distributed more uniformly over the entire input range.

In one embodiment of the 5-sample interleaved calibration method, the input samples provided to the ADC are given as:

5-Sample Calibration—

$x[1]=x_0$, $x[2]=x_0\pm\Delta_x$, $x[3]=x_0\pm2\Delta_x$, $x[4]=x_0\pm3\Delta_x$, and $x[5]=-(x_0\pm2\Delta_x)$.

Basically, the first input sample x[1] is an unmodified input sample, the second input sample x[2] has the incremental amount $\Delta_x$ introduced to (added to or subtracted from) the input sample, the third input sample x[3] has two times the incremental amount $\Delta_x$ introduced to the input sample, the fourth input sample x[4] has three times the incremental amount $\Delta_x$ introduced to the input sample, and the fifth input sample x[5] is the inverse polarity of the third input sample. The fixed incremental amount $\Delta_x$ is introduced to reduce the magnitude of the input samples.

In an alternate embodiment, the 5 input samples used in the 5-sample interleaved calibration method are given as:

5-Sample Calibration $x[1]=x_0$, $x[2]=x_0\pm\Delta_x$, $x[3]=x_0\pm2\Delta_x$, $x[4]=-(x_0\pm2\Delta_x)$, and $x[5]=x_0\pm3\Delta_x$.

Basically, the first input sample x[1] is an unmodified input sample, the second input sample x[2] has the incremental amount $\Delta_x$ introduced to (added to or subtracted from) the input sample, the third input sample x[3] has two times the incremental amount $\Delta_x$ introduced to the input sample, the fourth input sample x[4] is the inverse polarity of the third input sample, and the fifth input sample x[5] is the same as the third input sample but with an additional incremental amount $\Delta_x$ introduced to the input sample for a total of three times the incremental amount $\Delta_x$. The fixed incremental amount $\Delta_x$ is introduced to reduce the magnitude of the input samples.

In the present embodiment, the 5-sample interleaved calibration method estimates offset error at the input sample level of $(x_0\pm2\Delta_x)$. Measuring the offset error at this input sample results in minimized residual error for gain and offset calibration over the entire input range. In other embodiments, it is possible to use other input sample levels for the offset error measurements depending on the amount of residual error that can be tolerated. On the other hand, the gain error is measured at three input sample levels, with introducing $\Delta_x$, $2\Delta_x$, and $3\Delta_x$ to the input samples. In the present embodiment, the first input sample x[1] is a positive input sample in magnitude (i.e., sign of $x_0$ is positive). Therefore, assuming differential input signals, the incremental amounts $\Delta_x/2$, $2\Delta_x/2$, and $3\Delta_x/2$ are subtracted from the positive input and added to the negative input of the positive input sample ($x_0$) in the second, third and fifth samples (x[2], x[3] and x[5]). In the case where the first input sample x[1] is a negative input sample in magnitude (i.e., sign of $x_0$ is negative), then the incremental amounts $\Delta_x/2$, $2\Delta_x/2$, and $3\Delta_x/2$ are subtracted from the negative input and added to the positive input of the negative input sample in the second, third and fifth samples (x[2], x[3] and x[5]).

The 5-sample interleaved calibration method uses four samples with different levels of modified magnitude and a pair of input samples with opposite polarities to estimate gain and offset errors. The exact order of the five input samples used is not critical to the practice of the 5-sample interleaved calibration method. It is only important that one pair of input samples having opposite polarities is used and four samples with three different levels of modified magnitudes are used. In another embodiment, the five input samples used are: $x[1]=x_0$, $x[2]=x_0\pm\Delta_x$, $x[3]=-(x_0\pm\Delta_x)$, $x[4]=x_0\pm2\Delta_x$, $x[5]=x_0\pm3\Delta_x$. Other arrangements of the five input samples are also possible as long as the aforementioned requirements are met.

As discussed above, there is an advantage of improved accuracy in using adjacent pair of input samples for offset error estimation and adjacent pair of input samples for gain error estimation. Therefore, the arrangement of "$x_0$, $x_0\pm\Delta_x$, $x_0\pm2\Delta_x$, $-(x_0\pm2\Delta_x)$, and $x_0\pm3\Delta_x$" can provide more accurate result since the pair of input samples for offset estimation are immediately adjacent to each other and each of the three pairs of input samples for gain error estimation are immediately adjacent to each other. However, other arrangements of the five input samples can be used to provide satisfactory results as long as the input is varying slowing.

(4) Implementation

In one embodiment, the offset error estimation is implemented in an ADC by interchanging the positive and negative inputs of the input samples provided to the differential input terminals of the ADC to generate the input sample with the opposite polarity. That is, an unmodified input sample is coupled to the ADC by providing the positive input to the positive input terminal and providing the negative input to the negative input terminal of the ADC input stage. When the polarity of the input sample is to be reversed, the positive input is coupled to the negative input terminal and the negative input is coupled to the positive input terminal. In one embodiment, a switching network is used to implement the input sample polarity switching.

In one embodiment, the fixed incremental amount $\Delta_x$ for gain error estimation is implemented by adding an additional capacitor $C_\Delta$ to the feedback network of capacitors and another capacitor $C_{ff5}$ to the feedforward network of capacitors.

(5) Detail Description of Offset Estimation Scheme

An Analog-to-Digital Converter (ADC) having an offset 'c' and an ideal gain 'A' can be modeled as shown in FIG. 1. Referring to FIG. 1, an analog input signal x[n] is provided first to a PGA (Programmable Gain Amplifier) 2. PGA 2 is optional and may be omitted in other ADC configurations. In that case, the analog input signal x[n] is directly inputted into ADC circuit 4. ADC circuit 4 digitizes the analog input signal x[n] and generates a digital output code y[n] indicative of each sampled analog input signal x[n]. The digital output code y[n] for an input sample x[n] is given as:

$$y[n] = A \cdot x[n] + c. \quad \text{Eq. (1)}$$

Basically, the digital output code y[n] is the sampled input signal x[n] multiplied by the gain A and summed with the offset c.

In the offset estimation method of the background calibration method of the present invention, the polarity of certain analog input samples to the ADC is reversed. When the polarity of the analog input samples is reversed, the polarity of the linear part of the digitized output changes (i.e., the "A·x[n]" term in Eq. (1)), however, there is no change in the polarity of the DC offset value. Accordingly, the DC offset of the ADC can be estimated by averaging two digital output codes for two input samples with opposite polarities.

In one embodiment, the polarity of alternate input samples are reversed in the ADC circuit 4 before the conversion takes place. FIG. 2 illustrates exemplary input samples and digital output codes for the original input and output sequence and the modified input and output sequence for offset estimation according to one embodiment of the present invention. Referring to FIG. 2, the input sample sequence for the original, unmodified input samples is shown as x[1], x[2], x[3] and x[4] ... and so on (sequence 6) and the corresponding digital output code sequence is y[1], y[2], y[3] and y[4] ... and so on (sequence 8). When the offset estimation method in the present embodiment of the present invention is applied, the polarity of alternate input samples to the ADC circuit 4 is reversed. Thus, as shown in FIG. 2, the modified input sample sequence becomes x[1], (−x[2]), x[3], (−x[4]), x[5] ... and so on (sequence 10). The corresponding digital output codes are represented as y'[n] (sequence 12).

Based on the aforementioned assumption that the analog input signal is changing slowly that any two consecutive samples can be considered to have the same value. Then, an estimation of the offset of the ADC is obtained by averaging any two consecutive or adjacent digital output codes. More specifically, the digital output codes corresponding to two consecutive input samples, one of which has its polarity reversed, and the resultant offset computation are given as follows:

$$y'[i] = A \cdot (x[1]) + c, \quad \text{Eq. (2)}$$
$$y'[2] = A \cdot (-x[2]) + c \cong A(-x[1]) + c, \quad (\text{since } x[2] \cong x[1])$$
$$c \cong \frac{y'[1] + y'[2]}{2}.$$

The same offset computation can be applied to any pair of digital output codes associated with a pair of input samples having opposite polarities. When the polarity of alternate input samples are reversed, then the digital output codes associated with consecutive pairs of input samples can be used to compute the offset of the ADC. That is, $$c \cong \frac{y'[1] + y'[2]}{2} = \frac{y'[3] + y'[4]}{2}. \quad \text{Eq. (3)}$$

Figure 3B:
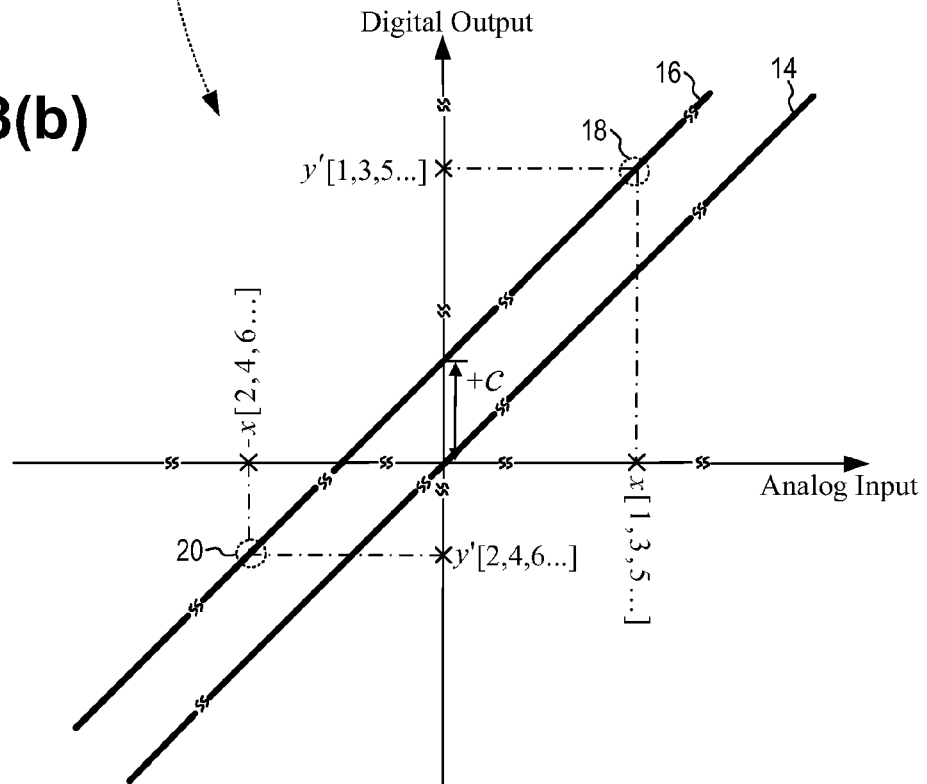

FIGS. 3(a) and 3(b) are graphical representations of the transfer characteristics of the ADC circuit to illustrate the operation of offset estimation according to one embodiment of the present invention. Referring to FIG. 3(a), the ideal ADC transfer characteristic has no offset and the ideal transfer curve 14 crosses the zero origin of the x-y axis. However, the transfer characteristics of the ADC shift vertically up or down with positive offset error or negative offset error, respectively. FIG. 3(b) zooms into the ADC transfer characteristics curve with a positive offset error showing the original and modified input samples, the corresponding digital output codes. Referring to FIG. 3(b), the transfer characteristic 16 of the ADC with positive offset error c is shifted up from the ideal transfer curve 14. When the analog input samples are changing so slowly that they can be considered to have the same values, the analog input samples x[1, 3, 5 . . . ] without polarity inversion yield digital output codes y'[1, 3, 5 . . . ] (at point 18) and the analog input samples x[2, 4, 6 . . . ] with polarity inversion yield digital output codes y'[2, 4, 6 . . . ] (at point 20). As observed from FIG. 3(b), the offset value c can be computed by averaging the digital output codes for an original input sample and for a polarity-reversed input sample.

FIG. 4 is a signal diagram illustrating the modified input sample sequence and the corresponding digital output codes for offset estimation in time domain according to one embodiment of the present invention. Time $T_s$ is the duration of each input sample conversion. Where the original, unmodified input signal is represented as x(t)=$V_{in}$, the modified input sample sequence is represented as x'(t) with alternate samples being polarity reversed, as shown in the graph on the left side of FIG. 4. The digital output of the ADC circuit is y'(t) shown on the right side of FIG. 4. Again, as can be observed from FIG. 4, by averaging two adjacent digital output values associated with a pair of input samples with opposite polarities, the offset error c can be computed.

Once the offset c of the ADC is estimated using the offset estimation method of the present invention, subsequent digital output codes can then be calibrated by subtracting the estimated offset as follows:

$$y_{calib}[2] = -(y'[2] - c)$$
$$y_{calib}[3] = y'[3] - c \quad \text{Eq. (4)}$$

An additional advantage of the offset estimation method of the present invention is that since the offset estimation is done by traversing along the ADC transfer characteristics, even order non-linearities of the ADC transfer characteristics are also estimated along with the DC offset. Whereas, in the conventional methods, offset estimation is done by shorting the inputs of the ADC, hence only DC offset is estimated and no information regarding non-linearities of the ADC can be obtained. To illustrate the estimation of offset as well as the even order non-linearities using the offset estimation method of the present invention, a MATLAB simulation was done for a 24-bit ADC ($V_{ref}$=2.5 V) with the following transfer characteristics:

$$y = \underbrace{(1.49e-04)}_{DC\ Offset} + x + \underbrace{(2.38e-05)x^2}_{2^{nd}\ Order\ Nonlinearity}. \quad \text{Eq. (5)}$$

The least significant bit (LSB) of the ADC is given as:

$$LSB = \frac{2 \times V_{ref}}{2^n} = \frac{5}{2^{24}} \cong 0.298 \, \mu V.$$

FIGS. 5 (a)-(c) are simulation results illustrating the benefits of the offset estimation method according to one embodiment of the present invention. Referring to FIG. 5(a), curve 21 illustrates the total error in the digital output value before the background calibration method of the present invention is performed. As shown in FIG. 5(a), the error for the full-scale input is approximately 298 µV, or approximately 1000 LSBs. Referring to FIG. 5(b), curve 22 illustrates the estimated offset of the ADC over the full-scale input. As shown in FIG. 5(b), the DC offset estimate includes $2^{nd}$ order non-linearity as well. When the estimated offset of FIG. 5(b) is applied to calibrate the digital output values, the residual error, shown in FIG. 5(c) is within approximately 0.51 µV which is 1.71 LSBs. The residual error obtained is of the order of the noise floor of the ADC and is therefore insignificant.

In sum, the offset estimation method of the background calibration method of the present invention provides advantages over conventional methods by estimating offset as well as $2^{nd}$ order non-linearities in the ADC transfer characteristics. The offset estimation method is simple to implement and requires only reversing the polarity of the input samples. In one embodiment, the offset error is estimated by reversing the polarity of at least one input sample and averaging the digital output codes of a pair of input samples, one of which being polarity reversed. For on-going background calibration, alternate input samples or selected input samples at given intervals are polarity reversed to allow the offset estimation to be continually performed.

(6) Detail Description of Gain Error Estimation Scheme

The gain error estimation method of the present invention is based on the assumption mentioned above that the input signal is approximately DC such that any two consecutive input samples can be considered to be the same. The gain error estimation method estimates the actual gain of the ADC by computing the slope of the ADC transfer characteristics in the vicinity of the applied analog input voltage. The ADC transfer characteristic with an actual gain '$A_e$' is given as:

$$y[n] = A_e \cdot x[n]. \quad \text{Eq. (6)}$$

In order to compute the slope of the ADC transfer characteristics, two points on the transfer characteristics are required. In accordance with the gain error estimation method of the present invention, a first point is selected as the input sample itself and the second point is selected by introducing a known fixed incremental amount '$\Delta_x$' to another input sample. The fixed incremental amount $\Delta_x$ is introduced to an input sample in the ADC circuit before the conversion takes place. By modifying one of the input samples by a known, fixed incremental amount, the ADC transfer curve is traversed by the fixed incremental amount and the slope of the ADC transfer curve can be calculated based on the digital output codes of the unmodified input sample and the modified input sample. More specifically, the slope of the ADC transfer curve, indicative of the actual gain of the ADC, is estimated by dividing the difference of the two digital output codes ($\Delta_y$) associated with the two input samples by $\Delta_x$, where $\Delta_x$ is the magnitude difference between the two input samples.

The gain error estimation method of the present invention requires a fixed incremental value $\Delta_x$ to be introduced to an input sample. The fixed incremental value $\Delta_x$ should be introduced in a manner so as to avoid saturation of the modulator. In one embodiment, the ADC uses differential inputs. The fixed incremental value $\Delta_x$ is added to/subtracted from the differential inputs in a manner so as to reduce the magnitude of the differential input signal. That is, the fixed incremental value $\Delta_x/2$ is added to the negative input and subtracted from the positive input to cause the modified input signal to reduce in magnitude and to ensure that the modified input signal never exceeds the input range of the modulator and the digital output codes of the ADC do not saturate.

In one embodiment, the incremental value $\Delta_x$ is introduced to alternate input samples in the ADC circuit 4 before the conversion takes place. FIG. 6 illustrates exemplary input samples and digital output codes for the original input and output sequence and the modified input and output sequence for gain error estimation according to one embodiment of the present invention. Referring to FIG. 6, the input sample sequence for the original, unmodified input samples is shown as x[1], x[2], x[3] and x[4] . . . and so on (sequence 6) and the corresponding digital output code sequence is y[1], y[2], y[3] and y[4] . . . and so on (sequence 8). When the gain error estimation method in the present embodiment of the present invention is applied, the incremental value $\Delta_x$ is introduced to alternate input samples. Thus, as shown in FIG. 6, the modified input sequence becomes x[1], x[2]±$\Delta_x$, x[3], x[4]±$\Delta_x$, x[5] . . . and so on (sequence 24). As mentioned above, the incremental amount $\Delta_x$ is introduced to the alternate input samples to reduce the magnitude of the input sample. The corresponding digital output codes are represented as y'[n] (sequence 26).

Figure 7:
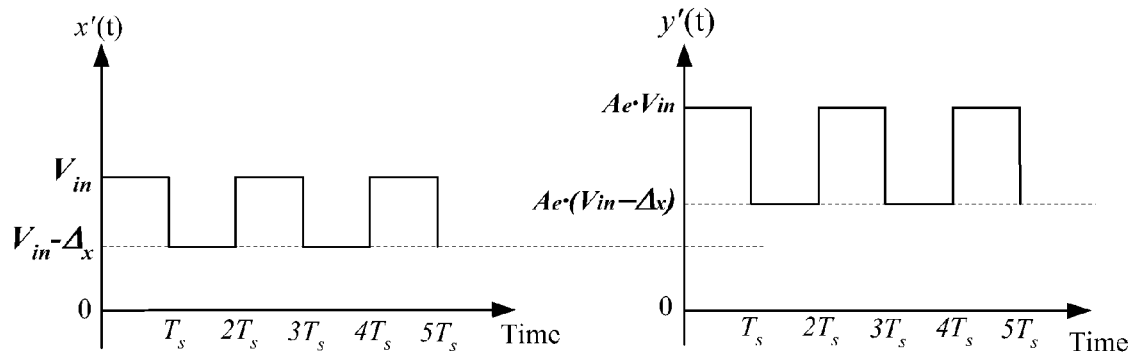
FIG. 7 is a signal diagram illustrating the modified input sample sequence and the corresponding digital output codes for gain error estimation in time domain according to one embodiment of the present invention.

FIG. 7 is a signal diagram illustrating the modified input sample sequence and the corresponding digital output codes for gain error estimation in time domain according to one embodiment of the present invention. Time $T_s$ is the duration of each input sample conversion. Where the original, unmodified input signal is represented as $x(t) = V_{in}$, the modified input sample sequence is represented as x'(t) with alternate samples having the incremental value $\Delta_x$ subtracted from the input sample, as shown in the present embodiment on the left side of FIG. 7. The digital output of the ADC circuit is y'(t) shown on the right side of FIG. 7. As can be observed from FIG. 7, the input samples are modified to vary between two values by a fixed value ($\Delta_x$) and the digital output values are also caused to vary between two values by the same fixed amount as multiplied by the gain.

Figure 8A:
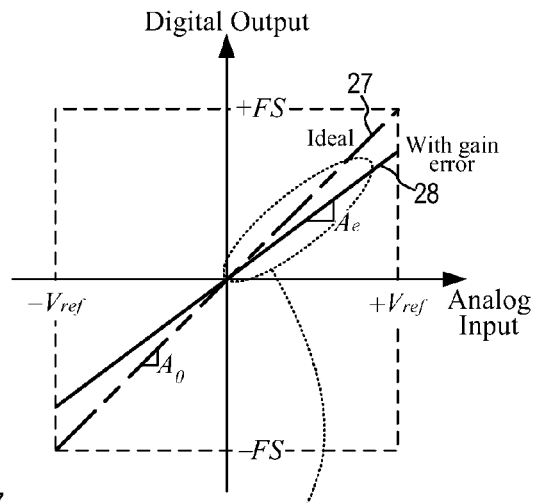
FIGS. 8(a) and 8(b) are graphical representations of the transfer characteristics of the ADC circuit to illustrate the operation of gain error estimation according to one embodiment of the present invention.
Figure 8B:
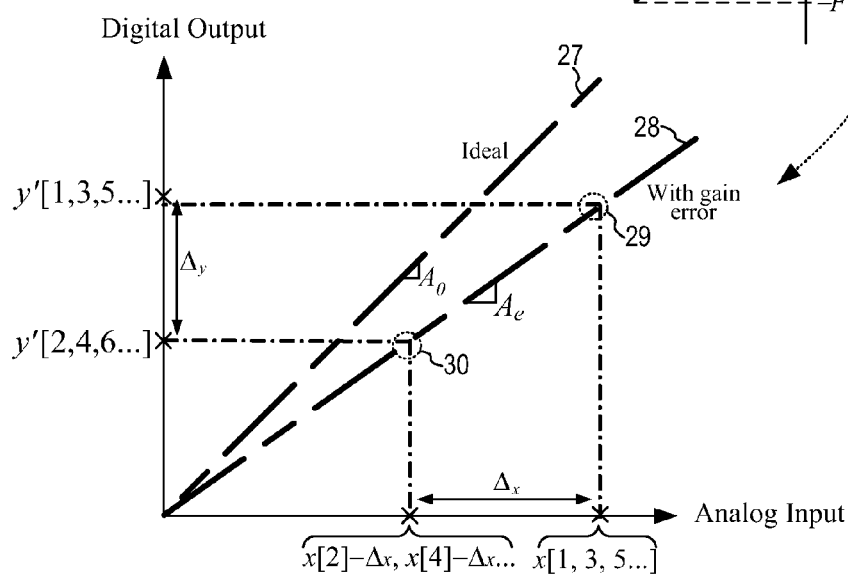

FIGS. 8(a) and 8(b) are graphical representations of the transfer characteristics of the ADC circuit to illustrate the operation of gain error estimation according to one embodiment of the present invention. Referring to FIG. 8(a), the ideal ADC transfer characteristic (curve 27) has an ideal gain $A_0$ and zero offset so that the ideal transfer curve 14 crosses the zero origin of the x-y axis. However, the transfer characteristics of the ADC pivots about zero origin in the presence of a positive or negative gain error (curve 28). FIG. 8(b) zooms into the ADC transfer characteristics curve at the positive input region showing the original and modified input samples, the corresponding digital output codes. Referring to FIG. 8(b), in the present illustration, the transfer characteristic 28 of the ADC with actual gain $A_e$ pivots down from the ideal curve 27. When the analog input samples are changing so slowly that they can be considered to have the same values, the analog input samples x[1, 3, 5 . . . ] without magnitude modification yield digital output codes y'[1, 3, 5 . . . ] (at point 29) and the analog input samples x[2, 4, 6 . . . ] with magnitude modification yield digital output codes y'[2, 4, 6 . . . ] (at point 30). As observed from FIG. 8(b), the slope of the ADC transfer characteristic can be computed using the value $\Delta_y$, being the difference between the two digital output codes and the value $\Delta_x$, being the difference between the two input sample.

More specifically, since two consecutive samples of the modified input sequence 26 differ by the incremental value $\Delta_x$, the corresponding digital output codes also change by a fixed quantity: $\Delta_y = A_e \cdot \Delta_x$. The actual gain $A_e$ is calculated as follows:

$$y'[1] = A_e \cdot x[1],$$

$$y'[2] = A_e \cdot (x[2] - \Delta_x) \cong A_e \cdot (x[1] - \Delta_x),$$

(since $x[2] \cong x[1]$), $$\Delta_y = |y'[1] - y'[2]| = A_e \cdot \Delta_x,$$

$$A_e = \frac{\Delta_y}{\Delta_x}.$$

Eq. (7)

From Eq. (7), the actual gain $A_e$ of the ADC can be computed in digital domain as long as the values $\Delta_x$ and $\Delta_y$ are known in the digital format. The value $\Delta_y$ in digital format is easily obtained as a difference of the two consecutive digital output codes of the ADC. Since $\Delta_x$ is a known quantity, the equivalent value of $\Delta_x$ in digital domain can also be readily obtained. Once, the actual gain $A_e$ is computed, the gain error is then calculated by dividing the ideal gain $A_0$ of the ADC by the actual gain $A_e$ obtained using the slope calculation. The gain error thus calculated is the gain correction factor (or "gain correction value") used for the calibration of the output samples of the ADC, such as digital output codes y'[3] and y'[4], in the following manner:

$$y_{calib}[3] = y'[3]\left(\frac{A_0}{A_e}\right); \text{ and}$$

$$y_{calib}[4] = y'[4]\left(\frac{A_0}{A_e}\right) - A_0 \cdot \Delta x$$

Eq. (8)

For on-going background calibration, alternate input samples or selected input samples at given intervals are introduced with the incremental value $\Delta_x$ to allow the gain estimation to be continually performed. The value of actual gain $A_e$ can be continually updated in a register for use to update the calculation of the gain error.

In the gain error estimation method of the present invention, the accuracy of the gain error estimation depends primarily on the accuracy of the incremental value $\Delta_x$. In one embodiment, the incremental value $\Delta_x$ is derived using reference voltages in a ratiometric manner. The desired value of the incremental value $\Delta_x$ is obtained by dividing the reference voltage using a ratio of two capacitors, as will be explained in more detail below.

In one embodiment of the gain error estimation method of the present invention, the incremental value $\Delta_x$ is chosen such that its digital equivalent is an integer multiple of 2. In that case, the division of Eq. (7) to obtain the actual gain value $A_e$ reduces to just a right shift of binary bits. In another embodiment, an optimal value of the incremental value $\Delta_x$ is chosen to obtain the desired accuracy of gain error estimation. A small value of $\Delta_x$ results in reduced resolution for the estimated actual gain $A_e$. On the other hand, a large value of $\Delta_x$ will not estimate the gain correctly in cases where the slope of the ADC transfer characteristics is not constant across the input range. Balancing all these factors, an optimal value of $\Delta_x (=V_{ref}/4)$ is used in one embodiment of the present invention where voltage $V_{ref}$ represents the full-scale reference voltage of the ADC, being the full-scale input range of the analog input voltage. Furthermore, the same value of $\Delta_x = V_{ref}/4$ can be used for all gain settings for the ADC modulator.

In the conventional ADC calibration methods, the gain correction factor is estimated only for the ADC gain setting of 1 and the same gain correction factor is used for all the gain settings. It is not possible to estimate the gain correction factor for other gain settings as there is no provision to apply the internal full-scale reference voltage as the ADC inputs for gain settings other than 1. However, the gain error estimation method of the present invention allows the gain correction factor to be estimated for any ADC modulator gain setting. This is because the gain error estimation method of the present invention applies only a small incremental value to traverse the ADC transfer curve, instead of applying the full-scale reference voltage as in the conventional case. Therefore, the gain error estimation method of the present invention can be applied for estimating the gain error for gain settings other than 1.

As mentioned earlier, the conventional ADC calibration methods rely on applying a positive full-scale reference voltage to the ADC and using the corresponding digital output code to find the gain correction factor. However, if the ADC exhibits a positive gain error, i.e., the actual gain is more than the ideal gain, the digital output code of a full-scale reference input voltage would become saturated and cannot be used to calculate the gain correction factor correctly. In accordance with the gain error estimation method of the present invention, the digital filter of the ADC is designed to have an overrange (<2) for the calibration calculation and the digital output code saturates only beyond the overrange. Accordingly, the gain error estimation method of the present invention can correctly calculate the gain correction factor for positive gain errors of the ADC which overcomes the limitations of the conventional methods.

(7) Detail Description of the Interleaved Calibration Scheme

As described above, in the background calibration method of the present invention, offset error in the ADC is estimated by processing two input samples with opposite polarities. Similarly, the gain error of the ADC is estimated by processing two input samples where one input sample has a modified magnitude. The two samples for offset or gain error estimation are preferably consecutive input samples based on the assumption that the analog input signal is changing slowly so that two consecutive input samples have nearly the same values. Because most ADCs are usually subjected to both offset and gain errors, the background calibration method of the present invention enables the estimation of both offset and gain errors in an interleaved manner to allow both offset and gain errors to be estimated on a continual basis.

According to one aspect of the present invention, an interleaved calibration method is provided in the background calibration method of the present invention where the pairs of input samples for offset and gain error estimations are interleaved to enable continual calibration of both offset and gain error to be performed. In one embodiment, a minimum of 3 input samples, preferably consecutive, are used to obtain an estimate of the offset as well as gain error of the ADC. In other embodiments, four or more input samples are used to account for non-linearity effects in the offset and gain errors, thereby improving the accuracy of the calibration. The interleaved calibration method is performed entirely in the background without interrupting the normal operation of the ADC so that data rate of the ADC is unaffected while the accuracy of the analog-to-digital conversions is maximized.

3-Sample Interleaved Calibration

In a first embodiment of the interleaved calibration method, three input samples are used for offset and gain error estimation, one of the input sample being shared by the offset and gain error estimation. More specifically, the three input samples include a pair of input samples with opposite polarities and a pair of input samples with the same polarity and one of the samples having a modified magnitude. The input samples in each pair of input samples for offset estimation or for gain error estimation are preferably consecutive or adjacent to each other. Therefore, the second of the three input sample is preferably the shared input sample.

Figure 9:
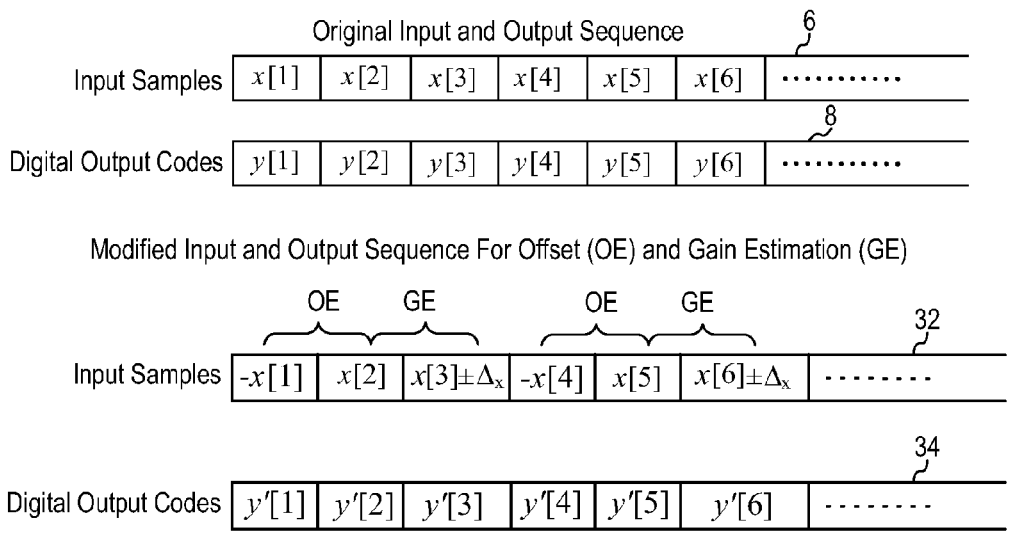
FIG. 9 illustrates exemplary input samples and digital output codes for the original input and output sequence and the modified input and output sequence for 3-sample interleaved offset and gain error estimation according to one embodiment of the present invention.

FIG. 9 illustrates exemplary input samples and digital output codes for the original input and output sequence and the modified input and output sequence for 3-sample interleaved offset and gain error estimation according to one embodiment of the present invention. Referring to FIG. 9, the input sample sequence for the original, unmodified input samples is shown as x[1], x[2], x[3] and x[4] . . . and so on (sequence 6) and the corresponding digital output code sequence is y[1], y[2], y[3] and y[4] . . . and so on (sequence 8). When the 3-sample interleaved offset and gain error estimation method (or "3-sample interleaved calibration method") is applied, the polarity of the first input samples to the ADC circuit is reversed, the second input sample remains unchanged and the third input sample has the incremental value $\Delta_x$ introduced. For the third input sample, the incremental value $\Delta_x/2$ is subtracted for positive analog inputs and added for negative analog inputs to reduce the magnitude of the analog differential input signal. Thus, as shown in FIG. 9, the modified input sample sequence becomes $-x[1]$, $x[2]$, $x[3]\pm\Delta_x$ and the 3-sample cycle repeats (sequence 32). The corresponding digital output codes are represented as y'[n] (sequence 34).

Figure 10A:
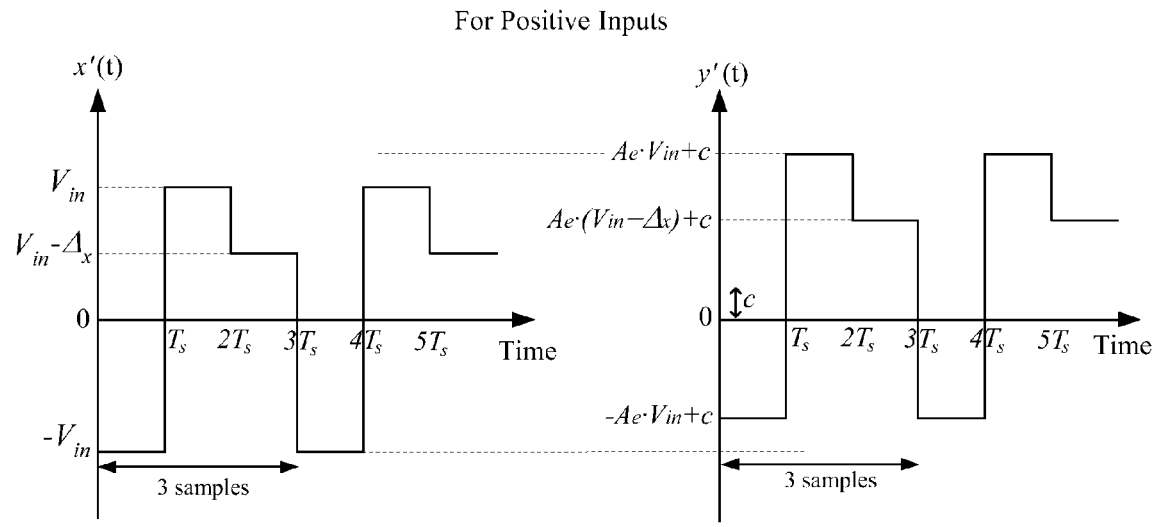
FIGS. 10(a) and 10(b) are signal diagrams illustrating the modified input sample sequence and the corresponding digital output codes for 3-sample interleaved offset and gain error estimation in time domain according to one embodiment of the present invention.
Figure 10B:
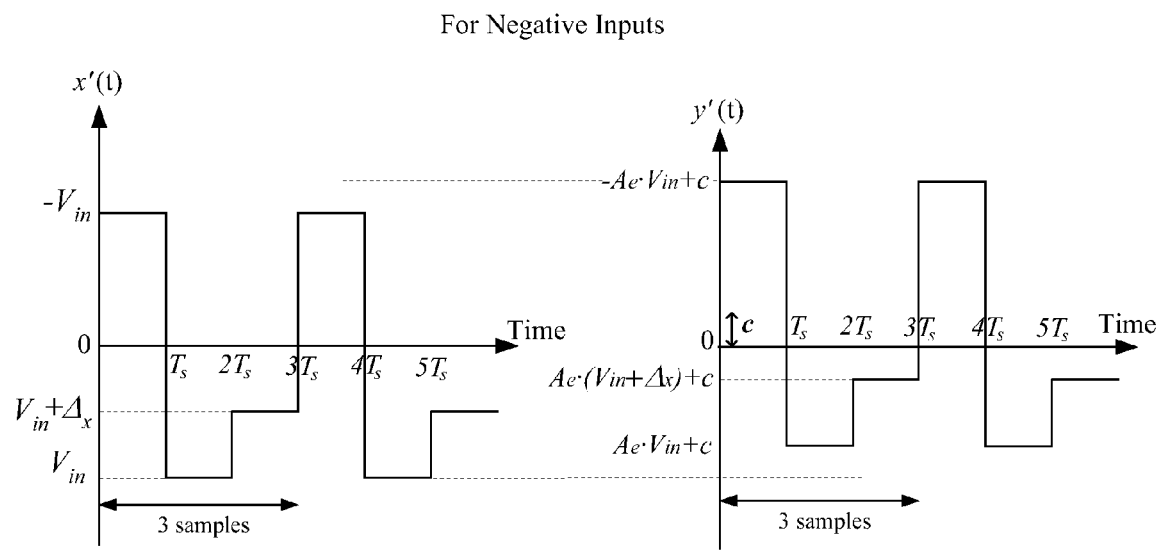

FIGS. 10(a) and 10(b) are signal diagrams illustrating the modified input sample sequence and the corresponding digital output codes for 3-sample interleaved offset and gain error estimation in time domain according to one embodiment of the present invention. FIG. 10(a) illustrates the modified input sample sequence for positive inputs. Time $T_s$ is the duration of each input sample conversion. Where the original, unmodified input signal is represented as $x(t)=V_{in}$, the modified input sample sequence is represented as x'(t) with the first input sample having polarity inversed ($-V_{in}$), the second input sample being unmodified ($V_{in}$) and the third input sample having incremental value $\Delta_x$ subtracted from the input sample, as shown in the graph on the left side of FIG. 10(a). The digital output of the ADC circuit is y'(t) shown on the right side of FIG. 10(a). FIG. 10(b) illustrates the modified input sample sequence for negative inputs. The modified input sample sequence is represented as x'(t) with the first input sample having polarity inversed ($-V_{in}$), the second input sample being unmodified ($V_{in}$) and the third input sample having incremental value $\Delta_x$ added to the input sample, as shown in the graph on the left side of FIG. 10(b). The digital output of the ADC circuit is y'(t) shown on the right side of FIG. 10(b).

As can be observed from FIGS. 10(a) and 10(b), by averaging the first two digital output values associated with the first two input samples with opposite polarities, the offset error c can be computed. Furthermore, the digital output values associated with the second and third input samples with the same polarity but different magnitude can be used to compute the actual gain of the ADC for estimating the gain error. More specifically, the digital output codes y'(t) are given as follows:

$$y'[1]=A_e(-x[1])+c,$$

$$y'[2]=A_ex[2]+c\approx A_ex[1]+c \text{ (since } x[2]\approx x[1]\text{), and}$$

$$y'[3]=A_{e'}(x[3]-\Delta_x)+c\approx A_{e'}(x[2]-\Delta_x)+c \text{ (since } x[3]\approx x[2]\text{)}. \quad \text{Eq. (9)}$$

Using the digital output codes in Eq. (9), offset and gain error of the ADC are estimated as follows. First, the offset error is given as:

$$OE \cong \frac{y'[1]+y'[2]}{2} \quad \text{Eq. (10)}$$

The estimated offset is subtracted from the subsequent digital output codes for the calibration of offset errors (assuming positive analog input), as follows:

$$y_{off\_calib}[2]=y'[2]-OE=A_ex[2]$$

$$y_{off\_calib}[4]=y'[4]-OE=-A_ex[4] \quad \text{Eq. (11)}$$

After the offset calibration is applied, the gain error $A_e$ is estimated as follows:

$$A_e = \frac{|y_{off\_calib}[2]-y_{off\_calib}[3]|}{\Delta_x} = \frac{\Delta_y}{\Delta_x}. \quad \text{Eq. (12)}$$

Once the offset and gain error estimation values are obtained, they can be stored in registers of the ADC, subsequent digital output codes can be calibrated as follows:

$$y_{calib}[3] = y_{off\_calib}[3]\left(\frac{A_0}{A_e}\right) + A_0 \cdot \Delta_x, \quad \text{Eq. (13)}$$

$$y_{calib}[4] = -y_{off\_calib}[4]\left(\frac{A_0}{A_e}\right)$$

$$y_{calib}[5] = y_{off\_calib}[5]\left(\frac{A_0}{A_e}\right)$$

where $A_0$ represents the ideal gain of the ADC. In the 3-sample interleaved calibration method of the present invention, the offset and gain errors are estimated continuously in the background and offset correction value and the gain correction value are stored in registers and are refreshed with every estimate.

Offset, Gain Estimation in the Presence of Even-order Non-linearities

As discussed above, during offset estimation, even-order non-linearities of the ADC are also estimated along with the DC offset. The transfer characteristic of an ADC with second order non-linearity can be modeled as:

$$y=a_0+a_1x+a_2x^2 \quad \text{Eq. (14)}$$

where, $a_0$ is the DC offset and $a_1$, $a_2$ are the coefficients of $1^{st}$ and $2^{nd}$ order errors respectively.

With the above model, the modified output codes of the ADC of Eq. (9) are given as:

$$y'[1]=a_0-a_1x[1]+a_2x[1]^2$$

$$y'[2]=a_0+a_1x[2]+a_2x[2]^2$$

$$y'[3]=a_0+a_1(x[3]-\Delta_x)+a_2(x[3]-\Delta_x)^2$$

$$y'[4]=a_0-a_1x[4]+a_2x[4]^2 \quad \text{Eq. (15)}$$

Using the digital output codes in Eq. (15), the offset error is estimated as follows:

$$OE \cong \frac{y'[1]+y'[2]}{2}=a_0+a_2x[1]^2 \quad \text{Eq. (16)}$$

The offset calibrated digital output codes are then given as:

$$y_{off\_calib}[2]=y'[2]-OE=a_1x[2]$$

$$y_{off\_calib}[3]=y'[3]-OE=a_1(x[3]-\Delta_x)+a_2(\Delta_x^2-2x[3]\Delta_x)$$

$$y_{off\_calib}[4]=y'[4]-OE=-a_1x[4] \quad \text{Eq. (17)}$$

It can be observed from Eq. (17) that the second order nonlinearity has been completely removed from two samples ($y_{off\_calib}[2]$ and $y_{off\_calib}[4]$). However, the third output sample $y_{off\_calib}[3]$ contains a residual $2^{nd}$ order error. Using the offset calibrated output codes, gain estimation is computed as:

$$\Rightarrow A_e = \frac{|y_{off\_calib}[2]-y_{off\_calib}[3]|}{\Delta_x} \quad \text{Eq. (18)}$$

$$= \frac{|a_1\Delta_x-a_2(\Delta_x^2-2x[3]\Delta_x)|}{\Delta_x}$$

$$= a_1 - \underbrace{a_2(\Delta_x-2x[3])}_{\text{Error in Gain Estimation}}$$

The second term in the last equation of Eq. (18) is the error in the gain estimation. Now, the calibrated output code for the third sample, with offset and gain error calibrated, is given as:

$$y_{calib}[3] = y_{off\_calib}[3]\left(\frac{A_0}{A_e}\right)+A_0 \cdot \Delta_x \quad \text{Eq. (19)}$$

$$= A_0\left(\frac{a_1(3[3]-\Delta_x)+a_2(\Delta_x^2-2x[3]\Delta_x)}{a_1-a_2(\Delta_x-2x[3])}\right)+A_0 \cdot \Delta_x$$

$$= A_0 x[3]\left(\frac{a_1}{a_1-a_2(\Delta_x-2x[3])}\right)$$

The error in the calibrated output code is given as:

$$Err[3]=A_0x[3]\left(\frac{a_2(\Delta_x-2x[3])}{a_1-a_2(\Delta_x-2x[3])}\right) \quad \text{Eq. (20)}$$

The calculation of the calibrated output code and the error (Eqs. (19) and (20)) is shown here for the third sample. However, the expression for the calibrated output code and error in the calibrated output remains the same for other samples as well.

Simulation using MATLAB was performed for a 24-bit ADC ($V_{ref}$=2.5 V) with the following transfer characteristics:

$$y=8e-06+0.9999943x-1.29e-06x^2 \quad \text{Eq. (21)}$$

FIGS. 11(a) and 11(b) are simulation results illustrating the ADC output voltage vs. the analog input voltage and the error in the output voltage before calibration is performed for the case when the ADC transfer characteristics exhibit only $2^{nd}$ order nonlinearity error in addition to the offset and gain error. As can be observed from FIGS. 11(a) and (b), the error for the full-scale input is approximately ±14.33 µV or approximately ±48 LSBs.

FIGS. 12(a) and 12(b) are simulation results illustrating the estimated gain and the error in the ADC output voltage vs. the analog input voltage after the conventional 2-point and 3-point calibration and after the background calibration method using the 3-sample interleaved calibration method according to one embodiment of the present invention. The conventional 2-point calibration performs offset estimation using a shorted input and gain error estimation using a positive full-scale input and the shorted input. The conventional 3-point calibration performs offset estimation using a shorted input and gain error estimation using positive full-scale input, negative full-scale input and the shorted input. After offset and gain calibration using the conventional calibration methods, the maximum error in the output is approximately −14.53 µV or about −48 LSBs for the 2-point calibration and +2.84 µV or 9 LSBs for the 3-point calibration. However, when the background calibration method of the present invention using 3-sample interleaved calibration scheme is used, the maximum error is approximately ±2.9 µV or about 9 LSBs for $-V_{ref}/2 \leq V_{in} \leq +V_{ref}/2$ and approximately ±15.5 µV or 52 LSBs for $(-V_{ref} \leq V_{in} < -V_{ref}/2)$ or $(V_{ref}/2 < V_{in} \leq V_{ref})$. The error from the background calibration method of the present invention is present mostly at the extreme ends of the input range. The background calibration method of the present invention actually achieves lower error in the mid-range of the input range.

Offset, Gain Estimation in Presence of Even and Odd Order Non-linearities

In some cases, the transfer characteristic of an ADC includes odd order as well as even order non-linearities. The transfer characteristic of an ADC with odd and even order non-linearity can be modeled as:

$$y=a_0+a_1x+a_2x^2+a_3x^3 \quad \text{Eq. (22)}$$

where, $a_0$ is DC offset, $a_1$, $a_2$ and $a_3$ are the coefficients of $1^{st}$, $2^{nd}$ and $3^{rd}$ order errors respectively.

With the above model, the modified output codes of the ADC of Eq. (9) are given as:

$$y'[1]=a_0-a_1x[1]+a_2x[1]^2-a_3x[1]^3$$

$$y'[2]=a_0+a_1x[2]+a_2x[2]^2+a_3x[2]^3$$

$$y'[3]=a_0+a_1(x[3]-\Delta_x)+a_2(x[3]-\Delta_x)^2+a_3(x[3]-\Delta_x)^3$$

$$y'[4]=a_0-a_1x[4]+a_2x[4]^2-a_3x[4]^3 \quad \text{Eq. (23)}$$

Using the digital output codes in Eq. (23), the offset error of the ADC is estimated as follows:

$$\Rightarrow OE \cong \frac{y'[1]+y'[2]}{2}=a_0+a_2x[1]^2 \quad \text{Eq. (24)}$$

The offset estimation in Eq. (24) is the same as the offset estimation in Eq. (16), thus, all even order nonlinearities have been estimated. The offset calibrated digital output codes are given as:

$$y_{off\_calib}[2] = y'[2] - OE = a_1x[2] + a_3x[2]^3$$

$$y_{off\_calib}[3] = y'[3] - OE = a_1(x[3] - \Delta_x) + a_2(\Delta_x^2 - 2x[3]\Delta_x) + a_3(x[3] - \Delta_x)^3$$

$$y_{off\_calib}[4] = y'[4] - OE = -a_1x[4] - a_3x[4]^3 \quad \text{Eq. (25)}$$

Using the offset calibrated output codes in Eq. (25), gain estimation is computed as:

$$\Rightarrow A_e = \frac{|y_{off\_calib}[2] - y_{off\_calib}[3]|}{\Delta_x} \quad \text{Eq. (26)}$$

$$= \frac{|a_1\Delta_x - a_2(\Delta_x^2 - 2x[3]\Delta_x)| + a_3(\Delta_x^3 - 3\Delta_x^2 x[3] + 3\Delta_x x[3]^2)|}{\Delta_x}$$

$$= a_1 \underbrace{-a_2(\Delta_x - 2x[3]) + a_3(\Delta_x^2 - 3\Delta_x x[3] + 3x[3]^2)}_{\text{Error in Gain Estimation}}$$

It can be observed from the last equation in Eq. (26) that both second and third order nonlinearities contribute to the error in the gain estimation. Now, the calibrated output code for the third sample, with offset and gain error calibrated, is given as:

$$y_{calib}[3] = y_{off\_calib}[3]\left(\frac{A_0}{A_e}\right) + A_0 \cdot \Delta_x \quad \text{Eq. (26)}$$

$$= A_0 \left( \frac{a_1(x[3] - \Delta_x) + a_2(\Delta_x^2 - 2x[3]\Delta_x) +}{a_1 - a_2(\Delta_x - 2x[3]) +} \right) + A_0 \cdot \Delta_x$$

$$= A_0 x[3] \left( \frac{a_1 + a_3 x[3]^2}{a_1 - a_2(\Delta_x - 2x[3]) +} \right)$$

And the error in the calibrated output code can be written as:

$$Err[3] = \quad \text{Eq. (28)}$$

$$A_0 x[3] \left( \frac{(\Delta_x - 2x[3])[a_2 - a_3(\Delta_x - x[3])]}{a_1 - a_2(\Delta_x - 2x[3]) + a_3(\Delta_x^2 - 3\Delta_x x[3] + 3x[3]^2)} \right)$$

The calculation of the calibrated output code and the error (Eqs. (27) and (28)) is shown here for the third sample. However, the expression for the calibrated output code and error in the calibrated output remains the same for other samples as well.

Simulation using MATLAB was performed for a 24-bit ADC ($V_{ref}$=2.5 V) with the following transfer characteristics:

$$y = 8e-06 + 0.9999943x - 1.29e-06x^2 + 1.83e-06x^3 \quad \text{Eq. (29)}$$

Figure 13A:
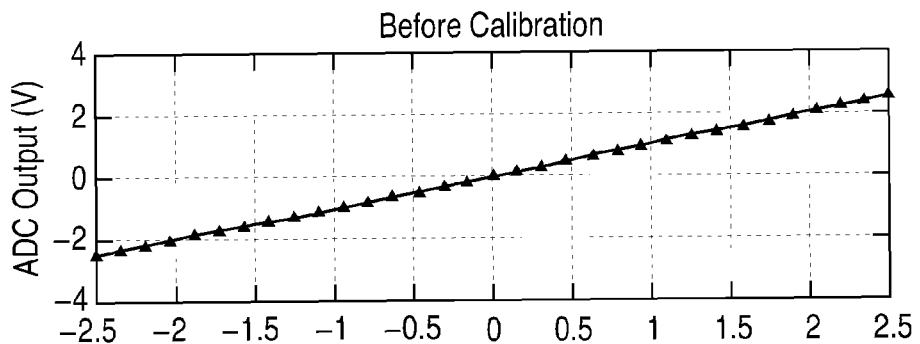
FIGS. 13(a) and 13(b) are simulation results illustrating the ADC output voltage vs. the analog input voltage and the error in the ADC output voltage before calibration is performed for the case when the ADC transfer characteristics exhibit $2^{nd}$ order as well as $3^{rd}$ order nonlinearity error in addition to the offset and gain error.
Figure 13B:
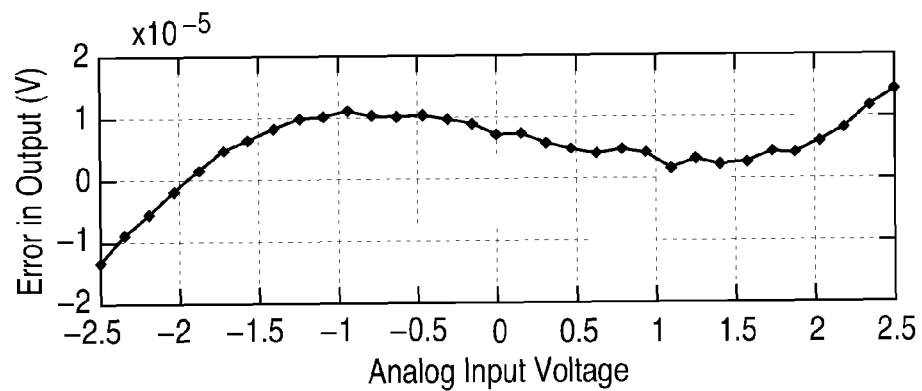

FIGS. 13(a) and 13(b) are simulation results illustrating the ADC output voltage vs. the analog input voltage and the error in the output voltage before calibration is performed for the case when the ADC transfer characteristics exhibit $2^{nd}$ order as well as $3^{rd}$ order nonlinearity error in addition to the offset and gain error. As can be observed from FIGS. 13(a) and 13(b), the error for the full-scale input is approximately ±14.08 µV or approximately ±47 LSBs.

Figure 14A:
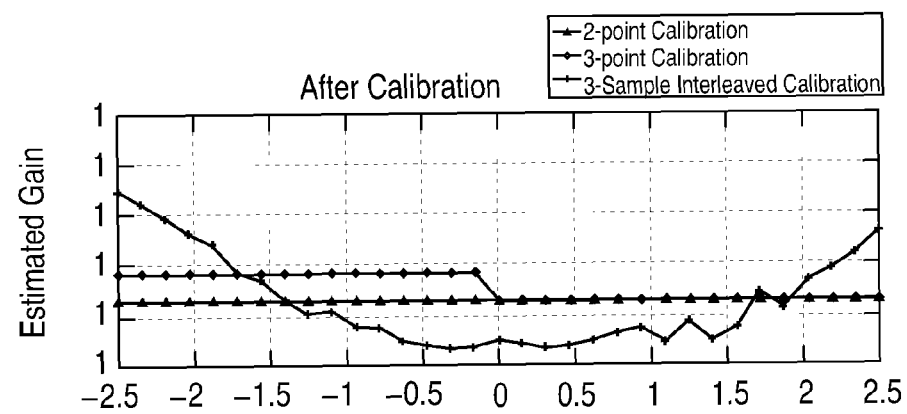
FIGS. 14(a) and 14(b) are simulation results illustrating the estimated gain and the error in the ADC output voltage vs. the analog input voltage after the conventional 2-point and 3-point calibration and after the background calibration method using the 3-sample interleaved calibration method according to one embodiment of the present invention.
Figure 14B:
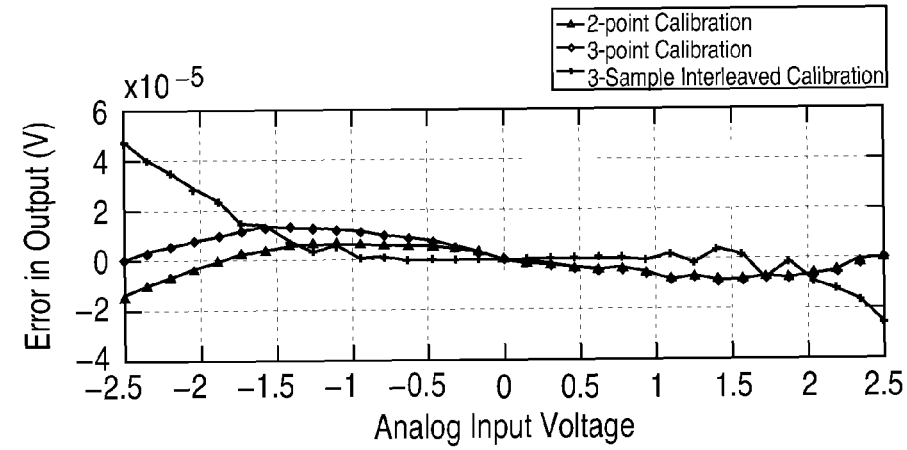

FIGS. 14(a) and 14(b) are simulation results illustrating the estimated gain and the error in the ADC output voltage vs. the analog input voltage after the conventional 2-point and 3-point calibration and after the background calibration method using the 3-sample interleaved calibration method according to one embodiment of the present invention. After offset and gain calibration using the conventional calibration methods, the maximum error in the output is approximately −14.06 µV or about −47 LSBs for the 2-point calibration and +13.27 µV or 44 LSBs for the 3-point calibration. However, when the background calibration method of the present invention using 3-sample interleaved calibration scheme is used, the maximum error is approximately +5.45 µV or about 18 LSBs for $-V_{ref}/2 \leq V_{in} \leq +V_{ref}/2$, approximately +47 µV or +157 LSBs for $(-V_{ref} \leq V_{in} < -V_{ref}/2)$, approximately −26 µV or −88 LSBs for $(V_{ref}/2 < V_{in} \leq V_{ref})$.

It can be observed from FIGS. 14(a) and 14(b) that the performance of the proposed calibration technique is much better than any of the conventional calibration techniques when analog input signal is in the middle range, i.e., $(-V_{ref}/2 \leq V_{in} \leq +V_{ref}/2)$. When the input approaches full-scale value, error in the output starts to increase. However, in most of the sensor applications, the input operating range is very small, such as on the order of ~10 mV, and even with higher modulator gain settings, the analog input signal is not likely to operate near the full-scale range. Therefore, the 3-sample interleaved calibration provides sufficient calibration accuracy in view of odd and even order non-linearities.

4-Sample Interleaved Calibration

When the 3-sample interleaved calibration method described above is used, the calibrated digital output codes have residual non-linearity error even when the ADC has dominant second order nonlinearity, as shown by the after calibration results in FIG. 12. The residual non-linearity error can be completely removed by introducing another sample in the modified input sequence. According to a second embodiment of the present invention, a 4-sample interleaved offset and gain error estimation method is applied where four samples are used to provide the offset and gain error estimates, with the offset error is estimated at two different input levels.

More specifically, the four input samples include two pairs of input samples. One pair with opposite polarities and unmodified input levels and a second pair of input samples with the opposite polarity and modified magnitude. These two pairs of input samples at opposite polarities are used to estimate offset at two different input levels. Therefore, a first pair of input samples at opposite polarities are at the unmodified input level while a second pair of input samples at opposite polarities are at an "input $\pm \Delta_x$" level. The input samples in each pair of input samples for offset estimation or for gain error estimation are preferably consecutive or adjacent to each other. The input samples for offset estimation are shared by the gain error estimation.

Figure 15:
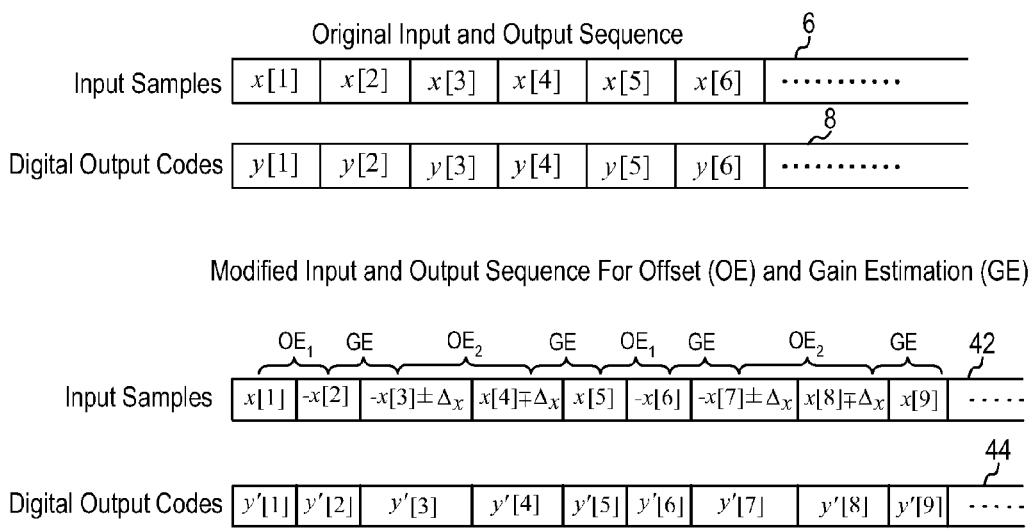
FIG. 15 illustrates exemplary input samples and digital output codes for the original input and output sequence and the modified input and output sequence for the 4-sample interleaved offset and gain error estimation according to one embodiment of the present invention.

FIG. 15 illustrates exemplary input samples and digital output codes for the original input and output sequence and the modified input and output sequence for 4-sample interleaved offset and gain error estimation according to one embodiment of the present invention. Referring to FIG. 15, the input sample sequence for the original, unmodified input samples is shown as x[1], x[2], x[3] and x[4] . . . and so on (sequence 6) and the corresponding digital output code sequence is y[1], y[2], y[3] and y[4] . . . and so on (sequence 8). When the 4-sample interleaved offset and gain error estimation method (or "4-sample interleaved calibration method") is applied, the first input sample remains unchanged, the polarity of the second input samples to the ADC circuit is reversed, the third input sample remains polarity inversed and also has the incremental value $\Delta_x$ introduced, and the fourth input sample is the same as the third input sample but with the polarity inversed back to the original unmodified polarity. For the third polarity-inversed input sample, the incremental value $\Delta_x/2$ is added for positive analog inputs and subtracted for negative analog inputs to reduce the magnitude of the analog differential input signal. For the fourth input sample (unmodified polarity), the incremental value $\Delta_x/2$ is subtracted for positive analog inputs and added for negative analog inputs to reduce the magnitude of the analog differential input signal. Thus, as shown in FIG. 15, the modified input sample sequence becomes x[1], −x[2], −x[3]±$\Delta_x$, x[4]∓$\Delta_x$ and the 4-sample cycle repeats (sequence 42). The corresponding digital output codes are represented as y'[n] (sequence 44).

Figure 16A:
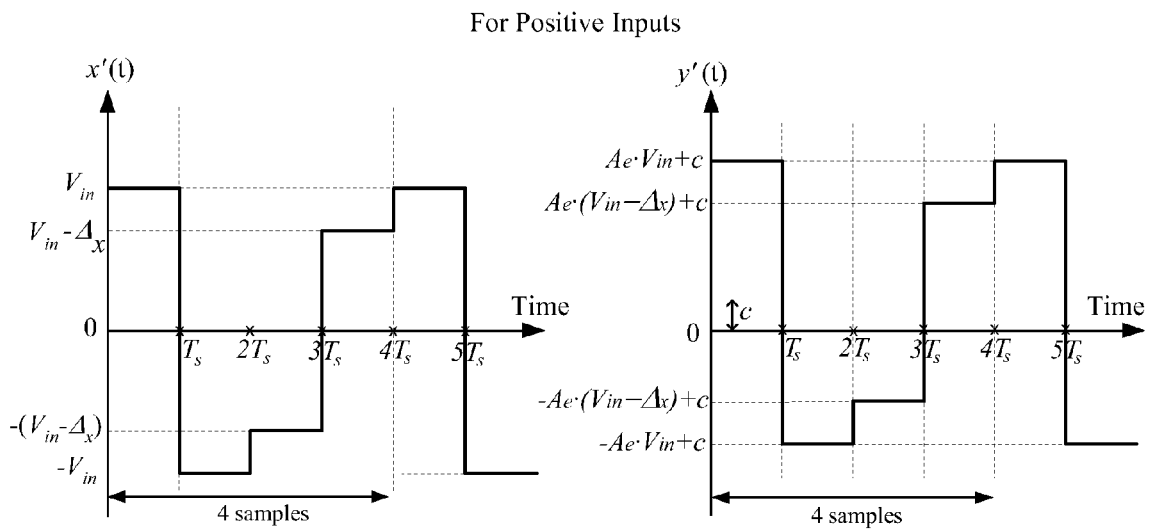
FIGS. 16(a) and 16(b) are signal diagrams illustrating the modified input sample sequence and the corresponding digital output codes for 4-sample interleaved offset and gain error estimation in time domain according to one embodiment of the present invention.
Figure 16B:
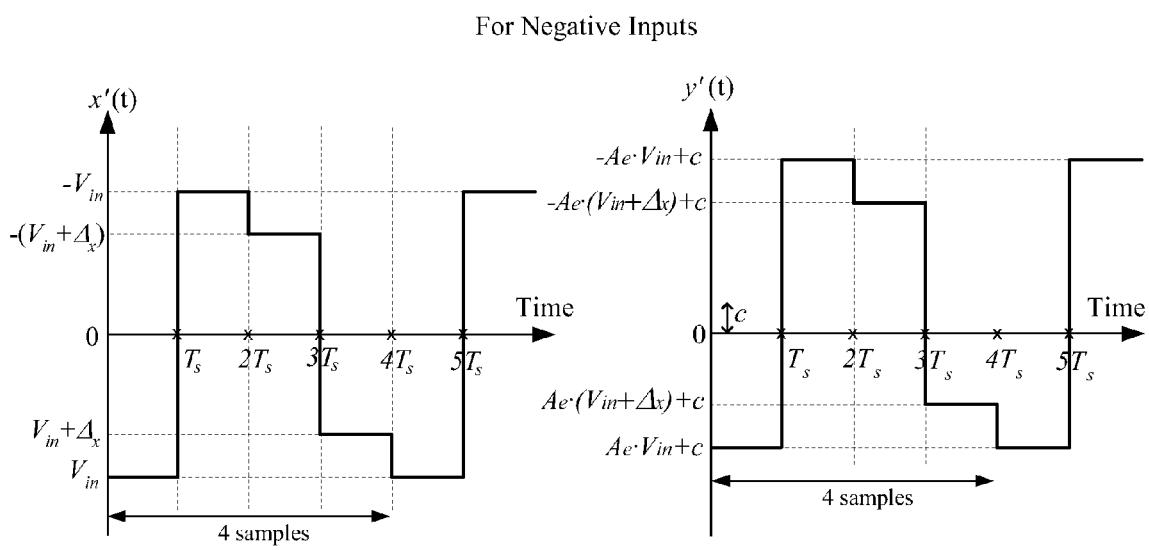

FIGS. 16(a) and 16(b) are signal diagrams illustrating the modified input sample sequence and the corresponding digital output codes for 4-sample interleaved offset and gain error estimation in time domain according to one embodiment of the present invention. FIG. 16(a) illustrates the modified input sample sequence for positive inputs. Time $T_s$ is the duration of each input sample conversion. Where the original, unmodified input signal is represented as x(t)=$V_{in}$, the modified input sample sequence is represented as x'(t) with the first input sample being unmodified ($V_{in}$), the second input sample being polarity reversed (−$V_{in}$), the third input sample having incremental value $\Delta_x$ added to the polarity reversed input sample, and the fourth input sample is the inverse of the third input sample, as shown in the graph on the left side of FIG. 16(a). The digital output of the ADC circuit is y'(t) shown on the right side of FIG. 16(a). FIG. 16(b) illustrates the modified input sample sequence for negative inputs. The modified input sample sequence is represented as x'(t) with the first input sample being unmodified ($V_{in}$), the second input sample being polarity reversed (−$V_{in}$), the third input sample having incremental value $\Delta_x$ subtracted from the polarity reversed input sample, and the fourth input sample is the inverse of the third input sample, as shown on the left side of FIG. 16(b). The digital output of the ADC circuit is y'(t) shown on the right side of FIG. 16(b).

As can be observed from FIGS. 16(a) and 16(b), by averaging the first two digital output values associated with the first two input samples with opposite polarities, and averaging the last two digital output values associated with the last two input samples with opposite polarities, the offset error c can be computed. Furthermore, the digital output values associated with the second and third input samples with the same polarity but different magnitude can be used to compute the actual gain of the ADC for estimating the gain error. More specifically, the digital output codes y'(t) are given as follows:

$$y'[1]=A_e\cdot x[1]+c$$

$$y'[2]=A_e\cdot(-x[2])+c \cong A_e\cdot(-x[1])+c \text{ (since } x[2]\cong x[1])$$

$$y'[3]=A_e\cdot(-x[3]\pm\Delta_x)+c\cong A_e\cdot(-x[2]\pm\Delta_x)+c \text{ (since } x[3]\cong x[2])$$

$$y'[4]=-A_e\cdot(-x[4]\pm\Delta_x)+c\cong -A_e\cdot(-x[3]\pm\Delta_x)+c \text{ (since } x[4]\cong x[3])$$

$$y'[5]=A_e\cdot x[5]+c\cong A_e\cdot x[4]+c \text{ (since } x[5]\cong x[4]) \quad \text{Eq. (30)}$$

Using the digital output codes in Eq. (30), offset and gain error of the ADC are estimated as follows. First, the offset error is given as:

$$OE_1 \cong \frac{y'[1]+y'[2]}{2} \quad \& \quad OE_2 \cong \frac{y'[3]+y'[4]}{2} \quad \text{Eq. (31)}$$

The offset estimates $OE_1$, $OE_2$ are offset estimates taken at the 'Input' and 'Input ±$\Delta_x$' levels respectively. The two offset estimate values are stored in registers and are used to calibrate for the offset errors in the subsequent samples, as follows:

$$y_{off\_calib}[5]=y'[5]-OE_1$$

$$y_{off\_calib}[6]=y'[6]-OE_1$$

$$y_{off\_calib}[7]=y'[7]-OE_2$$

$$y_{off\_calib}[8]=y'[8]-OE_2$$

$$y_{off\_calib}[9]=y'[9]-OE_1 \quad \text{Eq. (32)}$$

After the offset calibration is applied, the gain error $A_e$ is estimated as follows:

$$\Rightarrow A_e = \frac{|y_{off\_calib}[7]-y_{off\_calib}[6]|}{\Delta_x} \quad \text{Eq. (33)}$$

$$= \frac{|y_{off\_calib}[9]-y_{off\_calib}[8]|}{\Delta_x}$$

$$= \frac{\Delta_y}{\Delta_x}$$

Once the offset and gain error estimation values are obtained, they can be stored in registers of the ADC, subsequent digital output codes can be calibrated as follows:

$$y_{calib}[7] = -\left[y_{off\_calib}[7]\left(\frac{A_0}{A_e}\right)-(A_0\cdot\pm\Delta_x)\right]. \quad \text{Eq. (34)}$$

$$y_{calib}[7] = y_{off\_calib}[8]\left(\frac{A_0}{A_e}\right)+(A_0\cdot\pm\Delta_x)$$

$$y_{calib}[9] = y_{off\_calib}[9]\left(\frac{A_0}{A_e}\right)$$

$$y_{calib}[10] = -y_{off\_calib}[10]\left(\frac{A_0}{A_e}\right)$$

where $A_0$ represents the ideal gain of the ADC. In the 4-sample interleaved calibration method of the present invention, the offset and gain errors are estimated continuously in the background and offset correction value and the gain correction value are stored in registers and are refreshed with every estimate.

Offset, Gain Estimation in Presence of Even-order Non-linearities

As discussed above, during offset estimation, even-order non-linearities of the ADC are also estimated along with the DC offset. The transfer characteristic of an ADC with second order non-linearity can be modeled as:

$$y=a_0+a_1x+a_2x^2 \quad \text{Eq. (35)}$$

where, $a_0$ is the DC offset and $a_1$, $a_2$ are the coefficients of $1^{st}$ and $2^{nd}$ order errors respectively.

Now, the modified output codes of the ADC as per Eq. (30) are given as, $$y'[1]=a_0+a_1x[1]+a_2x[1]^1$$

$$y'[2]=a_0-a_1x[2]+a_2x[2]^2$$

$$y'[3]=a_0-a_1(x[3]-\Delta_x)+a_2(x[3]-\Delta_x)^2$$

$$y'[4]=a_0+a_1(x[4]-\Delta_x)+a_2(x[4]-\Delta_x)^2$$

$$y'[5]=a_0+a_1x[5]+a_2x[5]^2 \quad \text{Eq. (36)}$$

Using the digital output codes in Eq. (36), the offset error is estimated as follows:

$$OE_1 \cong \frac{y'[1]+y'[2]}{2} = a_0 + a_2x[1]^2, \text{ and} \quad \text{Eq. (37)}$$

$$OE_2 \cong \frac{y'[3]+y'[4]}{2} = a_0 + a_2(x[3]-\Delta_x)^2.$$

The offset calibrated digital output codes are then given as:

$$y_{off\_calib}[5]=a_1x[5]$$

$$y_{off\_calib}[6]=-a_1x[6]$$

$$y_{off\_calib}[7]=-a_1(x[7]-\Delta_x)$$

$$y_{off\_calib}[8]=a_1(x[8]-\Delta_x)$$

$$y_{off\_calib}[9]=a_1x[9] \quad \text{Eq. (38)}$$

It can be observed from Eq. (38) that the second order term has been removed by the offset calibration. Using the offset calibrated output codes and Eq. (33), the gain estimation is computed as:

$$A_e = \frac{|y_{off\_calib}[7]-y_{off\_calib}[6]|}{\Delta_x} \quad \text{Eq. (39)}$$

$$= \frac{|y_{off\_calib}[9]-y_{off\_calib}[8]|}{\Delta_x}$$

$$= a_1$$

As can be observed from Eq. (39), the gain estimation is accurate and doesn't contain any error terms. So, the gain error estimated in Eq. (39) can be used to obtain accurate offset and gain calibrated output values.

Simulation using MATLAB was performed for a 24-bit ADC ($V_{ref}$=2.5 V) with the following transfer characteristics:

$$y=8e-06+0.9999943x-1.29e-06x^2 \quad \text{Eq. (40)}$$

FIGS. 17(a) and 17(b) are simulation results illustrating the ADC output voltage vs. the analog input voltage and the error in the output voltage before calibration is performed for the case when the ADC transfer characteristics exhibit only $2^{nd}$ order nonlinearity error in addition to the offset and gain error. As can be observed from FIGS. 17(a) and (b), the error for the full-scale input is approximately ±14.33 μV or approximately ±48 LSBs.

FIGS. 18(a) and 18(b) are simulation results illustrating the estimated gain and the error in the ADC output voltage vs. the analog input voltage after the conventional 2-point and 3-point calibration and after the background calibration method using the 4-sample interleaved calibration method according to one embodiment of the present invention. After offset and gain calibration using the conventional calibration methods, the maximum error in the output is approximately −14.53 μV or about −47 LSBs for the 2-point calibration and +2.84 μV or 9 LSBs for the 3-point calibration. However, when the background calibration method of the present invention using 4-sample interleaved calibration scheme is used, the maximum error is approximately ±2.3 μV or about ±6 LSBs. The error from the background calibration method of the present invention is present mostly at the lower and higher end of the input range. The background calibration method of the present invention actually achieves lower error in the middle of the input range.

Offset, Gain Estimation in Presence of Even and Odd Order Non-linearities

While the 4-Sample Interleaved calibration method works well when ADC has dominant second order nonlinearity, however, in the presence of third order non-linearity in the ADC characteristics, a residual error remains in the calibrated output codes. The transfer characteristic of an ADC with odd and even order non-linearity can be modeled as:

$$y=a_0+a_1x+a_2x^2+a_3x^3 \quad \text{Eq. (41)}$$

where, $a_0$ is DC offset, $a_1$, $a_2$ and $a_3$ are the coefficients of $1^{st}$, $2^{nd}$ and $3^{rd}$ order errors respectively.

With the above model, the modified output codes of the ADC of Eq. (30) are given as:

$$y'[1]=a_0+a_1x[1]+a_2x[1]^2+a_3x[1]^3$$

$$y'[2]=a_0-a_1x[2]+a_2x[2]^2-a_3x[2]^3$$

$$y'[3]=a_0-a_1(x[3]-\Delta_x)+a_3(x[3]-\Delta_x)^2-a_3(x[3]-\Delta_x)^3$$

$$y'[4]=a_0+a_1(x[4]-\Delta_x)+a_2(x[4]-\Delta_x)^2+a_3(x[4]-\Delta_x)^3$$

$$y'[5]=a_0+a_1x[5]+a_2x[5]^2+a_3x[5]^3 \quad \text{Eq. (42)}$$

Using the digital output codes in Eq. (42), the offset error of the ADC is estimated as follows:

$$OE_1 \cong \frac{y'[1]+y'[2]}{2} = a_0 + a_2x[1]^2 \quad \text{Eq. (43)}$$

$$OE_2 \cong \frac{y'[3]+y'[4]}{2} = a_0 + a_2(x[3]-\Delta_x)^2$$

The offset estimation in Eq. (43) is the same as the offset estimation in Eq. (37), thus, only even order nonlinearities have been estimated. The offset calibrated digital output codes are given as:

$$y_{off\_calib}[5]=y'[5]-OE_1=a_1x[5]+a_3x[5]^3$$

$$y_{off\_calib}[6]=y'[6]-OE_1=-a_1x[6]-a_3x[6]^3$$

$$y_{off\_calib}[7]=y'[7]-OE_2=-a_1(x[7]-\Delta_x)-a_3(x[7]-\Delta_x)^3$$

$$y_{off\_calib}[8]=y'[8]-OE_2=a_1(x[8]-\Delta_x)+a_3(x[8]-\Delta_x)^3$$

$$y_{off\_calib}[9]=y'[9]-OE_1=a_1x[9]+a_3x[9]^3 \quad \text{Eq. (44)}$$

Using the offset calibrated output codes in Eq. (44), gain estimation is computed as:

$$A_e = \frac{|y_{off\_calib}[5]-y_{off\_calib}[4]|}{\Delta_x} = \frac{|y_{off\_calib}[7]-y_{off\_calib}[6]|}{\Delta_x} \quad \text{Eq. (45)}$$

$$= \frac{a_1\Delta_x + a_3(\Delta_x^3 - 3\Delta_x^2x[5] + 3\Delta_xx[5]^2)}{\Delta_x}$$

$$= a_1 + \underbrace{a_3(\Delta_x^2 - 3\Delta_xx[5] + 3x[5]^2)}_{\text{Error in Gain Estimation}}$$

The second term in the last equation in Eq. (45) is the error in the gain estimation. Now, the calibrated output code for the fifth sample, with offset and gain error calibrated, is given as:

$$y_{calib}[5] = y_{off\_calib}[5]\left(\frac{A}{A_e}\right) \quad \text{Eq. (46)}$$

$$= (a_1 x[5] + a_3 x[5]^3)\left(\frac{A}{a_1 + a_3(\Delta_x^2 - 3\Delta_x x[5] + 3x[5]^2)}\right)$$

$$= Ax[5]\left(\frac{a_1 + a_3 x[5]^2}{a_1 + a_3(\Delta_x^2 - 3\Delta_x x[5] + 3x[5]^2)}\right)$$

And the error in the calibrated output code of the fifth sample can be written as:

$$\text{Err}[5] = Ax[5]\left(\frac{a_3(-2x[5]^2 - \Delta_x^2 + 3\Delta_x x[5])}{a_1 + a_3(\Delta_x^2 - 3\Delta_x x[5] + 3x[5]^2)}\right) \quad \text{Eq. (47)}$$

Simulation using MATLAB was performed for a 24-bit ADC ($V_{ref}$=2.5 V) with the following transfer characteristics including 3rd order polynomial:

$$y = 8e{-}06 + 0.9999943x - 1.29e{-}06x^2 + 1.83e{-}06x^3 \quad \text{Eq. (48)}$$

Figure 19A:
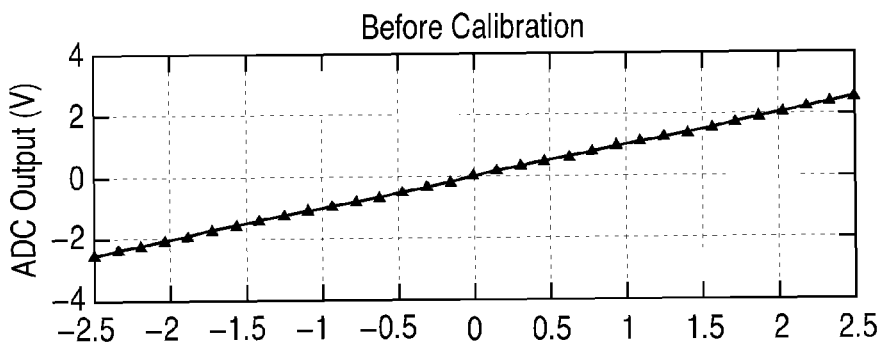
FIGS. 19(a) and 19(b) are simulation results illustrating the ADC output voltage vs. the analog input voltage and the error in the ADC output voltage before calibration is performed for the case when the ADC transfer characteristics exhibit $2^{nd}$ order as well as $3^{rd}$ order nonlinearity error in addition to the offset and gain error.
Figure 19B:
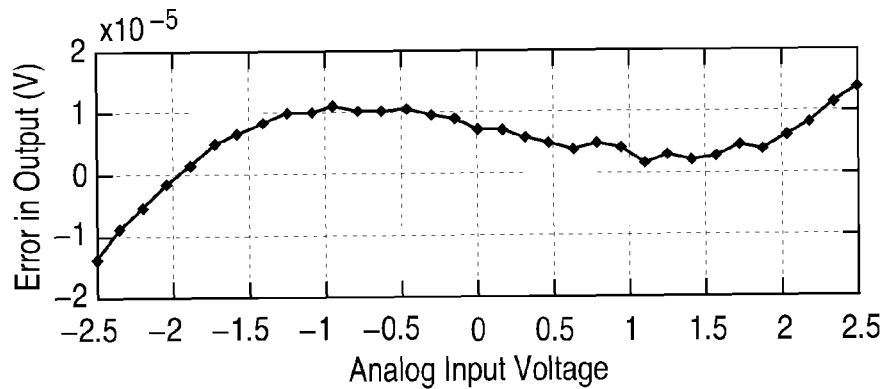

FIGS. 19(*a*) and 19(*b*) are simulation results illustrating the ADC output voltage vs. the analog input voltage and the error in the output voltage before calibration is performed for the case when the ADC transfer characteristics exhibit $2^{nd}$ order as well as $3^{rd}$ order nonlinearity error in addition to the offset and gain error. As can be observed from FIGS. 19(*a*) and 19(*b*), the error for the full-scale input is approximately ±14.33 µV or approximately ±48 LSBs.

Figure 20A:
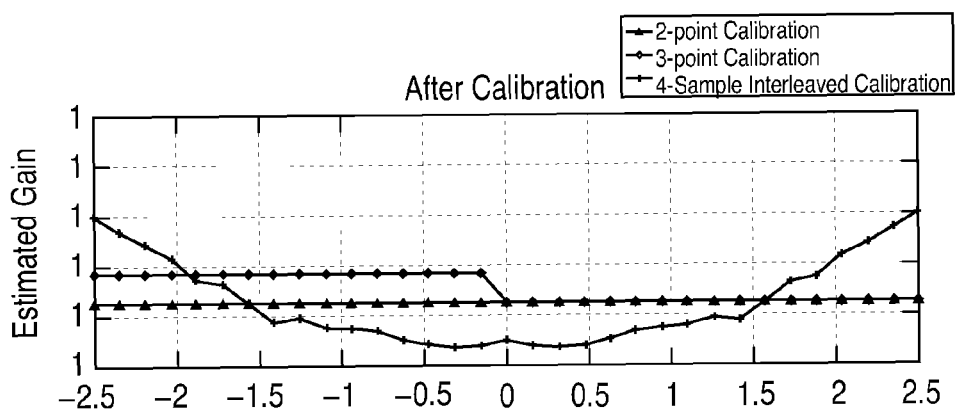
FIGS. 20(a) and 20(b) are simulation results illustrating the estimated gain and the error in the ADC output voltage vs. the analog input voltage after the conventional 2-point and 3-point calibration and after the background calibration method using the 4-sample interleaved calibration method according to one embodiment of the present invention.
Figure 20B:
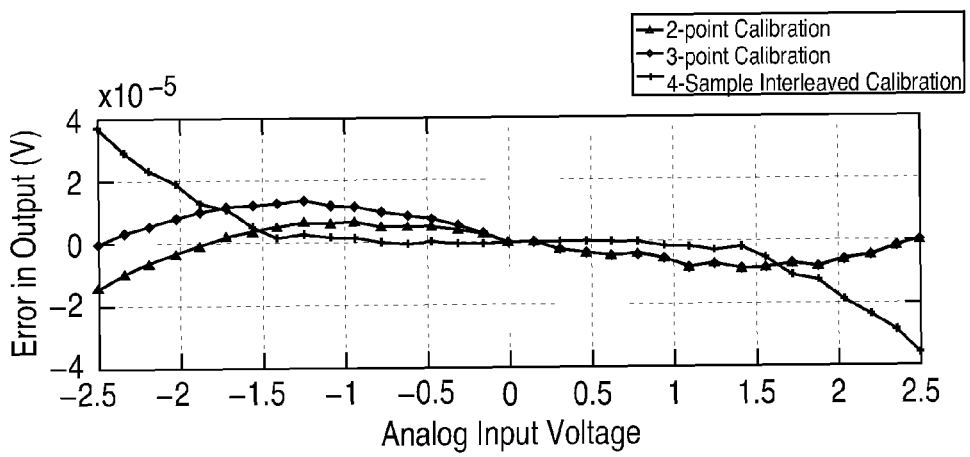

FIGS. 20(*a*) and 20(*b*) are simulation results illustrating the estimated gain and the error in the ADC output voltage vs. the analog input voltage after the conventional 2-point and 3-point calibration and after the background calibration method using the 4-sample interleaved calibration method according to one embodiment of the present invention. After offset and gain calibration using the conventional calibration methods, the maximum error in the output is approximately −14.06 µV or about −47 LSBs for the 2-point calibration and +13.27 µV or 44 LSBs for the 3-point calibration. However, when the background calibration method of the present invention using 3-sample interleaved calibration scheme is used, the maximum error is approximately ±2.92 µV or about ±9.82 LSBs for $-V_{ref}/2 \leq V_{in} \leq +V_{ref}/2$, and approximately ±36 µV or ±122 LSBs for $(-V_{ref} \leq V_{in} < -V_{ref}/2)$ or $(V_{ref}/2 < V_{in} \leq V_{ref})$.

It can be observed from FIGS. 20(*a*) and 20(*b*) that the performance of the proposed calibration technique is much better than any of the conventional calibration techniques when analog input signal is in the middle range, i.e., $(-V_{ref}/2 \leq V_{in} \leq +V_{ref}/2)$. When the input approaches full-scale value, error in the output starts to increase.

5-Sample Interleaved Calibration

When the 4-sample interleaved calibration method described above is used, the calibrated digital output codes have residual non-linearity error when the ADC has dominant third order nonlinearity, as shown by the after calibration results in FIG. 20(*b*). According to a third embodiment of the present invention, a 5-sample interleaved offset and gain error estimation method is applied to estimate the $3^{rd}$ order nonlinearity coefficient '$a_3$' and then calibrate the ADC output codes with this error coefficient. The 5-sample interleaved offset and gain error estimation ("5-sample interleaved calibration") method is derived from an 8-sample interleaved calibration method. In essence, it takes 8 input samples to obtain an estimate of the offset, gain error and the coefficient $a_3$.

However, in accordance with the present invention, the 8 input samples are optimized to just 5 samples with reasonable approximations to simplify the implementation of the interleaved calibration method.

More specifically, in order to estimate the third order nonlinearity coefficient $a_3$, the input samples, assuming a DC value of $x_0$, are modified as:

$$\begin{aligned}
x[1] &= x_0 & x[5] &= -x_0 \\
x[2] &= x_0 - \Delta_x & x[6] &= -(x_0 - \Delta_x) \\
x[3] &= x_0 - 2\Delta_x & x[7] &= -(x_0 - 2\Delta_x) \\
x[4] &= x_0 - 3\Delta_x & x[8] &= -(x_0 - 3\Delta_x)
\end{aligned} \quad \text{Eq. (49)}$$

That is, the magnitude of the input samples are modified to three different levels: the incremental value $\Delta_x$ and multiples of the incremental value $\Delta_x$. At each magnitude levels, a pair of input samples with opposite polarity is provided. The corresponding output samples of the ADC are given as:

$$y[1] = a_0 + a_1 x_0 + a_2 x_0^2 + a_3 x_0^3$$

$$y[2] = a_0 + a_1(x_0 - \Delta_x) + a_2(x_0 - \Delta_x)^2 + a_3(x_0 - \Delta_x)^3$$

$$y[3] = a_0 + a_1(x_0 - 2\Delta_x) + a_2(x_0 - 2\Delta_x)^2 + a_3(x_0 - 2\Delta_x)^3$$

$$y[4] = a_0 + a_1(x_0 - 3\Delta_x) + a_2(x_0 - 3\Delta_x)^2 + a_3(x_0 - 3\Delta_x)^3 \quad \text{Eq. (50)}$$

&

$$y[5] = a_0 - a_1 x_0 + a_2 x_0^2 - a_3 x_0^3$$

$$y[6] = a_0 - a_1(x_0 - \Delta_x) + a_2(x_0 - \Delta_x)^2 - a_3(x_0 - \Delta_x)^3$$

$$y[7] = a_0 - a_1(x_0 - 2\Delta_x) + a_2(x_0 - 2\Delta_x)^2 - a_3(x_0 - 2\Delta_x)^3$$

$$y[8] = a_0 - a_1(x_0 - 3\Delta_x) + a_2(x_0 - 3\Delta_x)^2 - a_3(x_0 - 3\Delta_x)^3 \quad \text{Eq. (51)}$$

Using the 8 input samples in Eq. (49), the offset can be estimated at all the input levels as follows:

$$OE_1 = \frac{y[1] + y[5]}{2} = a_0 + a_2 x_0^2 \quad \text{Eq. (52)}$$

$$OE_2 = \frac{y[2] + y[6]}{2} = a_0 + a_2(x_0 - \Delta_x)^2$$

$$OE_3 = \frac{y[3] + y[7]}{2} = a_0 + a_2(x_0 - 2\Delta_x)^2$$

$$OE_4 = \frac{y[4] + y[8]}{2} = a_0 + a_2(x_0 - 3\Delta_x)^2$$

The estimated offset can be subtracted from the corresponding output samples to calibrate for the DC offset as well as all the even order non-linearities. The offset calibrated output samples are given as:

$$y_{oc}[5] = y[5] - OE_1 = -a_1 x_0 - a_3 x_0^3$$

$$y_{oc}[6] = y[6] - OE_2 = -a_1(x_0 - \Delta_x) - a_3(x_0 - \Delta_x)^3$$

$$y_{oc}[7] = y[7] - OE_3 = -a_1(x_0 - 2\Delta_x) - a_3(x_0 - 2\Delta_x)^3$$

$$y_{oc}[8] = y[8] - OE_4 = -a_1(x_0 - 3\Delta_x) - a_3(x_0 - 3\Delta_x)^2 \quad \text{Eq. (53)}$$

The inverted output samples (1-4) can also be calibrated for the offset errors in the same manner as in Eq. (53).

The $3^{rd}$ order non-linearity error coefficient $a_3$ can be estimated using the offset calibrated output samples as follow:

$$dy_1 = y_{oc}[6] - y_{oc}[5] = a_1\Delta_x + a_3\Delta_x(3x_0^2 + \Delta_x^2 - 3x_0\Delta_x)$$

$$dy_2 = y_{oc}[7] - y_{oc}[6] = a_1\Delta_x + a_3\Delta_x(3x_0^2 + 7\Delta_x^2 - 9x_0\Delta_x)$$

$$dy_3 = y_{oc}[8] - y_{oc}[7] = a_1\Delta_x + a_3\Delta_x(3x_0^2 + 19\Delta_x^2 - 15x_0\Delta_x) \quad \text{Eq. (54)}$$

Taking the difference again:

$$d^2y_1 = dy_1 - dy_2 = 6a_3\Delta_x^2(x_0 - \Delta_x)$$

$$d^2y_2 = dy_2 - dy_3 = 6a_3\Delta_x^2(x_0 - 2\Delta_x) \quad \text{Eq. (55)}$$

One more difference provides the coefficient for the $3^{rd}$ order non-linearity:

$$\Rightarrow d^3y = d^2y_1 - d^2y_2 = 6a_3\Delta_x^3 \quad \text{Eq. (56)}$$

Using Eqs. (55) & (56), $3^{rd}$ order non-linearity error can be estimated as:

$$\Rightarrow a_3 x_0^3 = \frac{d^3y}{6}\left(\frac{d^2y_1}{d^3y} + 1\right)^3 \quad \text{Eq. (57)}$$

$$a_3(x_0 - \Delta_x)^3 = \frac{d^3y}{6}\left(\frac{d^2y_1}{d^3y}\right)^3$$

$$a_3(x_0 - 2\Delta_x)^3 = \frac{d^3y}{6}\left(\frac{d^2y_1}{d^3y} - 1\right)^3$$

$$a_3(x_0 - 3\Delta_x)^3 = \frac{d^3y}{6}\left(\frac{d^2y_1}{d^3y} - 2\right)^3$$

Now, offset calibrated digital output codes can be calibrated for $3^{rd}$ order non-linearity error as follows:

$$y_{nlc}[9] = y_{oc}[9] - \frac{d^3y}{6}\left(\frac{d^2y_1}{d^3y} + 1\right)^3 = a_1 x_0 \quad \text{Eq. (58)}$$

$$y_{nlc}[10] = y_{oc}[10] - \frac{d^3y}{6}\left(\frac{d^2y_1}{d^3y}\right)^3 = a_1(x_0 - \Delta_x)$$

$$y_{nlc}[11] = y_{oc}[11] - \frac{d^3y}{6}\left(\frac{d^2y_1}{d^3y} - 1\right)^3 = a_1(x_0 - 2\Delta_x)$$

$$y_{nlc}[12] = y_{oc}[12] - \frac{d^3y}{6}\left(\frac{d^2y_1}{d^3y} - 2\right)^3 = a_1(x_0 - 3\Delta_x)$$

After the calibration of the $3^{rd}$ order non-linearity error in Eq. (58), the output samples are left with only linear gain error. Gain can be estimated by calculating the slope of the non-linearity calibrated output codes as follows:

$$A_e = \frac{y_{nlc}[9] - y_{nlc}[10]}{D\{\Delta_x\}} = \frac{a_1 \Delta_x}{D\{\Delta_x\}} = a_1 \quad \text{Eq. (59)}$$

Once the gain estimation is obtained, gain calibration can be performed on the subsequent output samples as follows:

$$y_{calib}[10] = \frac{y_{nlc}[10]}{A_e} + D[\Delta_x] = x_0 \quad \text{Eq. (60)}$$

$$y_{calib}[11] = \frac{y_{nlc}[11]}{A_e} + 2D[\Delta_x] = x_0$$

-continued $$y_{calib}[12] = \frac{y_{nlc}[12]}{A_e} + 3D[\Delta_x] = x_0$$

$$y_{calib}[13] = -\frac{y_{nlc}[13]}{A_e} = x_0$$

The output codes in Eq. (60) have been calibrated for the DC, $1^{st}$, $2^{nd}$ and $3^{rd}$ order errors.

Simulation using MATLAB was performed for a 24-bit ADC ($V_{ref}$=2.5 V) with the following transfer characteristics:

$$y = 8e{-}06 + 0.9999943x - 1.29e{-}06x^2 + 1.83e{-}06x^3 \quad \text{Eq. (61)}$$

Figure 21:
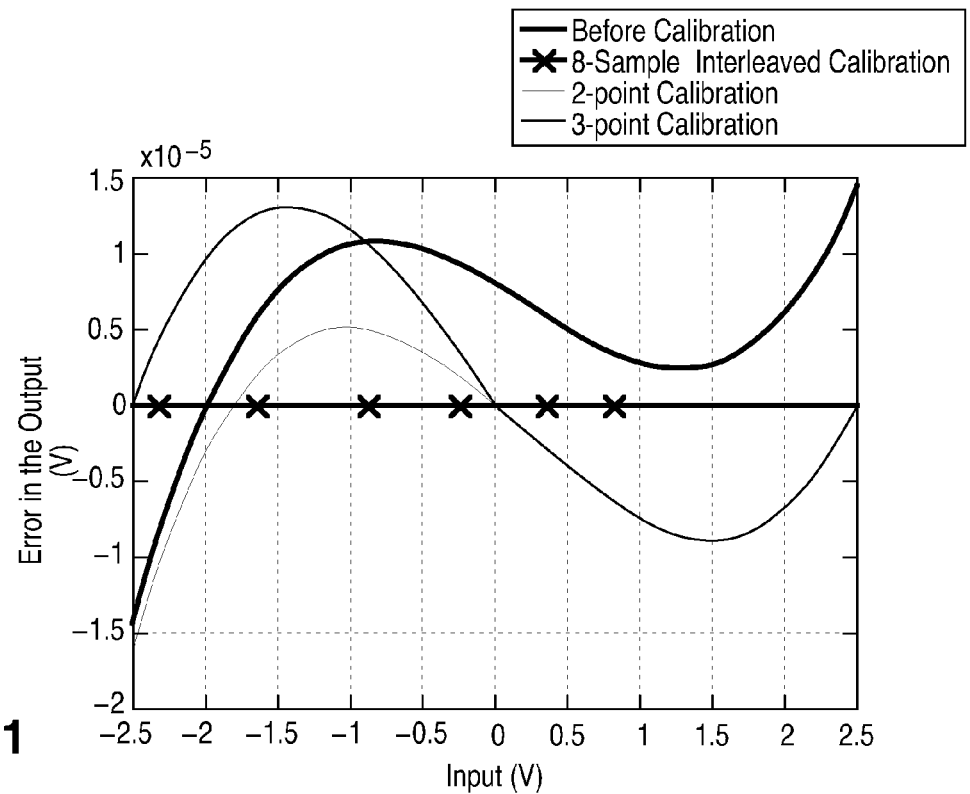
FIG. 21 is a plot of the analog input voltage vs. the error in the ADC output voltage for the case of before calibration, conventional 2-point calibration, conventional 3-point calibration and the 8-sample interleaved calibration method according to one embodiment of the present invention for the case when ADC transfer characteristics exhibit $2^{nd}$ order as well as $3^{rd}$ order nonlinearity error in addition to the offset and gain error.

FIG. 21 is a plot of the analog input voltage vs. the error in the ADC output voltage for the case of before calibration, conventional 2-point calibration, conventional 3-point calibration and the 8-sample interleaved calibration method according to one embodiment of the present invention for the case when ADC transfer characteristics exhibit $2^{nd}$ order as well as $3^{rd}$ order nonlinearity error in addition to the offset and gain error. Referring to FIG. 21, before any calibration is performed, the error in the output for the full-scale input is: approx. ±14.33 μV or approx. ±48 LSBs. After calibration is performed using the conventional 2-point calibration technique, the error in the output for the full-scale input is: approx. −14.07 μV or approx −47 LSBs. After calibration is performed using the conventional 3-point calibration technique, the error in the output for the full-scale input is: approx. +13.27 μV or approx 44 LSBs. However, when the 8-sample interleaved calibration method is used, the error in the output is zero for the entire input range.

Although the 8-sample interleaved calibration method provides the most desired error result, with all error in the output being completely eliminated, the computation involved using 8 input samples can be burdensome. In accordance with the third embodiment of the present invention, the 8-sample interleaved calibration method is optimized to a 5-sample interleaved calibration method where the error in the output is minimized and the computational burden is lessened. In the 8-sample scheme, sample number 5, 6, 7 and 8 were introduced to allow the offset to be calculated accurately at all the input levels x, (x−$\Delta_x$), (x−2$\Delta_x$) and (x−3$\Delta_x$) as shown in Eq. (52). Estimating offset at all of the 4 input levels helps in completely removing the $2^{nd}$ order nonlinearity from all the output samples.

To reduce the number of input samples used, the calibration method is performed using offset estimate only at one input level for all the samples. Accordingly, either one of OE$_1$, OE$_2$, OE$_3$ or OE$_4$ can be used for offset calibration of all the samples. By selecting only one offset estimate to use, the calibration method can then be optimized to just 5 input samples. When only one offset estimate is used, the $2^{nd}$ order nonlinearity error is not completely removed. However, careful selection of the offset estimate for use with all samples would ensure that the residual nonlinearity error in the calibrated output codes is minimized across the entire input range.

In one embodiment, the input sequence for the 5-sample interleaved calibration method is as follows:

$$x[1] = x_0$$

$$x[2] = x_0 - \Delta_x$$

$$x[3] = x_0 - 2\Delta_x$$

$$x[4] = x_0 - 3\Delta_x$$

$$x[5] = -(x_0 - 2\Delta_x) \quad \text{Eq. (62)}$$

The corresponding output samples of the ADC are given as:

$$y[1] = a_0 + a_1 x_0 + a_2 x_0^2 + a_3 x_0^3$$

$$y[2] = a_0 + a_1(x_0 - \Delta_x) + a_2(x_0 - \Delta_x)^2 + a_3(x_0 - \Delta_x)^3$$

$$y[3] = a_0 + a_1(x_0 - 2\Delta_x) + a_2(x_0 - 2\Delta_x)^2 + a_3(x_0 - 2\Delta_x)^3$$

$$y[4] = a_0 + a_1(x_0 - 3\Delta_x) + a_2(x_0 - 3\Delta_x)^2 + a_3(x_0 - 3\Delta_x)^3$$

$$y[5] = a_0 - a_1(x_0 - 2\Delta_x) + a_2(x_0 - 2\Delta_x)^2 - a_3(x_0 - 2\Delta_x)^3 \quad \text{Eq. (63)}$$

A single estimate of offset is taken as:

$$OE = \frac{y[3] + y[5]}{2} = a_0 + a_2(x_0 - 2\Delta_x)^2. \quad \text{Eq. (64)}$$

The offset calibrated output codes are written as:

$$y_{oc}[5] = y[5] - OE = -a_1(x_0 - 2\Delta_x) - a_3(x_0 - 2\Delta_x)^3$$

$$y_{oc}[6] = y[6] - OE = a_1 x_0 - a_2(4\Delta_x^2 - 4x_0\Delta_x) + a_3 x_0^3$$

$$y_{oc}[7] = y[7] - OE = a_1(x_0 - \Delta_x) - a_2(3\Delta_x^2 - 2x_0\Delta_x) + a_3(x_0 - \Delta_x)^3$$

$$y_{oc}[8] = y[8] - OE = a_1(x_0 - 2\Delta_x) + a_3(x_0 - 2\Delta_x)^3$$

$$y_{oc}[9] = y[9] - OE = a_1(x_0 - 3\Delta_x) + a_2(5\Delta_x^2 - 2x_0\Delta_x) + a_3(x_0 - 3\Delta_x)^3 \quad \text{Eq. (65)}$$

In Eq. (65), the $2^{nd}$ order non-linearity does not get cancelled completely. Now, the offset calibrated output codes in Eq. (65) are used to estimate the $3^{rd}$ order non-linearity coefficient $a_3$ as follows:

$$dy_1 = y_{oc}[6] - y_{oc}[7] = a_1\Delta_x - a_2(\Delta_x^2 - 2x_0\Delta_x) + a_3\Delta_x(3x_0^2 + \Delta_x^2 - 3x_0\Delta_x)$$

$$dy_2 = y_{oc}[7] - y_{oc}[8] = a_1\Delta_x - a_2(3\Delta_x^2 - 2x_0\Delta_x) + a_3\Delta_x(3x_0^2 + 7\Delta_x^2 - 9x_0\Delta_x)$$

$$dy_3 = y_{oc}[8] - y_{oc}[9] = a_1\Delta_x - a_2(5\Delta_x^2 - 2x_0\Delta_x) + a_3\Delta_x(3x_0^3 + 19\Delta_x^2 - 15x_0\Delta_x) \quad \text{Eq. (66)}$$

Taking the difference again, $$d^2 y_1 = dy_1 - dy_2 = 2a_2\Delta^2 + 6a_3\Delta_x^2(x_0 - \Delta_x)$$

$$d^2 y_2 = dy_2 - dy_3 = 2a_2\Delta_x^2 + 6a_3\Delta_x^2(x_0 - 2\Delta_x)$$

$$\Rightarrow d^3 y = d^2 y_1 - d^2 y_2 = 6a_3\Delta_x^3 \quad \text{Eq. (67)}$$

The $3^{rd}$ order non-linearity error is estimated as follows:

$$\Rightarrow \frac{d^3 y}{6}\left(\frac{d^2 y_1}{d^3 y}\right)^3 = a_3[(x_0 - \Delta_x) + q]^3 \text{ where, } q = \frac{a_2}{3a_3} \quad \text{Eq. (68)}$$

$$\frac{d^3 y}{6}\left(\frac{d^2 y_1}{d^3 y} + 1\right)^3 = a_3[x_0 + q]^3$$

$$\frac{d^3 y}{6}\left(\frac{d^2 y_1}{d^3 y} - 1\right)^3 = a_3[(x_0 - 2\Delta_x) + q]^3$$

$$\frac{d^3 y}{6}\left(\frac{d^2 y_1}{d^3 y} - 2\right)^3 = a_3[(x_0 - 3\Delta_x) + q]^3$$

Error in the estimate of the cubic factor results in a residual error in the non-linearity calibrated codes given below as:

$$y_{nlc}[11] = y_{oc}[11] - \frac{d^3 y}{6}\left(\frac{d^2 y_1}{d^3 y} + 1\right)^3 \quad \text{Eq. (69)}$$

$$= a_1 x_0 - a_2\Delta_x(4\Delta_x - 4x_0) - a_3[q^3 + 3qx_0^2 + 3q^2 x_0]$$

$$y_{nlc}[12] = y_{oc}[12] - \frac{d^3 y}{6}\left(\frac{d^2 y_1}{d^3 y}\right)^3$$

$$= a_1(x_0 - \Delta_x) - a_2\Delta_x(3\Delta_x - 2x_0) - a_3[q^3 + 3q(x_0 - \Delta_x)^2 + 3q^2(x_0 - \Delta_x)]$$

Using these samples, gain is estimated as, $$A_e = \frac{y_{nlc}[11] - y_{nlc}[12]}{D\{\Delta_x\}} \quad \text{Eq. (70)}$$

$$= \underbrace{a_1 - a_2(\Delta_x - 2x_0) - a_3[3q(2x_0 - \Delta_x) + 3q^2]}_{\text{Error in Gain Estimation}}$$

Using the gain estimate in Eq. (70), the fully calibrated $12^{th}$ sample is given as:

$$y_{calib}[12] = \quad \text{Eq. (71)}$$

$$\frac{y_{nlc}[12]}{A_e} = \frac{a_1 x_0 - a_2\Delta_x(4\Delta_x - 2x_0) - a_3[q^3 + 3qx_0^2 + 3q^2 x_0]}{a_1 - a_2(\Delta_x - 2x_0) - a_3[3q(2x_0 - \Delta_x) + 3q^2]}$$

The error in the calibrated $12^{th}$ output code is given as:

$$\text{Err}[12] = \frac{a_2(-4\Delta_x^2 + 5x_0\Delta_x - 2x_0^2) - a_3[q^3 - 3qx_0(x_0 - \Delta_x)]}{a_1 - a_2(\Delta_x - 2x_0) - a_3[3_q(2x_0 - \Delta_x) + 3q^2]} \quad \text{Eq. (72)}$$

The calculation of the calibrated output code and the error (Eqs. (71) and (72)) is shown here for the $12^{th}$ sample. However, the expression for the calibrated output code and error in the calibrated output remains the same for other samples as well.

Simulation using MATLAB was performed for a 24-bit ADC ($V_{ref} = 2.5$ V) with the following transfer characteristics including 3rd order polynomial:

$$y = 8e-06 + 0.9999943x - 1.29e-06x^2 + 1.83e-06x^3 \quad \text{Eq. (73)}$$

Figure 22:
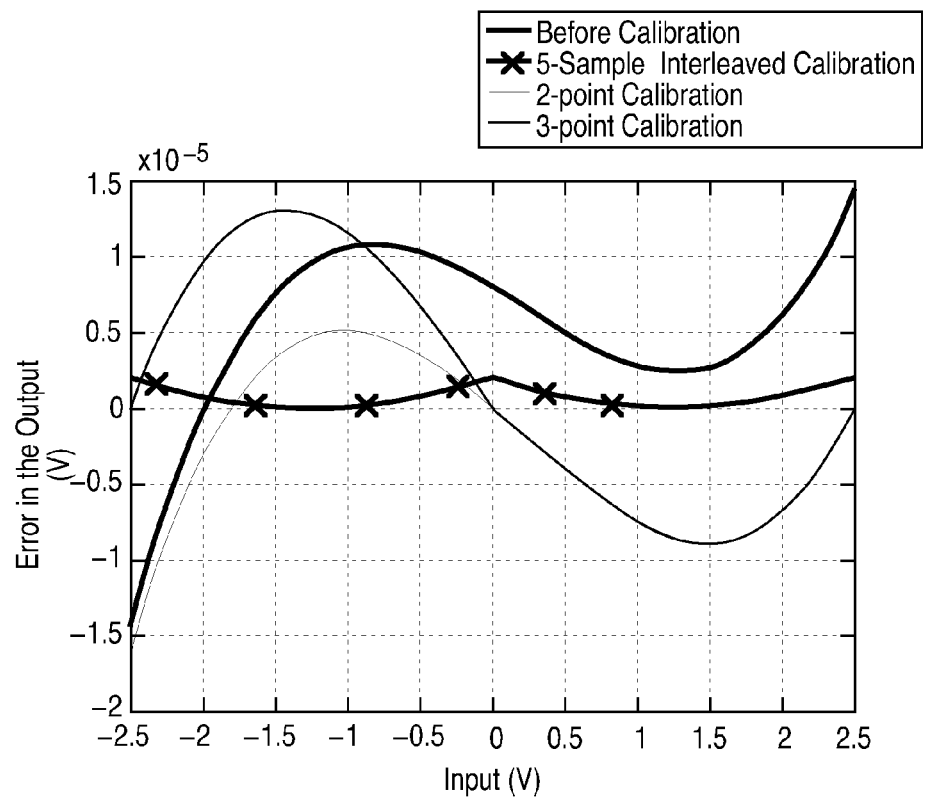
FIG. 22 is a plot of the analog input voltage vs. the error in the ADC output voltage for the case of before calibration, conventional 2-point calibration, conventional 3-point calibration and the 5-sample interleaved calibration method according to one embodiment of the present invention for the case when the ADC transfer characteristics exhibit $2^{nd}$ order as well as $3^{rd}$ order nonlinearity error in addition to the offset and gain error.

FIG. 22 is a plot of the analog input voltage vs. the error in the ADC output voltage for the case of before calibration, conventional 2-point calibration, conventional 3-point calibration and the 5-sample interleaved calibration method according to one embodiment of the present invention for the case when the ADC transfer characteristics exhibit $2^{nd}$ order as well as $3^{rd}$ order nonlinearity error in addition to the offset and gain error. Referring to FIG. 22, before any calibration is performed, the error in the output for the full-scale input is: approx. ±14.7 µV or approx. ±48 LSBs. After calibration is performed using the conventional 2-point calibration technique, the error in the output for the full-scale input is: approx. −14.07 µV or approx −47 LSBs. After calibration is performed using the conventional 3-point calibration technique, the error in the output for the full-scale input is: approx. +13.27 µV or approx 44 LSBs. When the 5-sample interleaved calibration method is used, the error in the output is limited to approx. 2.046 µV or about 6 LSBs. As can be observed from FIG. 22, the residual error of the 5-sample interleaved calibration method is symmetrical about 0V input voltage and is minimized over the entire input voltage range.

As described above, in an alternate embodiment, the 5 input samples used in the 5-sample interleaved calibration method are given as:

5-Sample Calibration—

$x[1]=x_0$, $x[2]=x_0 \pm \Delta_x$, $x[3]=x_0 \pm 2\Delta_x$, $x[4]=-(x_0 \pm 2\Delta_x)$, and $x[5]=x_0 \pm 3\Delta_x$. Eq. (74)

The first input sample is unmodified, the second input sample has the incremental amount $\Delta_x$ introduced, the third input sample has twice the incremental amount $\Delta_x$ introduced, the fourth input sample is the third input sample with polarity reversed and the fifth input sample is the third input sample with an additional incremental amount $\Delta_x$ introduced, for a total of 3 times the incremental amount $\Delta_x$ introduced.

Implementation

Figure 23:
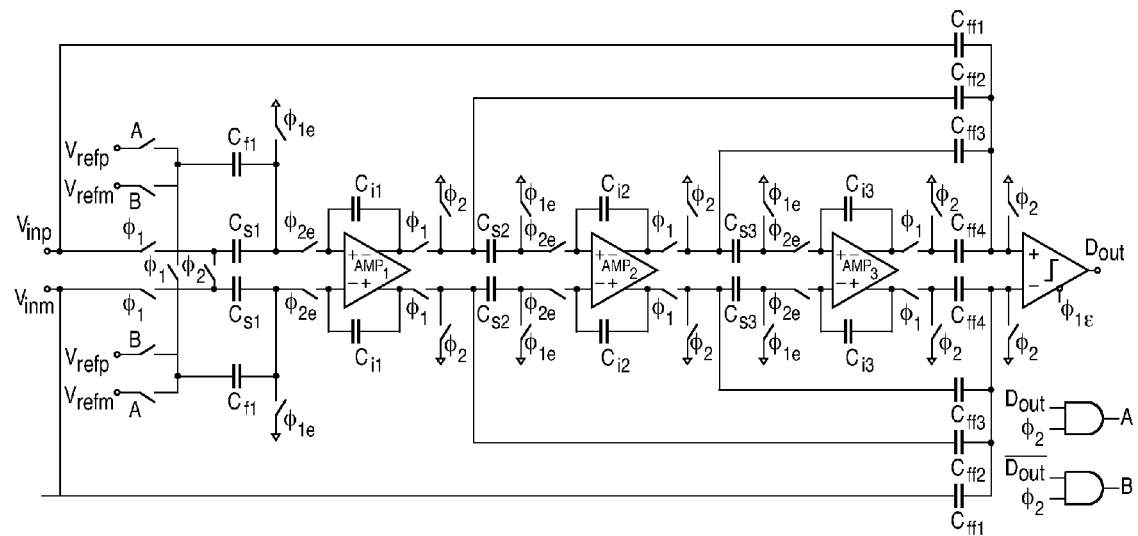
FIG. 23 is a schematic diagram of a conventional $3^{rd}$ order $\Sigma\Delta$ modulator.
Figure 24:
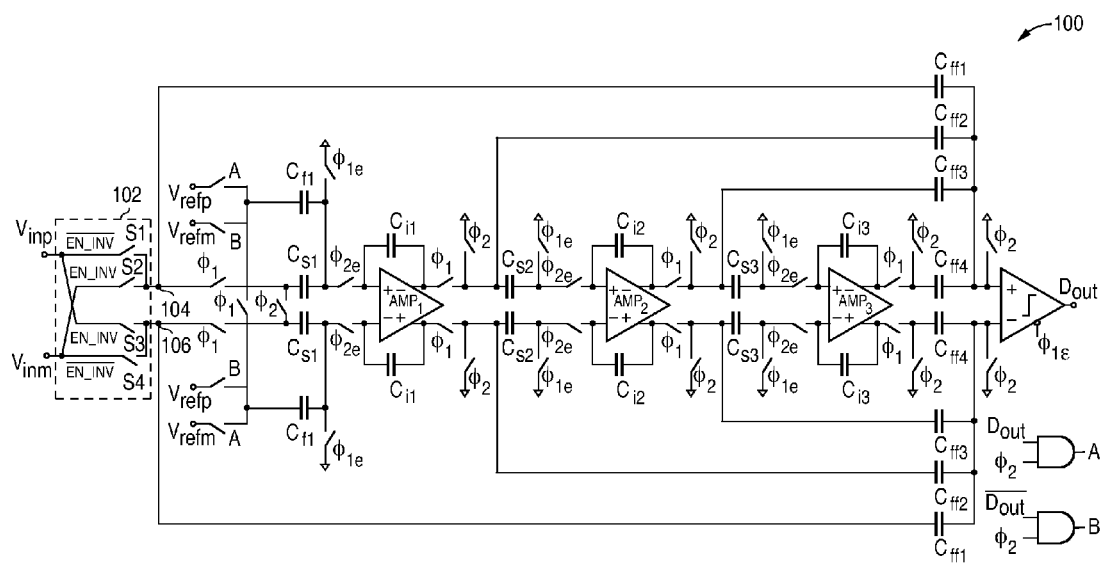
FIG. 24 is a schematic diagram of a $3^{rd}$ order $\Sigma\Delta$ modulator configured for implementing the offset estimation method in the background calibration method of the present invention.

FIG. 23 is a schematic diagram of a conventional $3^{rd}$ order ΣΔ modulator. In one embodiment, the conventional $3^{rd}$ order ΣΔ modulator is modified to implement the background calibration method for offset and gain error estimation in accordance with the present invention. FIG. 24 is a schematic diagram of a $3^{rd}$ order ΣΔ modulator configured for implementing the offset estimation method in the background calibration method of the present invention. For offset estimation, the polarity of certain input samples to the ADC is reversed. In a modulator using a completely differential architecture, the polarity inversion is implemented by interchanging the differential inputs of the ADC. In the conventional modulator, the differential input signals Vinm and Vinp are provided to the sample capacitors $C_{s1}$ directly. However, referring to FIG. 24, modulator 100 includes an input switching circuit 102 coupled to receive the differential input signals $V_{inm}$ and $V_{inp}$ and connect the differential input signals to the sampling capacitors $C_{s1}$. Switches S1 and S3 connect the positive input Vinp to the first input node 104 and the second input node 106, respectively. Switches S2 and S4 connect the negative input Vinm to the first input node 104 and the second input node 106, respectively. The control signal EN_INV is activated to enable input polarity inversion.

For implementing gain error estimation, the incremental value $\Delta_x$ is introduced to the ADC. In most cases, it is important that the incremental value $\Delta_x$ be very accurate. In accordance with the present invention, the incremental value $\Delta_x$ is chosen to be a ratio of the reference voltage so that high accuracy is achieved. As can be observed in the conventional modulator of FIG. 23, the ADC input is directly connected to the first integrator of the modulator and is also fed-forward to the comparator. Output of the first integrator is given as, $$V_{o1} = \left(\frac{z^{-1}}{1-z^{-1}}\right)\frac{C_{s1}}{C_{i1}}V_{in} - \left(\frac{1}{1-z^{-1}}\right)\frac{C_{f1}}{C_{i1}}V_{FB}, (V_{FB} = V_{refp}/V_{refm})$$ Eq. (75)

$$\Rightarrow V_{o1} = \left(\frac{1}{1-z^{-1}}\right)\frac{C_{f1}}{C_{i1}}\left[z^{-1}\frac{C_{s1}}{C_{f1}}V_{in} - V_{FB}\right]$$

Here, the ratio of the capacitors $C_{s1}$ and $C_{f1}$ defines the gain of the ADC. So, these two capacitors should be matched to each other in order to minimize gain error of the ADC. Conventional capacitor matching techniques can be applied to ensure matching of the two capacitors. In an alternate embodiment of the present invention, the capacitor units used for capacitor $C_{s1}$ and capacitor $C_{f1}$ are rotated in a circular manner to improve the matching of capacitors $C_{s1}$ and $C_{f1}$. The capacitor units forming capacitors $C_{s1}$ and $C_{f1}$ are typically laid out in an array. Better matching of the two capacitors is achieved by rotating the capacitor units in a circular manner in accordance with a Capacitor Rotation scheme described in concurrently filed and commonly assigned U.S. patent application entitled "Capacitor Rotation Scheme For Removing Gain Error in Sigma-Delta Analog-to-Digital Converters," of the same inventors hereof, which patent application is incorporated herein by reference in its entirety.

Figure 25B:
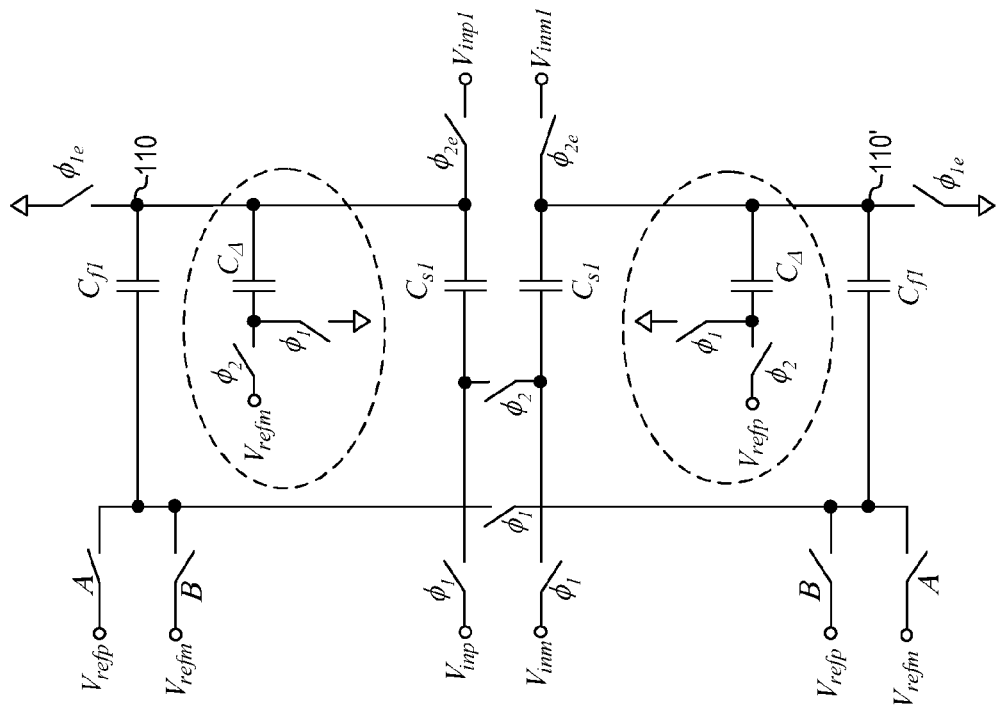
FIG. 25(b) is a circuit diagram of a portion of a modulator circuit at the input of the first integrator modified for gain error estimation according to one embodiment of the present invention.
Figure 25A:
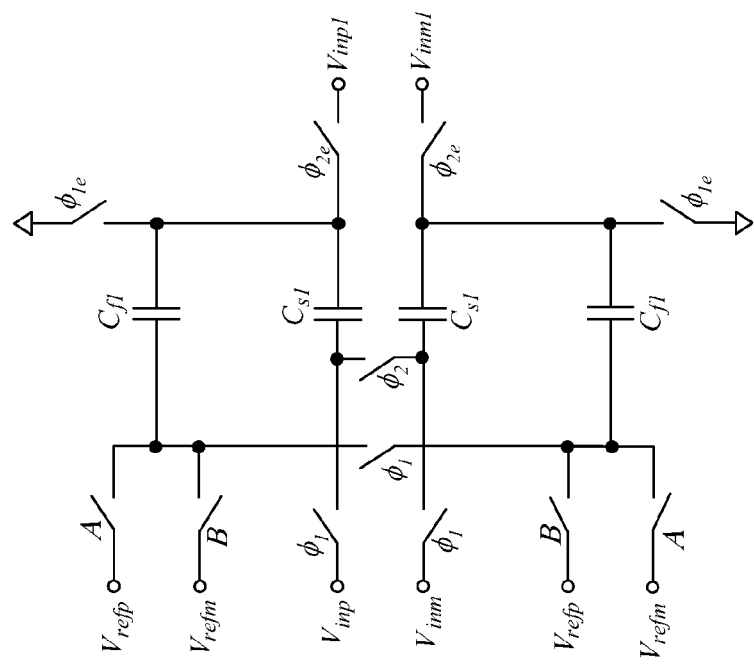
FIG. 25(a) is a circuit diagram of a portion of the conventional modulator circuit at the input of the first integrator.

According to one embodiment of the present invention, the incremental amount $\Delta_x$ is introduced to the analog input signal through an additional capacitor $C_\Delta$. FIG. 25(a) is a circuit diagram of a portion of the conventional modulator circuit at the input of the first integrator. FIG. 25(b) is a circuit diagram of a portion of a modulator circuit at the input of the first integrator modified for gain error estimation according to one embodiment of the present invention. A capacitor $C_{66}$ is added to the common node 110 and 110' of capacitors $C_{s1}$ and $C_{f1}$ in the differential signal path. Capacitor $C_\Delta$ is precharged to the reference voltage $V_{refp}$ or $V_{refm}$ during φ2 (the hold phase of the modulator) and is discharged to the ground voltage during $φ_1$ (the sample phase of the modulator). Coupling capacitor $C_\Delta$ to nodes 110 and 110' has the effect of adding a voltage of $$\Delta_x = \frac{C_\Delta}{C_{f1}}V_{ref},$$

being a ratio of the reference voltage, to the input of the integrator.

The output of the modified integrator is expressed as:

$$\Rightarrow V_{o1} = \left(\frac{1}{1-z^{-1}}\right)\frac{C_{f1}}{C_{i1}}\left[z^{-1}\frac{C_{s1}}{C_{f1}}V_{in} - V_{FB} + \frac{C_\Delta}{C_{f1}}V_{ref}\right],$$ Eq. (76)

$(V_{ref} = V_{refp} - V_{refm})$

The incremental amount $\Delta_x$ can be subtracted from the input by reversing the polarity of reference voltages charging the capacitor $C_\Delta$. In another embodiment, capacitor $C_\Delta$ is also rotated along with capacitors $C_{s1}$, $C_{f1}$ using the aforementioned Capacitor Rotation Scheme to obtain the desired capacitor matching accuracy.

Figure 26B:
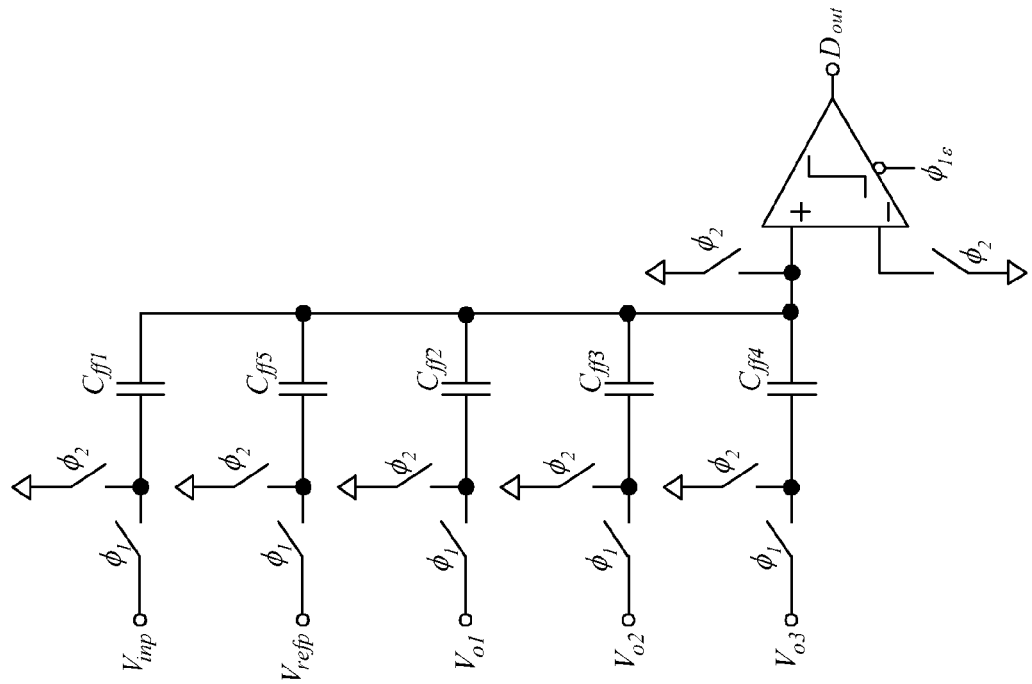
FIG. 26(b) illustrates a single-ended representation of the feedforward path from the inputs/outputs of all the integrators to the comparator in the modified modulator circuit for gain error estimation.
Figure 26A:
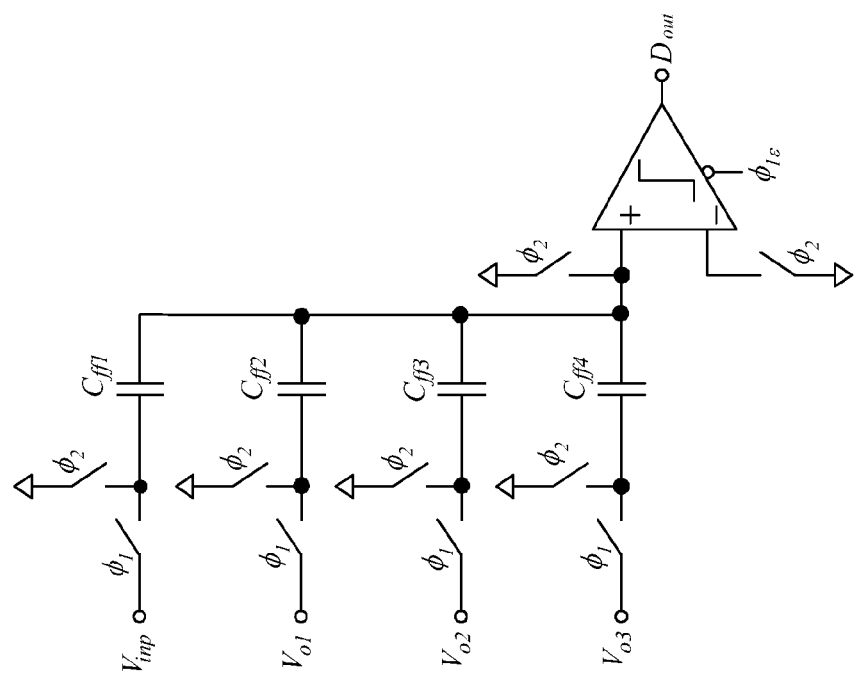
FIG. 26(a) illustrates a single-ended representation of the feedforward path from the inputs/outputs of all the integrators to the comparator in the conventional modulator circuit.

In the $3^{rd}$ order modulator architecture (CIFF) shown here, the input signals of the modulator is fed forward to feedback capacitors $C_{f1}$ to $C_{f4}$ (see FIG. 23). Therefore, the incremental amount $\Delta_x$ should also be added in the feedforward path using a capacitor $C_{f5}$. FIG. 26(a) illustrates a single-ended representation of the feedforward path from the inputs/outputs of all the integrators to the comparator in the conventional modulator circuit. FIG. 26(b) illustrates a single-ended representation of the feedforward path from the inputs/outputs of all the integrators to the comparator in the modified modulator circuit for gain error estimation. Voltage $V_{inp}$ is the positive input to the ADC and voltages $V_{o1}$, $V_{o2}$ and $V_{o3}$ are the outputs of the $1^{st}$, $2^{nd}$ and $3^{rd}$ integrator respectively. In the modified circuit, a capacitor $C_{ff5}$ is added in parallel with the other feedforward capacitors $C_{ff1}$ to $C_{ff4}$. Capacitor $C_{ff5}$ is charged to the reference voltage $V_{refp}$ during $\phi_1$ (the sample phase of the modulator) and discharged to ground during $\phi_2$ (the bold phase of the modulator).

From charge conservation, equating the total charge at the positive input summing node of the comparator during $\phi_1$ and $\phi_2$ results in:

$$C_{ff1}V_{in} + C_{ff2}V_{o1} + C_{ff3}V_{o2} + C_{ff4}V_{o3} + C_{ff5}V_{ref} = 0 \quad \text{Eq. (77)}$$

$$\Rightarrow V_{in} + V_{o1}\frac{C_{ff2}}{C_{ff1}} + V_{o2}\frac{C_{ff3}}{C_{ff1}} + V_{o3}\frac{C_{ff4}}{C_{ff1}} + V_{ref}\frac{C_{ff5}}{C_{ff1}} = 0$$

$$\Rightarrow \Delta_x = \frac{C_{ff5}}{C_{ff1}}V_{ref}$$

The capacitance value of capacitor $C_{ff5}$ is chosen such that the same value of $\Delta_x$ is added in the feed-forward network as added to the input of the first integrator, that is:

$$\Delta_x = \left(\frac{C_{ff5}}{C_{ff1}}\right)V_{ref} = \left(\frac{C_\Delta}{C_{f1}}\right)V_{ref} \quad \text{Eq. (78)}$$

Figure 27:
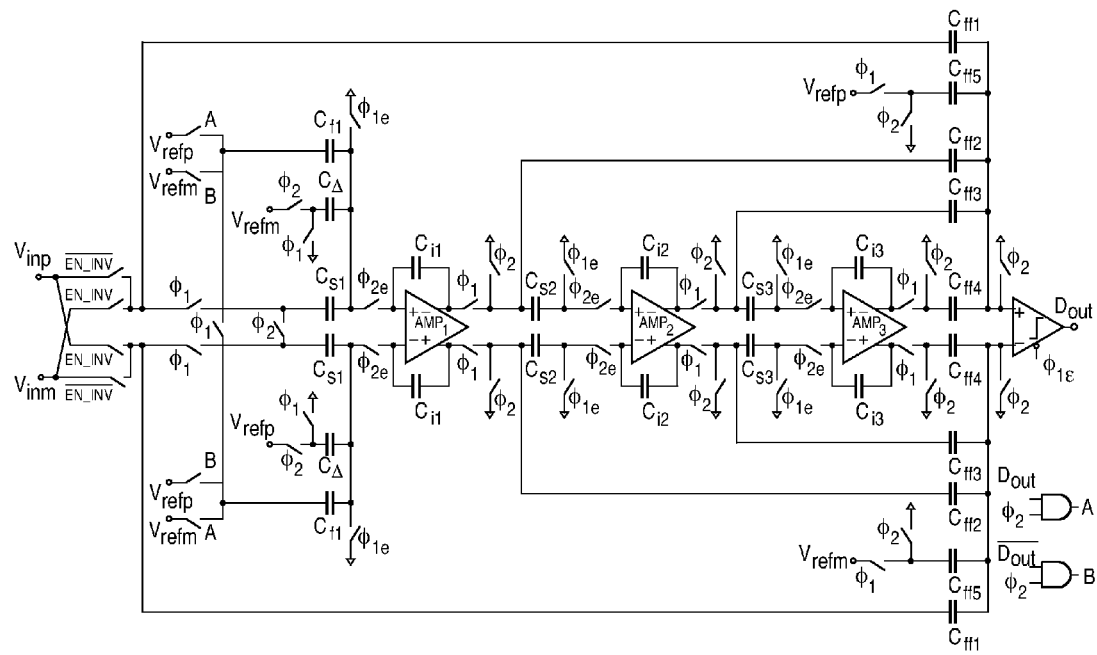
FIG. 27 illustrates the complete circuit for implementing offset and gain error estimation in a $3^{rd}$ order $\Sigma\Delta$ modulator according to one embodiment of the present invention.

To subtract the incremental amount $\Delta_x$, the polarity of the reference voltage is reversed. FIG. 27 illustrates the complete circuit for implementing offset and gain error estimation in a $3^{rd}$ order $\Sigma\Delta$ modulator according to one embodiment of the present invention.

Gain Estimation for Higher Modulator Gain Settings

Modulator can be programmed for higher gain settings by changing the ratio of capacitors $C_{s1}$ to $C_{f1}$. Accordingly, the ratio of capacitors $C_\Delta$ to $C_{f1}$ also changes as capacitor $C_{66}$ is a fixed value capacitor. However, the value of the incremental amount $\Delta_x$ should remain the same for all modulator gain settings to achieve the desired accuracy of estimation. In one embodiment, the incremental amount $\Delta_x$ is held to the same value by varying the duty cycle at which the incremental amount $\Delta_x$ is added to/subtracted from the input of the first integrator as shown in Table 1. Table 1 provides the duty cycle for use in adding/subtracting incremental amount $\Delta_x$ across various modulator gain settings from 0.5 to 4.

TABLE 1

| Modulator Gain, G | $C_{s1}$ (Units) | $C_{f1}$ (Units) | $C_\Delta/C_{f1}$ | Duty Cycle (%) | Effective $C_\Delta/C_{f1}$ (Differential) |
|---|---|---|---|---|---|
| 0.5 | 8 | 16 | 1/8 | 100 | 1/4 |
| 1 | 12 | 12 | 1/6 | 75 | 1/4 |
| 2 | 16 | 8 | 1/4 | 50 | 1/4 |
| 4 | 20 | 5 | 2/5 | 31.25 | 1/4 |

By varying the duty cycle as shown in Table 1, effectively, incremental amount $\Delta_x = V_{ref}/4$ (differential) is added with the input for all modulator gain settings. Similarly, incremental amount $\Delta_x$ added in the feedforward path will also remain constant across all modulator gain settings. When the modulator gain G is programmable, then Eq. (77) takes the following form:

$$G\left(V_{in} + V_{o1}\frac{C_{ff2}}{C_{ff1}} + V_{o2}\frac{C_{ff3}}{C_{ff1}} + V_{o3}\frac{C_{ff4}}{C_{ff1}} + V_{ref}\frac{C_{ff5}}{C_{ff1}}\right) = 0 \quad \text{Eq. (79)}$$

$$\Rightarrow \Delta_x = G \cdot \left(\frac{C_{ff5}}{C_{ff1}}\right)V_{ref}$$

Values of capacitors $C_{ff1}$ and $C_{ff5}$ across the modulator gain settings are shown in Table 2. Table 2 provides the capacitor units for capacitors $C_{ff1}$ and $C_{ff5}$ in the feedforward path across the modulator gain settings

TABLE 2

| Modulator Gain, G | $C_{ff5}$ (Units) | $C_{ff1}$ (Units) | $G \cdot \frac{C_{ff5}}{C_{ff1}}$ | Effective $G \cdot \frac{C_{ff5}}{C_{ff1}}$ (Differential) |
|---|---|---|---|---|
| 0.5 | 2 | 8 | 1/8 | 1/4 |
| 1 | 2 | 16 | 1/8 | 1/4 |
| 2 | 2 | 32 | 1/8 | 1/4 |
| 4 | 2 | 64 | 1/8 | 1/4 |

Accordingly, by design, $$G \cdot \left(\frac{C_{ff5}}{C_{ff1}}\right)V_{ref}$$

remains constant for all modulator gain settings and no duty cycle adjustment is required in the feedforward network.

Digital Control Signals

Figure 28:
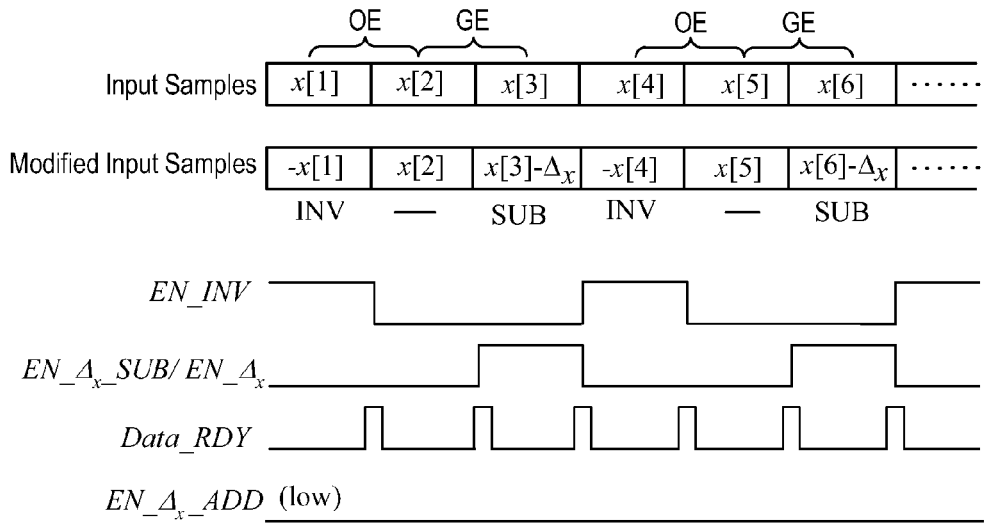
FIG. 28 illustrates the digital control signals for implementing the 3-sample interleaved calibration method for a default modulator gain setting of 0.5 according to one embodiment of the present invention.

In the modulator circuit implementing the background calibration method of the present invention, a digital control logic circuit generates the required control signals for the modulator and digital post-processing for the calibration of the digital output codes. In one embodiment, digital control signals for implementing the 3-sample interleaved calibration method described above for a default modulator gain setting of 0.5 are shown in FIG. 28. The control signals shown in FIG. 28 are for a positive input and default modulator gain setting of 0.5. The sign of the input signal is determined using the digital output code corresponding to the first input sample. With the knowledge of sign of the input signal, appropriate control signals (EN_$\Delta_x$_ADD/EN_$\Delta_x$_SUB) can be generated for the third input sample in order to add/subtract $\Delta_x$. A data ready signal (Data_RDY) becomes 'high' when the calibrated data is ready for the user.

Figure 29:
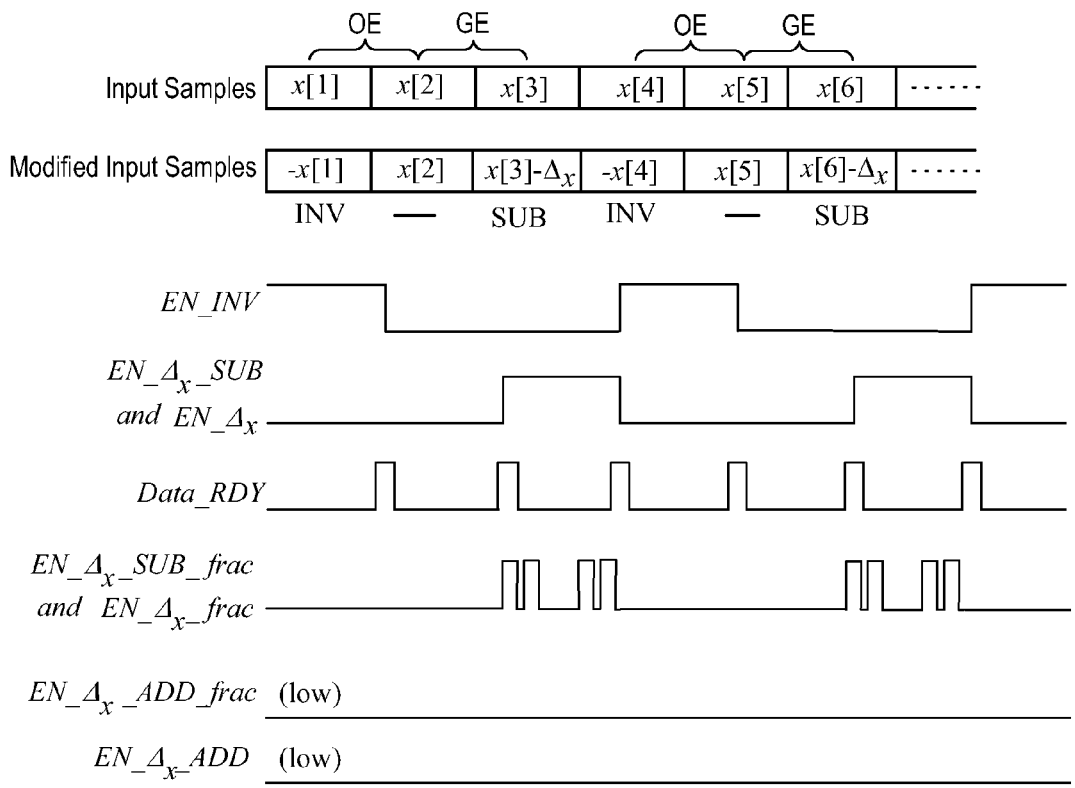
FIG. 29 illustrates the control signals for a modulator gain setting of 1 and duty cycle of 75% according to one embodiment of the present invention.

As discussed above, for higher modulator gain settings, the duty cycle of adding/subtracting $\Delta_x$ with the input needs to be changed. Therefore, additional control signals EN_$\Delta_x$_ADD_frac/EN_$\Delta_x$_SUB_frac are generated which are used to control switches for capacitor $C_\Delta$. It should be noted that the switching rate for these control signals should be kept low so that additional noise does not become injected into the modulator. Table 3 illustrates the ON/OFF clock cycle durations for different modulator gain settings according to one embodiment of the present invention. The control signals for a modulator gain setting of 1 and duty cycle of 75% are shown in FIG. 29 for illustration.

TABLE 3

| Modulator Gain, G | Duty Cycle (%) | ON/OFF clock cycles |
|---|---|---|
| 0.5 | 100 | ON for all 1024 clock cycles |
| 1 | 75 | 192 ON & 64 OFF clock cycles |
| 2 | 50 | 128 ON & 128 OFF clock cycles |
| 4 | 31.25 | 80 ON & 176 OFF clock cycles |

Control Signals for rotating $C_{66}$ capacitor

As discussed above, a Capacitor Rotation scheme can be used to rotate the capacitor units used for capacitor $C_s$, $C_f$ and $C_A$ to ensure better matching of the capacitance values. The details of the capacitor rotation scheme is described in the aforementioned patent application entitled "Capacitor Rotation Scheme For Removing Gain Error in Sigma-Delta Analog-to-Digital Converters" and will not be discussed in detail here. In brief, an additional set of control signals is required to control the switching of capacitors in a capacitor array to be used as capacitors $C_s$, $C_f$ or $C_A$. In one embodiment, the total number of capacitor pairs used for rotation is 13. Therefore, the control logic provides 13 select lines SL[12:0]. When a select line is 'high', the associated capacitor becomes capacitor $C_s$. Similarly, when a select line is 'low', the associated capacitor can be used as capacitor $C_f$ or $C_A$. To differentiate between capacitors $C_f$ or $C_A$, 4 additional lines LC[3:0] are provided from the digital control logic. These lines are decoded using a decoder as SD[12:0] and represent the location index for capacitor $C_A$. Table 4 illustrates the control signals for rotating the 13 capacitor pairs in the array. In Table 4, the modulator gain setting is 0.5, and capacitor $C_s$ uses 4 pairs of capacitor units, capacitor $C_f$ uses 8 pairs and capacitor $C_A$ uses 1 pair. The rotation cycle progresses as shown in Table 4 below

TABLE 4

| | SL[12:0] | LC[3:0] |
|---|---|---|
| Rotation Cycle 1 | 0 10101010 0000 | 1100 ($C_A$ is at $12^{th}$ position) |
| Rotation Cycle 2 | 00 10101010 000 | 1011 ($C_A$ is at $11^{th}$ position) |
| Rotation Cycle 3 | 000 10101010 00 | 1010 ($C_A$ is at $10^{th}$ position) |
| Rotation Cycle 4 | 0000 10101010 0 | 1001 ($C_A$ is at $9^{th}$ position) |

Figure 30A:
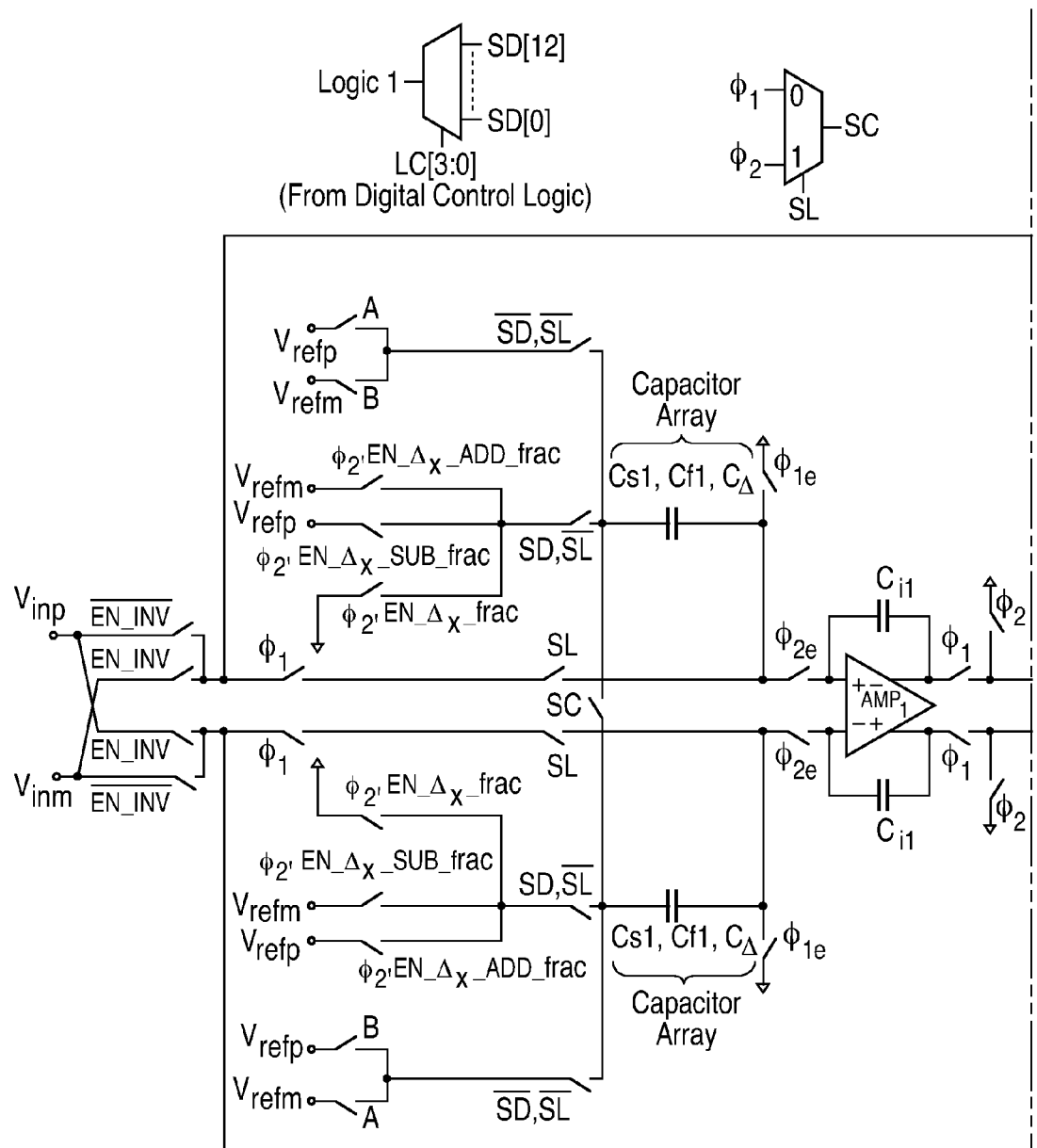
FIGS. 30A and 30B, illustrates the complete circuit including control signals for higher modulator gain setting, implementing offset and gain error estimation in a $3^{rd}$ order $\Sigma\Delta$ modulator according to one embodiment of the present invention.
Figure 30B:
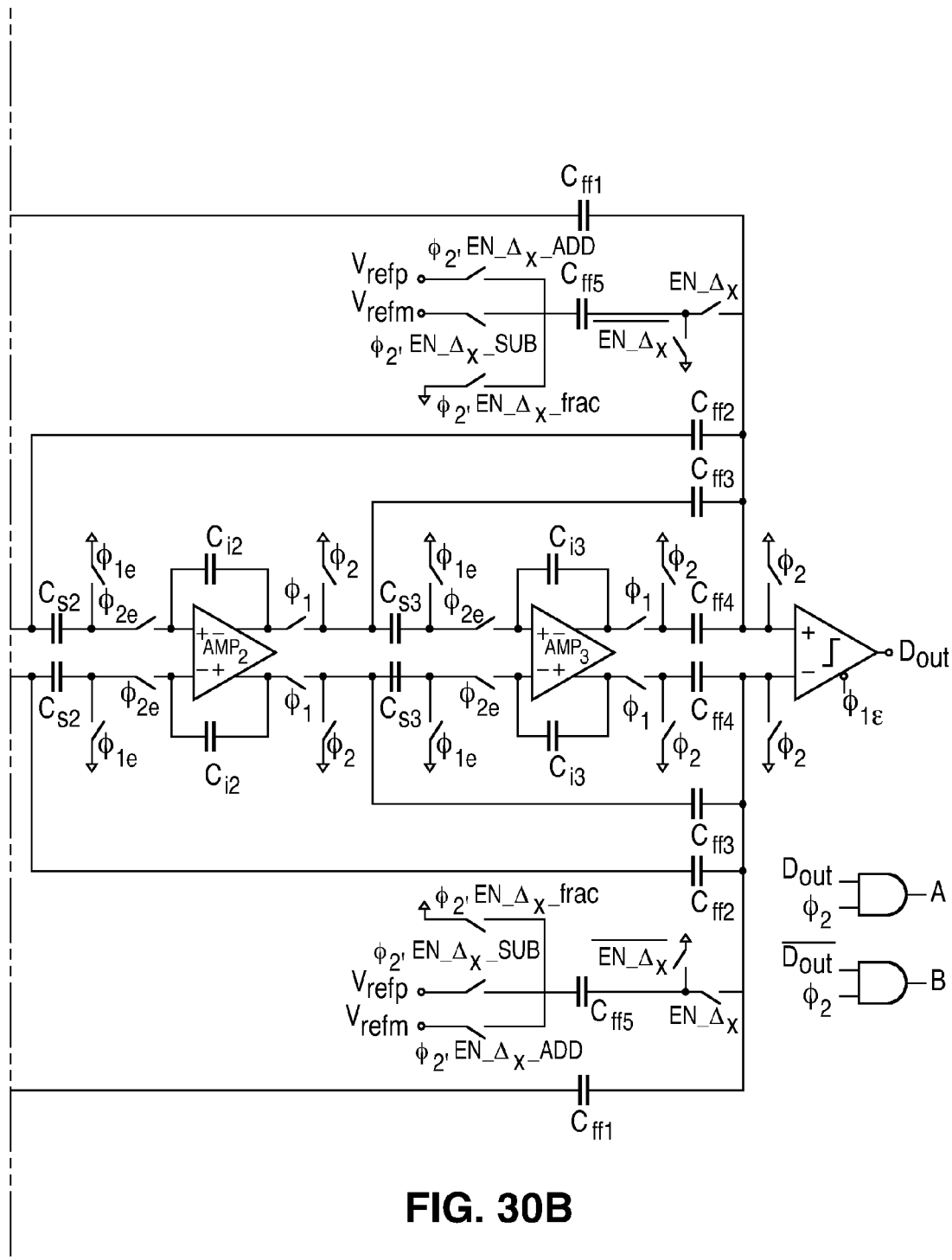

FIG. 30, including FIGS. 30A and 30B, illustrates the complete circuit including control signals for higher modulator gain setting, implementing offset and gain error estimation in a $3^{rd}$ order ΣΔ modulator according to one embodiment of the present invention.

Digital Calibration

When the background calibration method of the present invention is applied for offset and gain error calibration, the calibrated digital output codes of the ADC is given as follows (assuming for input sample number 5 but applicable for any input sample):

$$y_{calib}[5] = (y'[5] - c)\left(\frac{A}{A_e}\right) \quad \text{Eq. (80)}$$

In Eq. (80), the variables on the right hand side are known in digital format so that the calibrated output code can be calculated in the digital domain. The calibration requires a subtraction, a multiplication and a division. Subtraction of the offset value c from y'[5] can be easily performed in digital domain. Also, ideal gain A of the ADC is desired to be unity.

So, multiplication by A virtually needs no processing. Division by the actual gain $A_e$ is the most complex processing step, which demands a lot of power and area in order to provide high accuracy.

As discussed above, the actual gain $A_e$ can also be calculated as:

$$A_e = \frac{|y'[3] - y'[2]|}{D\{\Delta_x\}} = \frac{\Delta_y}{D\{\Delta_x\}}, \quad \text{Eq. (81)}$$

where, $D\{\Delta_x\}$ is the digital equivalent of $\Delta_x$. For an ideal ADC, $\Delta_y$ should be equal to $D\{\Delta_x\}$, that is, $\Delta_y$ should be equal to the difference in the corresponding input samples. However, when the ADC exhibits gain error, the value $\Delta_y$ can be expressed as:

$$\Delta_y = D\{\Delta_x\} + \epsilon \quad \text{Eq. (82)}$$

where $\epsilon$ is the error caused due to the gain error of the converter. Note that $\epsilon$ can be a positive or negative quantity based on the sign of the gain error. Using the above assumptions, Eq. (80) can be rewritten as:

$$y_{calib}[5] = (y'[5] - c)\left(\frac{D\{\Delta_x\}}{D\{\Delta_x\} + \varepsilon}\right) \quad \text{Eq. (83)}$$

The above expression can be further rearranged by using the Taylor series expansion as:

$$y_{calib}[5] = (y'[5] - c)\left(\frac{D\{\Delta_x\}}{D\{\Delta_x\} + \varepsilon}\right) \quad \text{Eq. (84)}$$

$$= (y'[5] - c)\left[1 + \left(\frac{\varepsilon}{D\{\Delta_x\}}\right)\right]^{-1}$$

$$= (y'[5] - c)\left[1 - \left(\frac{\varepsilon}{D\{\Delta_x\}}\right) + \left(\frac{\varepsilon}{D\{\Delta_x\}}\right)^2 - \left(\frac{\varepsilon}{D\{\Delta_x\}}\right)^3 + \left(\frac{\varepsilon}{D\{\Delta_x\}}\right)^4 - \ldots\right]$$

From the Taylor series expansion, it can be observed that the denominator of all terms consists of only the $D\{\Delta_x\}$ term. By selecting the value of incremental amount $\Delta_x$ as an integer multiple of 2, the division is reduced to just right shifting of the bits. Furthermore, $\epsilon = \Delta_y - D\{\Delta_x\}$ is a smaller quantity which can be stored in fewer bits as compared to the bitwidth of the output codes of the ADC. For the same reason, higher order terms of the Taylor series expansion can be neglected resulting in finite error in the calibrated output codes.

Under a $1^{st}$ order approximation:

$$y_{calib}[5] = (y'[5] - c)\left[1 - \left(\frac{\varepsilon}{D\{\Delta_x\}}\right)\right] \quad \text{Eq. (85)}$$

The error due to the first order approximation is $$\cong \left(\frac{\varepsilon}{D\{\Delta_x\}}\right)^2. \quad \text{Eq. (86)}$$

Eq. (85) requires a multiplication by $\epsilon$, however, this multiplication is less complicated and significant accuracy can be achieved with lesser power and area as compared to the division of Eq. (80).

Under a $2^{nd}$ order approximation:

$$y_{calib}[5] = (y'[5] - c)\left[1 - \left(\frac{\varepsilon}{D\{\Delta_x\}}\right) + \left(\frac{\varepsilon}{D\{\Delta_x\}}\right)^2\right] \quad \text{Eq. (87)}$$

$$= (y'[5] - c)\left[1 - \left(\frac{\varepsilon}{D\{\Delta_x\}}\right)\left(1 - \frac{\varepsilon}{D\{\Delta_x\}}\right)\right]$$

The error due to the second order approximation is $$\cong -\left(\frac{\varepsilon}{D\{\Delta_x\}}\right)^3. \quad \text{Eq. (88)}$$

The expression in Eq. (87) requires two multiplications. However, the second order approximation can result in lesser error as compared to the $1^{st}$ order approximation.

Simulation using MATLAB was carried out to evaluate the performance of the background calibration method of the present invention with $1^{st}$ and $2^{nd}$ order approximations. The gain error of a 24-bit ADC was varied from 5% to 0.01% and the residual gain error in the calibrated digital output codes was observed while using $1^{st}$ or $2^{nd}$ order approximations during digital post-processing. The results are shown in Table 5.

TABLE 5

| Gain error of the ADC | | Error in the calibrated digital output codes | | | |
|---|---|---|---|---|---|
| | | $1^{st}$ order approx. | | $2^{nd}$ order approx. | |
| % | LSB | % | LSB | % | LSB |
| 5 | 419430 | 0.25 | 20971 | 0.0125 | 1048 |
| 2 | 167772 | 0.04 | 3355 | 8e-04 | 67 |
| 1 | 83886 | 0.01 | 838.86 | 1e-04 | 8.39 |
| 0.1 | 8388.6 | 1e-04 | 8.39 | 1e-07 | 0.008 |
| 0.04 | 3355.4 | 1.6e-05 | 1.34 | 6.4e-09 | 5.36e-04 |
| 0.01 | 838.86 | 1e-06 | 0.0838 | 1e-10 | 8.389e-06 |

An upper bound on the expected gain error of the ADC was calculated to be ~40 m %. The simulation data shows that the first order approximation was sufficient for most applications to achieve the desired accuracy of the calibrated output codes.

Filtering Of The Offset, Gain Estimations

In the above discussion, the calibration of the output codes has been carried out using the 'current' estimates of the offset and gain errors. To improve on the accuracy of the calibration, filtering can be performed on multiple estimates of the offset and gain error. Then, the calibration can be carried out using the filtered estimates of the offset and gain errors.

Figure 31:
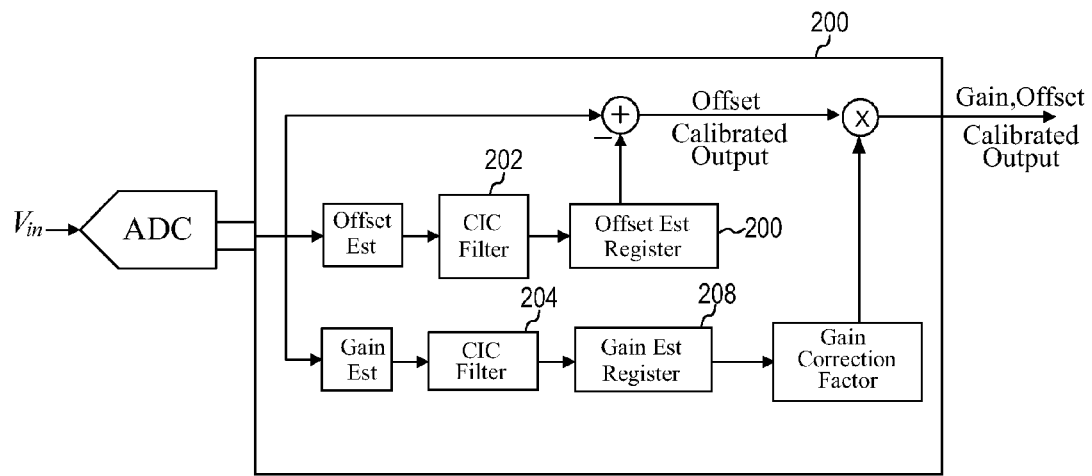
FIG. 31 is a schematic diagram of a digital post-processing circuit for implementing the background calibration method according to one embodiment of the present invention.

FIG. 31 is a schematic diagram of a digital post-processing circuit for implementing the background calibration method according to one embodiment of the present invention. Referring to FIG. 31, digital post-processing circuit 200 includes a first CIC (cascade-integrator-cascade) filter 202 for averaging the samples for offset estimations and a second CIC filter 204 for averaging the samples for gain estimations. In one embodiment, first CIC filter 202 averages 4 samples of the offset estimations and second CIC filter 204 averages 16 samples of the offset estimations. A CIC filter operates by averaging the first set of n samples (e.g. n is 4 or 16) and generating a result and then averaging the next set of n samples. Thus, the filtered estimate is refreshed every n samples.

Due to the delay time of the CIC filters, the first filtered estimation of offset and gain becomes available for the calibration only after 4×3 or 16×3 input samples, respectively, have been processed. In one embodiment, in order to avoid this delay time, upon power up, the ADC is run for 16×3 samples with shorted inputs. The power-up run can be performed at the highest possible data rate of the ADC. Corresponding outputs of both of the CIC filters 202, 204 are stored in the registers to be used as an initial condition when the actual input signal is applied to the ADC. The contents of these registers are not cleared even in the event of power down. Then, When the ADC is coupled to sample the actual input sample, the contents of the Offset Estimation Register 206 and Gain Estimation Register 208 are refreshed with the respective CIC filter output every 4×3 or 16×3, respectively, input sample conversions.

System Calibration

The background calibration method of the present invention operates to correct for errors coming from the ADC itself. However, in most applications, the ADC itself is a part of the bigger system. There may be similar errors originating from the additional components of the system that need to be corrected to maintain the overall system accuracy. For example, in a temperature sensing system, the sensor itself may contribute an offset error. In addition, each sensor might have different sensitivity (equivalent to a gain error). If an amplifier is used between the sensor and the ADC, the amplifier's offset and gain errors need to be considered.

The errors from the different system components could be lumped together and corrected by performing a System Calibration. In one embodiment, the system calibration determines the system offset error by having the ADC convert a "zero scale" input. A "zero scale" input is not a "shorted input." A zero scale input refers to an input that is at the zero end of the input scale. For example, in weigh scale applications, "zero scale" means no weight. The ADC results for the zero scale input conversion is stored in a register and used as the system offset error to calibration future conversions. Moreover, the system calibration determines the system gain error by having the ADC convert a "full-scale input." The ADC results for the full-scale input is stored and used to determine the system gain correction factor. Due to the requirement of having to apply 'zero scale' and 'full-scale' inputs, system calibration is not performed very frequently. System calibration is usually performed periodically or when there is a significant change in the operating conditions (voltage, temperature etc.). System calibration as described herein is not a background calibration, rather, it is a foreground calibration.

In one embodiment, background calibration is continued while the system performs periodic system calibration. This would ensure better overall system performance with the ADC continuously correcting for its errors. However, the ADC gain and offset calibration registers should be kept separate from the system offset and gain calibration registers.

Furthermore, the input signals during system calibration can be noisy. Relying on a single conversion result for determining system gain and offset errors might not yield the desired accuracy. In one embodiment, system calibration is carried out multiple conversions of zero scale and full-scale inputs and average values of the respective conversions are computed. Multiple sample conversion can be implemented by accumulating N(=2ⁿ) samples and later shifting the results by n-bits (equivalent to dividing by N) to obtain the average value.

Figure 32:
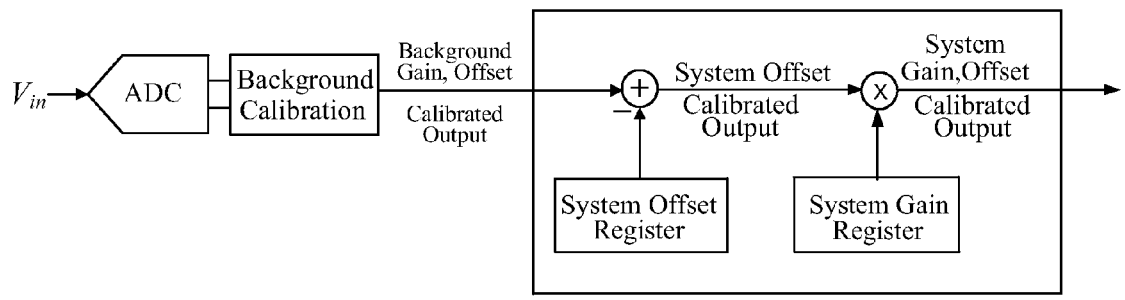
FIG. 32 is a block diagram of a system incorporating an ADC and configured for background calibration of the ADC and foreground system calibration of the entire system.

FIG. 32 is a block diagram of a system incorporating an ADC and configured for background calibration of the ADC and foreground system calibration of the entire system.

The above detailed descriptions are provided to illustrate specific embodiments of the present invention and are not intended to be limiting. Numerous modifications and variations within the scope of the present invention are possible. The present invention is defined by the appended claims.

We claim:

1. A method for calibrating an analog-to-digital converter, the analog-to-digital converter receiving an analog input signal and generating digital output codes indicative of the analog input signal, the method comprising:
   sampling the analog input signal at a plurality of sampling intervals;
   generating an input sample at each sampling interval;
   reversing the polarity of at least one input sample;
   averaging the digital output codes associated with a first pair of input samples, the first pair of input samples having opposite polarities; and
   generating an offset correction value being the average of the digital output codes associated with the first pair of input samples.

2. The method of claim 1, further comprising:
   subtracting the offset correction value from each digital output code to generate an offset error corrected digital output value indicative of the analog input signal.

3. The method of claim 2, wherein subtracting the offset correction value from each digital output code further comprises subtracting the offset correction value from each digital output code to generate an offset error corrected and even order non-linearity corrected digital output value indicative of the analog input signal.

4. The method of claim 1, wherein reversing the polarity of at least one input sample comprises reversing the polarity of alternate input samples; and wherein averaging the digital output codes associated with the first pair of input samples comprises averaging the digital output codes associated with two adjacent input samples, the adjacent input samples having opposite polarities.

5. The method of claim 1, further comprising:
   introducing an incremental value to modify the magnitude of at least one input sample;
   computing an actual gain value of the analog-to-digital converter using the digital output codes associated with a second pair of input samples, the second pair of input samples having the same polarity and a first one of the second pair of input samples having a modified magnitude; and
   generating a gain correction value being the ratio of an ideal gain of the analog-to-digital converter to the actual gain,
   wherein averaging the digital output codes associated with the first pair of input samples comprises averaging the digital output codes associated with the first pair of input samples, the first pair of input samples having opposite polarities and unmodified magnitude.

6. The method of claim 5, wherein:
   averaging the digital output codes associated with the first pair of input samples comprises averaging the digital output codes associated with the a first input sample and a second input sample, the first and second input samples having opposite polarities and unmodified magnitude; and
   computing an actual gain value of the analog-to-digital converter using the digital output codes associated with a second pair of input samples comprises computing an actual gain value of the analog-to-digital converter using the digital output codes associated with the second input sample and a third input sample, the second and third input samples having the same polarity and the third input sample having the modified magnitude.

7. The method of claim 6, where the first, second and third input samples are adjacent input samples arranged in a sequence of first, second and third input samples, the first input sample having unmodified polarity and unmodified magnitude, the second input sample having reversed polarity and unmodified magnitude, and the third input sample having reversed polarity and modified magnitude.

8. The method of claim 6, where the first, second and third input samples are adjacent input samples arranged in a sequence of first, second and third input samples, the first input sample having reversed polarity and unmodified magnitude, the second input sample having unmodified polarity and unmodified magnitude, and the third input sample having unmodified polarity and modified magnitude.

9. The method of claim 6, where the first, second and third input samples are adjacent input samples arranged in a sequence of third, first, and second input samples, the third input sample having unmodified polarity and modified magnitude, the first input sample having unmodified polarity and unmodified magnitude, and the second input sample having reversed polarity and unmodified magnitude.

10. The method of claim 5, further comprising:
    averaging the digital output codes associated with a third pair of input samples, the third pair of input samples having opposite polarities and modified magnitudes,
    wherein generating an offset correction value comprises generating an offset correction value based on the average of the digital output codes associated with the first pair of input samples and the average of the digital output codes associated with the third pair of input samples.

11. The method of claim 10, wherein:
    averaging the digital output codes associated with the first pair of input samples comprises averaging the digital output codes associated with the a first input sample and a second input sample, the first and second input samples having opposite polarities and unmodified magnitude;
    averaging the digital output codes associated with the third pair of input samples comprises averaging the digital output codes associated with the a third input sample and a fourth input sample, the third and fourth input samples having opposite polarities and modified magnitude; and
    computing an actual gain value of the analog-to-digital converter using the digital output codes associated with a second pair of input samples comprises computing an actual gain value of the analog-to-digital converter using the digital output codes associated with the second input sample and the third input sample, the second and third input samples having the same polarity and the third input sample having the modified magnitude.

12. The method of claim 11, where the first, second, third and fourth input samples are adjacent input samples arranged in a sequence of first, second, third and fourth input samples, the first input sample having unmodified polarity and unmodified magnitude, the second input sample having reversed polarity and unmodified magnitude, the third input sample having reversed polarity and modified magnitude, and the fourth input sample being the reversed polarity of the third input sample.

13. The method of claim 11, where the first, second, third and fourth input samples are adjacent input samples arranged in a sequence of first, second, third and fourth input samples, the first input sample having reversed polarity and unmodified magnitude, the second input sample having unmodified polarity and unmodified magnitude, the third input sample having unmodified polarity and modified magnitude, and the fourth input sample being the reversed polarity of the third input sample.

14. The method of claim 1, further comprising:
introducing an incremental value to modify the magnitude of at least one input sample;
introducing a first multiple of the incremental value to modify the magnitude of at least one input sample;
introducing a second multiple of the incremental value to modify the magnitude of at least one input sample, the second multiple being greater than the first multiple;
computing an actual gain value of the analog-to-digital converter using the digital output codes associated with a second pair of input samples, a third pair of input samples and a fourth pair of input samples, the second pair of input samples having the same polarity and a first one of the second pair of input samples having a modified magnitude based on the incremental value, the third pair of input samples having the same polarity and a first one of the third pair of input samples having a modified magnitude based on the first multiple of the incremental value, and the fourth pair of input samples having the same polarity and a first one of the fourth pair of input samples having a modified magnitude based on the second multiple of the incremental value, the input samples in each of the second, third and fourth pairs of input samples having a difference in magnitude of the incremental value; and
generating a gain correction value being the ratio of an ideal gain of the analog-to-digital converter to the actual gain,
wherein averaging the digital output codes associated with the first pair of input samples comprises averaging the digital output codes associated with the first pair of input samples, the first pair of input samples having opposite polarities and the same magnitude.

15. The method of claim 14, wherein averaging the digital output codes associated with the first pair of input samples comprises averaging the digital output codes associated with the first pair of input samples, the first pair of input samples having opposite polarities and a modified magnitude based on the first multiple of the incremental value.

16. The method of claim 15, wherein the first multiple of the incremental value comprises two times the incremental value and the second multiple of the incremental value comprises three times the incremental value.

17. The method of claim 14, wherein:
averaging the digital output codes associated with the first pair of input samples comprises averaging the digital output codes associated with the a first input sample and a second input sample, the first and second input samples having opposite polarities and a modified magnitude based on the first multiple of the incremental value, the second input sample having an unmodified polarity;
computing an actual gain value of the analog-to-digital converter using the digital output codes associated with a second pair of input samples, a third pair of input samples and a fourth pair of input samples comprises computing an actual gain value of the analog-to-digital converter using the digital output codes associated with the second pair of input samples, the third pair of input samples and the fourth pair of input samples, the second pair of input samples comprising a third input sample and a fourth input sample having the same polarity and the fourth input sample having the modified magnitude based on the incremental value, the third pair of input samples comprising the second input sample and the fourth input sample, and the fourth pair of input samples comprising the second input sample and a fifth sample having the same polarity and the fifth input sample having a modified magnitude based on the second multiple of the incremental value.

18. The method of claim 17, where the first, second, third, fourth and fifth input samples are adjacent input samples arranged in a sequence of third, fourth, second, first and fifth input samples, the first input sample having modified polarity and a modified magnitude based on the first multiple of the incremental value, the second input sample having a unmodified polarity and a modified magnitude based on the first multiple of the incremental value, the third input sample having unmodified polarity and unmodified magnitude, the fourth input sample having unmodified polarity and a modified magnitude based on the incremental value, and the fifth input sample having unmodified polarity and a modified magnitude based on the second multiple of the incremental value.

19. A method for calibrating an analog-to-digital converter, the analog-to-digital converter receiving an analog input signal and generating digital output codes indicative of the analog input signal, the method comprising:
sampling the analog input signal at a plurality of sampling intervals;
generating an input sample at each sampling interval;
introducing an incremental value to modify the magnitude of at least one input sample;
computing an actual gain value of the analog-to-digital converter using the digital output codes associated with a first input sample and a second input sample, the second input sample having the modified magnitude; and
generating a gain correction value being the ratio of an ideal gain of the analog-to-digital converter to the actual gain.

20. The method of claim 19, further comprising:
multiplying each digital output code by the gain correction value to generate a gain error corrected digital output value indicative of the analog input signal.

21. The method of claim 19, wherein the analog input signal comprises a differential analog input signal and introducing an incremental value to modify the magnitude of at least one input sample comprises adding the incremental value to the negative input of the at least one input sample and subtracting the incremental value from the positive input of the at least one input sample.

22. The method of claim 19, wherein:
introducing an incremental value to modify the magnitude of at least one input sample comprises introducing an incremental value to modify the magnitude of alternate input samples; and
computing an actual gain value of the analog-to-digital converter using the digital output codes associated with a first input sample and a second input sample comprises computing an actual gain value of the analog-to-digital converter using the digital output codes associated with two adjacent input samples, one of the input samples having a modified magnitude.

* * * * *